US 11,422,662 B2

(12) United States Patent
Lee et al.

(10) Patent No.: US 11,422,662 B2
(45) Date of Patent: Aug. 23, 2022

(54) ELECTRONIC DEVICE INCLUDING LIGHT EMITTING MODULE AND LIGHT RECEIVING MODULE ADJACENT TO DISPLAY, AND OPERATING METHOD THEREOF

(71) Applicant: Samsung Electronics Co., Ltd., Suwon-si (KR)

(72) Inventors: Donghan Lee, Suwon-si (KR); Jeong-Ho Cho, Hwaseong-si (KR); Jongah Kim, Suwon-si (KR); Hee Woong Yoon, Seoul (KR); Taeho Kim, Cheongju-si (KR); Jeong-Min Park, Hwaseong-si (KR); Byoung-Uk Yoon, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/006,441

(22) Filed: Jun. 12, 2018

(65) Prior Publication Data
US 2018/0364869 A1 Dec. 20, 2018

(30) Foreign Application Priority Data

Jun. 14, 2017 (KR) .................. 10-2017-0074905
Jun. 8, 2018 (KR) .................. 10-2018-0066237

(51) Int. Cl.
*G06F 3/042* (2006.01)
(52) U.S. Cl.
CPC .. *G06F 3/0421* (2013.01); *G06F 2203/04101* (2013.01)

(58) Field of Classification Search
None
See application file for complete search history.

(56) References Cited

U.S. PATENT DOCUMENTS

| 9,996,198 B2* | 6/2018 | Zhang ................ G06F 3/0428 |
| 10,033,844 B2 | 7/2018 | Lee et al. |
| 2009/0102763 A1 | 4/2009 | Border et al. |
| 2010/0124945 A1 | 5/2010 | Hwang et al. |
| 2010/0245289 A1 | 9/2010 | Svajda |

(Continued)

FOREIGN PATENT DOCUMENTS

| CN | 101815964 A | 8/2010 |
| CN | 101853109 A | 10/2010 |

(Continued)

OTHER PUBLICATIONS

European Search Report dated Feb. 26, 2020, issued in European Patent Application No. 18817234.0.

(Continued)

*Primary Examiner* — Benjamin C Lee
*Assistant Examiner* — Emily J Frank
(74) *Attorney, Agent, or Firm* — Jefferson IP Law, LLP

(57) ABSTRACT

An electronic device is provided. The electronic device includes a display panel, a light emitting module disposed adjacent to the display panel, and configured to output light, and a light receiving module disposed in a portion of the display panel or below or beneath the display panel, and configured to detect light of the outputted light that is reflected by an external object.

19 Claims, 38 Drawing Sheets

(56) References Cited

U.S. PATENT DOCUMENTS

| | | | | |
|---|---|---|---|---|
| 2010/0277431 | A1* | 11/2010 | Klinghult | G06F 3/0412 345/174 |
| 2010/0327164 | A1* | 12/2010 | Costello | H01L 24/97 250/338.1 |
| 2012/0119091 | A1 | 5/2012 | Hong et al. | |
| 2013/0043928 | A1 | 2/2013 | Jung et al. | |
| 2013/0050068 | A1 | 2/2013 | Inoue et al. | |
| 2013/0135328 | A1 | 5/2013 | Rappoport et al. | |
| 2014/0103199 | A1 | 4/2014 | Loong et al. | |
| 2014/0252209 | A1* | 9/2014 | Land | G01J 1/4204 250/208.2 |
| 2014/0364218 | A1* | 12/2014 | Holmgren | A63F 13/213 463/31 |
| 2015/0145831 | A1* | 5/2015 | Li | G06F 3/0421 345/175 |
| 2015/0303244 | A1 | 10/2015 | De Jong et al. | |
| 2015/0349289 | A1* | 12/2015 | Yu | H01L 23/13 362/97.1 |
| 2016/0234365 | A1* | 8/2016 | Alameh | H04W 52/0254 |
| 2017/0134545 | A1 | 5/2017 | Lee et al. | |
| 2017/0229059 | A1* | 8/2017 | Bonnier | G06F 3/017 |
| 2017/0255809 | A1* | 9/2017 | Huang | G06F 3/0414 |
| 2017/0262134 | A1* | 9/2017 | Eriksson | G06F 3/017 |
| 2018/0045827 | A1* | 2/2018 | Yoon | G06F 3/0421 |
| 2018/0081093 | A1* | 3/2018 | Wang | G02B 5/0231 |
| 2018/0259321 | A1* | 9/2018 | Zhang | G01B 11/14 |
| 2019/0124197 | A1* | 4/2019 | Zhou | G01S 17/04 |
| 2019/0138154 | A1* | 5/2019 | Smith | B32B 7/02 |

FOREIGN PATENT DOCUMENTS

| | | |
|---|---|---|
| CN | 101936752 A | 1/2011 |
| CN | 102565803 A | 7/2012 |
| CN | 102967364 A | 3/2013 |
| CN | 103727965 A | 4/2014 |
| CN | 106664111 A | 5/2017 |
| CN | 106775076 A | 5/2017 |
| EP | 2455776 A1 | 5/2012 |
| EP | 3 166 229 A1 | 5/2017 |
| EP | 3 401 701 A1 | 11/2018 |
| KR | 20100056019 A | 5/2010 |
| KR | 20130062100 A | 6/2013 |
| KR | 10-2015-0144134 A | 12/2015 |
| KR | 20160106237 A | 9/2016 |
| WO | 2013027889 A1 | 2/2013 |
| WO | 2015/192712 A1 | 12/2015 |
| WO | 2017/048478 A1 | 3/2017 |

OTHER PUBLICATIONS

Chinese Office Action dated Nov. 2, 2020, issued in Chinese Application No. 201880039729.6.
European Office Action dated Nov. 19, 2020, issued in European Application No. 18 817 234.0-1231.
Chinese Office Action dated Aug. 2, 2021, issued in Chinese Application No. 201880039729.6.
Korean Office Action dated Apr. 26, 2022, issued in Korean Application No. 10-2018-0066237.
Australian Office Action dated May 4, 2022, issued in Australian Application No. 2018286376.
Decision of Rejection dated Apr. 28, 2022, issued in Chinese Application No. 201880039729.6.

* cited by examiner

ELECTRONIC DEVICE INCLUDING LIGHT EMITTING MODULE AND LIGHT RECEIVING MODULE ADJACENT TO DISPLAY, AND OPERATING METHOD THEREOF

CROSS-REFERENCE TO RELATED APPLICATION(S)

This application is based on and claims priority under 35 U.S.C. § 119(a) to Korean patent application number 10-2017-0074905, filed on Jun. 14, 2017, and to Korean patent application number 10-2018-0066237, filed on Jun. 8, 2018, in the Korean Intellectual Property Office, the disclosures of which are incorporated by reference herein in their entirety.

BACKGROUND

1. Field

The disclosure relates to an electronic device including a light emitting module and a light receiving module disposed adjacent to a display, and an operating method thereof.

2. Description of Related Art

With the development of digital technology, electronic devices are being provided in various forms, such as smart phones, tablet personal computers (PCs), personal digital assistants (PDAs), or the like. Electronic devices are developing in such a form that is wearable on users so as to enhance portability and users' accessibility.

An electronic device may include a display to display an image through the display. The display may be a touch-sensitive display, and the electronic device may detect a user input through the display. The electronic device may include various sensors to detect a physical quantity, a change in an environment, or the like. For example, the sensor may be a light sensor, such as a proximity sensor. The electronic device may perform various functions based on a signal outputted from the sensor.

The light sensor may include a light emitting unit to output light, and a light receiving unit to receive light scattered or reflected from an object and to generate an electric signal. The light sensor may be installed in a space (hereinafter, a side space) formed outside a side surface of the display (or a display panel). However, when an electronic device is designed to extend a display while maintaining its size according to a trend toward a large-size screen, the side space may be reduced, which may make it difficult to install a light sensor.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a light detection device in an electronic device which can mount at least one light emitting unit and at least one light receiving unit without being influenced by reduction of a side space caused by extension of a display.

Another aspect of the disclosure is to provide a light detection device in an electronic device which can mount at least one light emitting unit and at least one light receiving unit in a limited space with a display, while enhancing an influence between a display and the light detection device.

Another aspect of the disclosure is to provide a light detection method in an electronic device for detecting light associated with a corresponding function (for example, a function of determining proximity of an object) by selectively using light emitting units when light emitting units having different attributes are mounted in a side space.

Additional aspects will be set forth in part in the description which follows and, in part, will be apparent from the description, or may be learned by practice of the presented embodiments.

In accordance with an aspect of the disclosure, an electronic device is provided. The electronic device includes a display panel, a first light emitting module disposed adjacent to the display panel, and configured to output light, and a light receiving module disposed in a portion of the display panel or below or beneath the display panel, and configured to detect light of the outputted light that is reflected by an external object.

In accordance with another aspect of the disclosure, an electronic device is provided. The electronic device includes a housing, a cover at least in part accommodated in the housing and having one surface exposed, a display panel disposed below or beneath a first region of the cover, a first light emitting module disposed below or beneath a second region of the cover, and configured to output light, and a light receiving module disposed in at least a portion of the display panel or below or beneath the display panel, and configured to detect light of the outputted light that is reflected by an external object.

In accordance with another aspect of the disclosure, an electronic device is provided. The electronic device includes a display panel, a first light emitting module disposed adjacent to the display panel, a light receiving module disposed in a portion of the display panel or below or beneath the display panel, and a processor configured to output light by using the light emitting module, detect at least a portion of light of at least a portion of the light that collides with an external object and is reflected therefrom by using the light receiving module, and determine a distance between the external object and the electronic device based on at least the detection.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
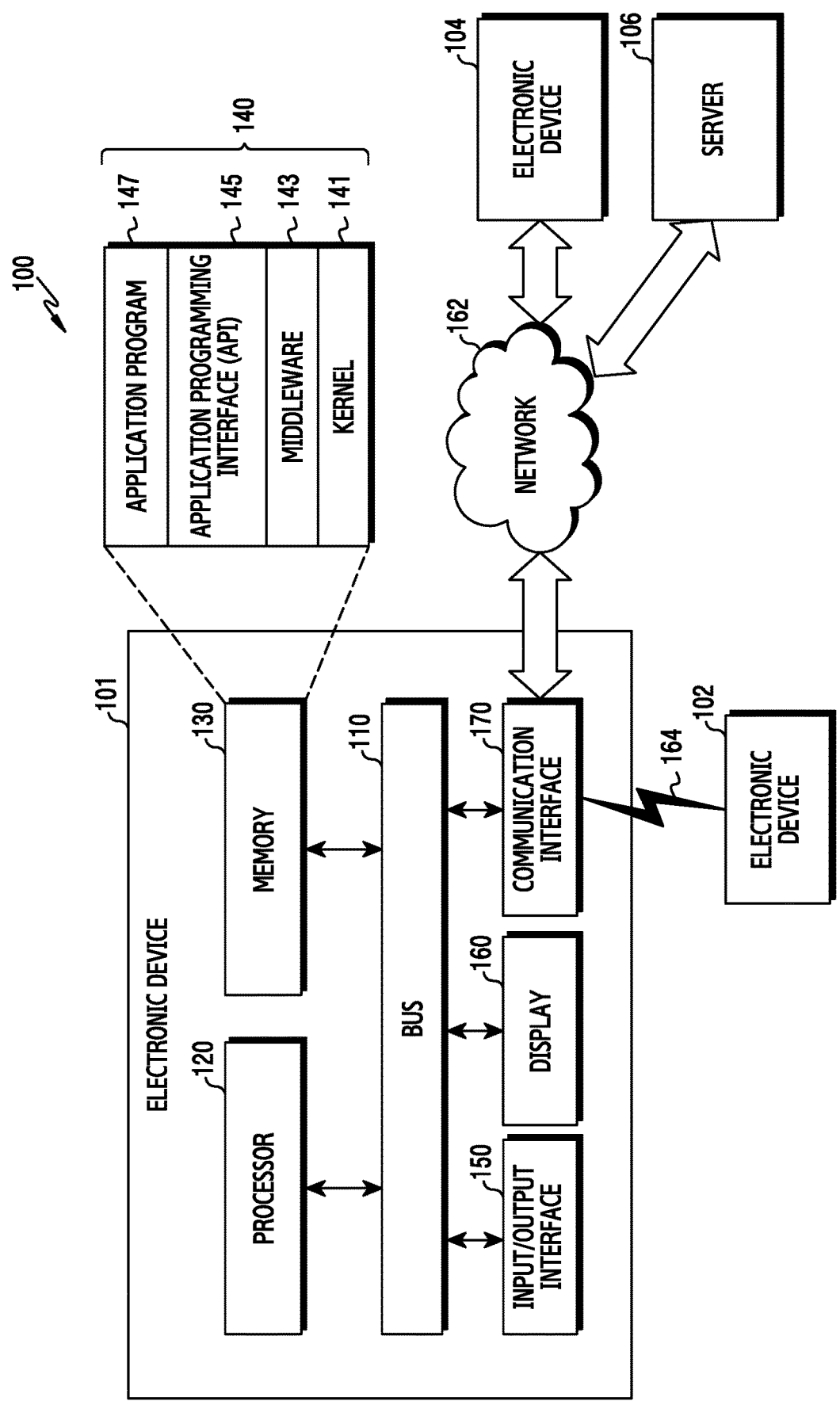
FIG. 1 is a block diagram illustrating a network environment system according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The term "configured (or set) to . . . " used in the disclosure may be interchangeably used with the terms "suitable for . . . ," "having the capacity to . . . ," "adapted to . . . ," "made to . . . ," "capable of . . . ," or "designed to" in a hardware or software level depending on the situation. In a certain situation, the term "a device configured to . . . " may refer to "the device being capable of . . . " with another device or parts. For example, "a processor configured (set) to perform A, B, and C" may refer, for example, and without limitation, to a dedicated processor (for example, an embedded processor) for performing a corresponding operation, or a generic-purpose processor (for example, a central processing unit (CPU) or an application processor (AP)), or the like, for performing corresponding operations by executing one or more software programs stored in a memory device.

An electronic device according to various embodiments of the disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), a motion picture experts group phase 1 or phase 2 (MPEG-1 or MPEG-2) audio layer 3 (MP3) players, medical devices, cameras, or wearable devices, or the like, but is not limited thereto. The wearable devices may include at least one of accessories (for example, watches, rings, bracelets, ankle bracelets, necklaces, glasses, contact lenses, head-mounted-devices (HMDs), or the like), fabric- or clothing-mounted devices (for example, electronic apparels), body-mounted devices (for example, skin pads, tattoos, or the like), bio-implantable circuits, or the like, but are not limited thereto. According to embodiments of the disclosure, the electronic devices may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, media boxes (for example, Samsung HomeSync™, Apple TV™, or Google TV™), game consoles (for example, Xbox™ and PlayStation™), electronic dictionaries, electronic keys, camcorders, electronic picture frames, or the like, but are not limited thereto.

According to an embodiment of the disclosure, the electronic devices may include at least one of medical devices (for example, various portable medical measurement devices (for example, a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, global navigation satellite systems (GNSS), event data recorders (EDRs), flight data recorders (FDRs), vehicle infotainment devices, electronic equipment for vessels (for example, navigation systems and gyrocompasses), avionics, security devices, head units for vehicles, industrial or home robots, drones, automatic teller's machines (ATMs) of financial institutions, points of sales (POSs) of stores, or internet of things (for example, light bulbs, various sensors, sprinkler devices, fire alarms, thermostats, street lamps, toasters, exercise equipment, hot water tanks, heaters, boilers, and the like), or the like, but are not limited thereto. According to an embodiment of the disclosure, the electronic devices may include at least one of furniture, a part of buildings/structures or cars, electronic boards, electronic signature receiving devices, projectors, or various measuring instruments (for example, water meters, electricity meters, gas meters, or wave meters, and the like), or the like, but are not limited thereto. The electronic devices according to various embodiments may be flexible or may be a combination of two or more devices of the above-mentioned devices. In addition, electronic devices according to various embodiments of the disclosure are not limited to the above-mentioned devices. In an embodiment of the disclosure, the term "user" may refer to a person who uses the electronic device or a device that uses the electronic device (for example, an artificial intelligence electronic device).

FIG. 1 is a block diagram illustrating a network environment system according to an embodiment of the disclosure.

Referring to FIG. 1, there is illustrated an electronic device 101 in a network environment 100 according to various example embodiments. The electronic device 101 may include a bus 110, a processor 120, a memory 130, an input/output interface 150, a display 160, and a communication interface 170. According to an embodiment of the disclosure, the electronic device 101 may not include at least one of the above-described elements or may further include other element(s). The bus 110 may interconnect the above-described elements 110-170 and may include a circuit for transmitting communications (for example, a control message or data) among the above-described elements. The processor 120 may include one or more of a CPU, an AP, or a communication processor (CP), or the like. The processor 120 may perform, for example, an operation or data processing associated with control and/or communication of at least one other element(s) of the electronic device 101.

According to an embodiment of the disclosure, the memory 130 may include a volatile memory and/or non-volatile memory. The memory 130 may store commands or data associated with at least one other element(s) of the electronic device 101. According to an embodiment of the disclosure, the memory 130 may store software and/or a program 140. The program 140 may include, for example, a kernel 141, a middleware 143, an application programming interface (API) 145, and/or an application program (or an application) 147. At least part of the kernel 141, the middleware 143, or the API 145 may be called an "operating system (OS)." The kernel 141 may control or manage system resources (for example, the bus 110, the processor 120, the memory 130, and the like) that are used to execute operations or functions of other programs (for example, the middleware 143, the API 145, or the application program 147). Furthermore, the kernel 141 may provide an interface that allows the middleware 143, the API 145, or the application program 147 to access discrete elements of the electronic device 101 so as to control or manage system resources.

According to an embodiment of the disclosure, the application program 147 may include a proximity recognition application for recognizing a proximity distance of an object (or an external object) by using a light detection device (or a light sensor) (not shown). According to various embodiments of the disclosure, the application program 147 may include an object analysis application for analyzing an object by using the light detection device (or the light sensor) (for example, a spectrum sensor). For example, the object analysis application may obtain information regarding skin moisture, skin melanin, or erythema regarding user's skin by using the light detection device.

The middleware 143 may perform a mediation role such that the API 145 or the application program 147 communicates with the kernel 141 to exchange data. Furthermore, the middleware 143 may process one or more task requests received from the application program 147 according to a priority. For example, the middleware 143 may assign the priority, which makes it possible to use a system resource (for example, the bus 110, the processor 120, the memory 130, or the like) of the electronic device 101, to at least one of the application program 147, and may process the one or more task requests. The API 145 may be an interface through which the application program 147 controls a function provided by the kernel 141 or the middleware 143, and may include, for example, at least one interface or function (for example, an instruction) for a file control, a window control, image processing, a character control, or the like. The input/output interface 150 may transmit a command or data, input from a user or another external device, to other element(s) of the electronic device 101, or may output a command or data, received from other element(s) of the electronic device 101, to a user or another external device.

The display 160 may include, for example, a liquid crystal display (LCD), a light-emitting diode (LED) display, an organic LED (OLED) display, a microelectromechanical systems (MEMS) display, or an electronic paper display, or the like, but is not limited thereto. The display 160 may display, for example, various contents (for example, a text, an image, a video, an icon, and/or a symbol) to a user. The display 160 may include a touch screen and may receive, for example, a touch, gesture, proximity, or hovering input using an electronic pen or a portion of a user's body. The communication interface 170 may establish communication between the electronic device 101 and an external device (for example, a first external electronic device 102, a second external electronic device 104, or a server 106). For example, the communication interface 170 may be connected to a network 162 through wireless communication or wired communication to communicate with the external device (for example, the second external electronic device 104 or the server 106).

The wireless communication may include cellular communication using at least one of, for example, long-term evolution (LTE), LTE advanced (LTE-A), code division multiple access (CDMA), wideband CDMA (WCDMA), universal mobile telecommunications system (UNITS), wireless broadband (WiBro), global system for mobile communications (GSM), or the like. According to an embodiment of the disclosure, as indicated by reference numeral 164 in FIG. 1, the wireless communication may include at least one of Wi-Fi, light fidelity (Li-Fi), Bluetooth, Bluetooth low energy (BLE), Zigbee, near field communication (NFC), magnetic secure transmission, radio frequency (RF), or a body area network (BAN). According to an embodiment of the disclosure, the wireless communication may include GNSS. The GNSS may include, for example, global positioning system (GPS), global navigation satellite system (Glonass), BeiDou navigation satellite system (hereinafter, referred to as "BeiDou") or Galileo, the European global satellite-based navigation system. Hereinafter, "GPS" and "GNSS" may be interchangeably used in embodiments of the disclosure. The wired communication may include at least one of, for example, a universal serial bus (USB), a high-definition multimedia interface (HDMI), a recommended standard-232 (RS-232), power line communication, or a plain old telephone service (POTS). The network 162 may include at least one of telecommunications networks, for example, a computer network (for example, local area network (LAN) or wide area network (WAN)), an internet, or a telephone network.

Each of the first and second external electronic devices 102, 104 may be the same or different type of device as or from the electronic device 101. According to various embodiments of the disclosure, all or a part of operations that the electronic device 101 will perform may be executed by another or plural other electronic devices (for example, the first and second external electronic devices 102, 104 or the server 106). According to an embodiment of the disclosure, when the electronic device 101 should execute any function or service automatically or in response to a request, the electronic device 101 may not perform the function or the service internally, but, alternatively or additionally, it may request at least a portion of a function associated with the electronic device 101 at other device (for example, the first and second external electronic devices 102, 104 or the server 106). The other electronic device (for example, the first and second external electronic devices 102, 104 or the server 106) may execute the requested function or additional function and may transmit the execution result to the electronic device 101. The electronic device 101 may provide the requested function or service using the received result or may additionally process the received result to provide the requested function or service. To achieve this, for example, cloud computing, distributed computing, or client-server computing may be used.

Figure 2:
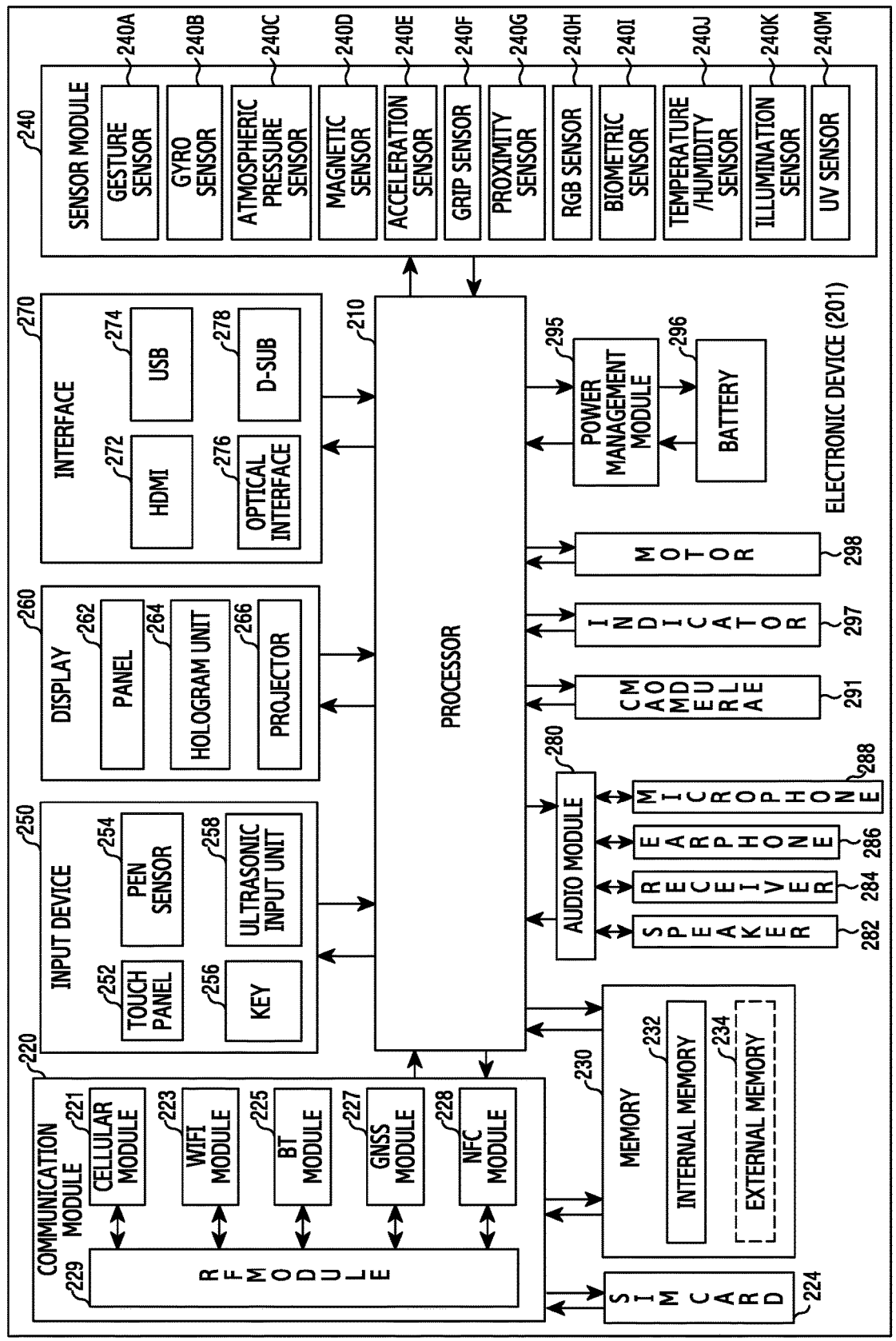
FIG. 2 is a block diagram illustrating an electronic device according to various embodiments of the disclosure.

FIG. 2 is a block diagram illustrating an electronic device according to various embodiments of the disclosure.

Referring to FIG. 2, an electronic device 201 may include, for example, all or a portion of the electronic device 101 illustrated in FIG. 1. The electronic device 201 may include one or more processors 210 (for example, an AP), a communication module 220, a subscriber identification module 224, a memory 230, a sensor module 240, an input device 250, a display 260, an interface 270, an audio module 280, a camera module 291, a power management module 295, a battery 296, an indicator 297, and a motor 298.

The processor 210 may drive an OS or an application program to control a plurality of hardware or software elements connected to the processor 210, and may process and compute a variety of data. The processor 210 may be implemented with a system on chip (SoC), for example. According to an embodiment of the disclosure, the processor 210 may further include a graphics processing unit (GPU) and/or an image signal processor (ISP). The processor 210 may include at least a portion (for example, a cellular module 221) of the elements illustrated in FIG. 2. The processor 210 may load and process a command or data, which is received from at least one of the other elements (for example, a nonvolatile memory) at a volatile memory, and may store resulting data at a nonvolatile memory.

The communication module 220 may be configured the same as or similar to the communication interface 170. The communication module 220 may include, for example, a cellular module 221, a Wi-Fi module 223, a Bluetooth module 225, a GNSS module 227, an NFC module 228, and an RF module 229. The cellular module 221 may provide, for example, voice communication, video communication, a messaging service, an Internet service or the like through a communication network. According to an embodiment of the disclosure, the cellular module 221 may perform discrimination and authentication of the electronic device 201 within a communication network using the subscriber identification module 224 (for example, a SIM card), for example. According to an embodiment of the disclosure, the cellular module 221 may perform at least a portion of functions that the processor 210 provides. According to an embodiment of the disclosure, the cellular module 221 may include a CP. According to an embodiment of the disclosure, at least a portion (for example, two or more) of the cellular module 221, the Wi-Fi module 223, the Bluetooth module 225, the GNSS module 227, and the NFC module 228 may be included within one integrated chip (IC) or an IC package. The RF module 229 may transmit and receive a communication signal (for example, an RF signal). The RF module 229 may include a transceiver, a power amplifier module (PAM), a frequency filter, a low noise amplifier (LNA), an antenna, or the like. According to an embodiment of the disclosure, at least one of the cellular module 221, the Wi-Fi module 223, the Bluetooth module 225, the GNSS module 227, or the NFC module 228 may transmit and receive an RF signal through a separate RF module. The subscriber identification module 224 may include, for example, a card or an embedded SIM including a subscriber identification module, and may include unique identification information (for example, an integrated circuit card identifier (ICCID)) or subscriber information (for example, integrated mobile subscriber identity (IMSI)).

The memory 230 (for example, the memory 130) may include an internal memory 232 or an external memory 234. For example, the internal memory 232 may include at least one of a volatile memory (for example, a dynamic random access memory (DRAM), a static RAM (SRAM), or a synchronous DRAM (SDRAM)), and a nonvolatile memory (for example, a one-time programmable read only memory (OTPROM), a programmable ROM (PROM), an erasable and programmable ROM (EPROM), an electrically erasable and programmable ROM (EEPROM), a mask ROM, a flash ROM, a flash memory, a hard drive, or a solid state drive (SSD)). The external memory 234 may include a flash drive, for example, compact flash (CF), secure digital (SD), micro-SD, mini-SD, extreme digital (xD), multimedia card (MMC), a memory stick, or the like. The external memory 234 may be functionally or physically connected to the electronic device 201 through various interfaces.

The sensor module 240 may measure, for example, a physical quantity or may detect an operation state of the electronic device 201, and may convert the measured or detected information to an electrical signal. The sensor module 240 may include at least one of, for example, a gesture sensor 240A, a gyro sensor 240B, a barometer sensor 240C, a magnetic sensor 240D, an acceleration sensor 240E, a grip sensor 240F, a proximity sensor 240G, a color sensor 240H (for example, a red, green, blue (RGB) sensor), a biometric sensor 240I, a temperature/humidity sensor 240J, an illuminance sensor 240K, or an ultra violet (UV) sensor 240M. Additionally or alternatively, the sensor module 240 may include, for example, an E-nose sensor, an electromyography sensor (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling at least one sensor included therein. According to an embodiment of the disclosure, the electronic device 201 may further include a processor which is a portion of the processor 210 or a separate element from the processor 210 and is configured to control the sensor module 240. The processor 210 may control the sensor module 240 while the processor 210 remains at a sleep state.

According to various embodiments of the disclosure, a light receiving unit of at least one light sensor may be disposed below or beneath a display region, or inside the display region or on a layer forming the display region. According to an embodiment of the disclosure, the light receiving unit of the at least one light sensor may be disposed on at least a portion of a rear surface of the display 260. At least a portion of the display 260 may be designed to allow light to penetrate therethrough. According to an embodiment of the disclosure, a light emitting unit (or a light source) of the at least one light sensor may be disposed in a side space of the display 260 or below or beneath the side space. Light (or a light signal) scattered or reflected from an object may pass through the display 260 and enter the light receiving unit, and the light receiving unit may generate an electric signal (or a digital value) based on the received light. Light outputted from the light emitting unit may pass through a portion (for example, an exterior cover having a higher light transmission ratio than that of the display 260) vertically aligned with the light emitting unit, and may be discharged to the outside.

According to an embodiment of the disclosure, the electronic device 201 may include a light blocking element (not shown) to reduce an electric influence of light outputted from the light emitting unit on the display 260. According to an embodiment of the disclosure, the light blocking element may be disposed inside the display 260. Since the light blocking element prevents light (or light energy) outputted from the light emitting unit of the light sensor from entering the display 260, malfunction (for example, spot) of the display 260 which is attributable to light outputted from the light emitting unit of the light sensor can be prevented.

According to an embodiment of the disclosure, in a proximity detection mode using the proximity sensor 240G, the processor 210 may enhance power consumption of the electronic device 201 by adjusting a light output power level of at least one light source of the proximity sensor 240G. For example, the light blocking element may prevent light outputted from the light emitting unit from entering a portion of the display 260 (for example, a thin film transistor (TFT)). When the electronic device 201 is designed to have the light blocking element, the light output power value of the light emitting unit may be set to a relatively high fixed value, in comparison with the case where the electronic device 201 is designed not to have the light blocking element. The operation of setting the light output power value of the light emitting unit to the relatively high fixed value in comparison with the case where the electronic device is designed not to have the light blocking element is to compensate for an influence of the light blocking element on light outputted from the light emitting unit. The operation of setting the light output power value of the light emitting unit to the relatively high fixed value in comparison with the case where the electronic device is designed not to have the light blocking element may not be effective in power consumption. According to an embodiment of the disclosure, since the processor 210 adaptively adjusts the light output power value of the light emitting unit according to a proximity distance of an object, power consumption of the electronic device 201 may be enhanced.

The input device 250 may include a touch panel 252, a (digital) pen sensor 254, a key 256, or an ultrasonic input device 258. The touch panel 252 may use at least one of a capacitive, resistive, infrared or ultrasonic detecting method. In addition, the touch panel 252 may further include a control circuit. The touch panel 252 may further include a tactile layer to provide a tactile reaction to a user. The (digital) pen sensor 254 may be, for example, a portion of a touch panel or may include an additional sheet for recognition. The key 256 may include, for example, a physical button, an optical key, or a keypad. The ultrasonic input device 258 may detect an ultrasonic wave, which is generated from an input tool, through a microphone (for example, a microphone 288), and may identify data corresponding to the detected ultrasonic wave.

The display 260 (for example, the display 160) may include a panel 262 (or a display panel), a hologram device 264, a projector 266, and/or a control circuit for controlling the aforementioned elements. The panel 262 may be implemented to be flexible, transparent, or wearable. The panel 262 and the touch panel 252 may be integrated into one or more modules. According to an embodiment of the disclosure, the panel 262 may include a pressure sensor (or a force sensor) for measuring an intensity of pressure on a user's touch. The pressure sensor may be integrated into the touch panel 252 or may be implemented with one or more sensors separate from the touch panel 252. The hologram device 264 may display a stereoscopic image in a space using a light interference phenomenon. The projector 266 may project light onto a screen so as to display an image. The screen may be arranged inside or outside the electronic device 201. The interface 270 may include an HDMI 272, a USB 274, an optical interface 276, or a D-subminiature (D-sub) 278. The interface 270 may be included, for example, in the communication interface 170 illustrated in FIG. 1. Additionally or alternatively, the interface 270 may include, for example, a mobile high definition link (MHL) interface, a SD card/MMC interface, or an infrared data association (IrDA) standard interface.

The audio module 280 may convert a sound and an electric signal in dual directions. At least a portion of the audio module 280 may be included, for example, in the input/output interface 150 illustrated in FIG. 1. The audio module 280 may process, for example, sound information that is inputted or outputted through a speaker 282, a receiver 284, an earphone 286, or a microphone 288. The camera module 291 may be, for example, a device for shooting a still image or a video, and according to an embodiment of the disclosure, the camera module 291 may include, for example, one or more image sensors (for example, a front sensor or a rear sensor), a lens, an ISP, or a flash (for example, an LED or a xenon lamp). The power management module 295 may manage, for example, power of the electronic device 201. According to an embodiment of the disclosure, the power management module 295 may include a power management integrated circuit (PMIC), a charger IC, or a battery or fuel gauge. The PMIC may have a wired charging method and/or a wireless charging method. The wireless charging method may include, for example, a magnetic resonance method, a magnetic induction method or an electromagnetic wave method. The PMIC may further include an additional circuit for wirelessly charging, for example, a coil loop, a resonance circuit, or a rectifier, and the like. The battery gauge may measure, for example, a remaining capacity of the battery 296 and a voltage, current or temperature thereof while the battery is charged. The battery 296 may include, for example, a rechargeable battery and/or a solar battery.

The indicator 297 may display a specific state of the electronic device 201 or a portion thereof (for example, the processor 210), such as a booting state, a message state, a charging state, and the like. The motor 298 may convert an electrical signal into a mechanical vibration and may generate vibration, a haptic effect, and the like. For example, the electronic device 201 may include a mobile TV supporting device (for example, a GPU) for processing media data according to the standards of digital multimedia broadcasting (DMB), digital video broadcasting (DVB), MediaFlo™, or the like. Each of the elements described in various embodiments of the disclosure may be configured with one or more components, and the names of the elements may be changed according to the type of the electronic device. According to various embodiments of the disclosure, some elements of the electronic device (for example, the electronic device 201) may be omitted or other additional elements may be added. Furthermore, some of the elements may be combined with each other so as to form one entity, and the functions of the elements may be performed in the same manner as before being combined.

Figure 3:
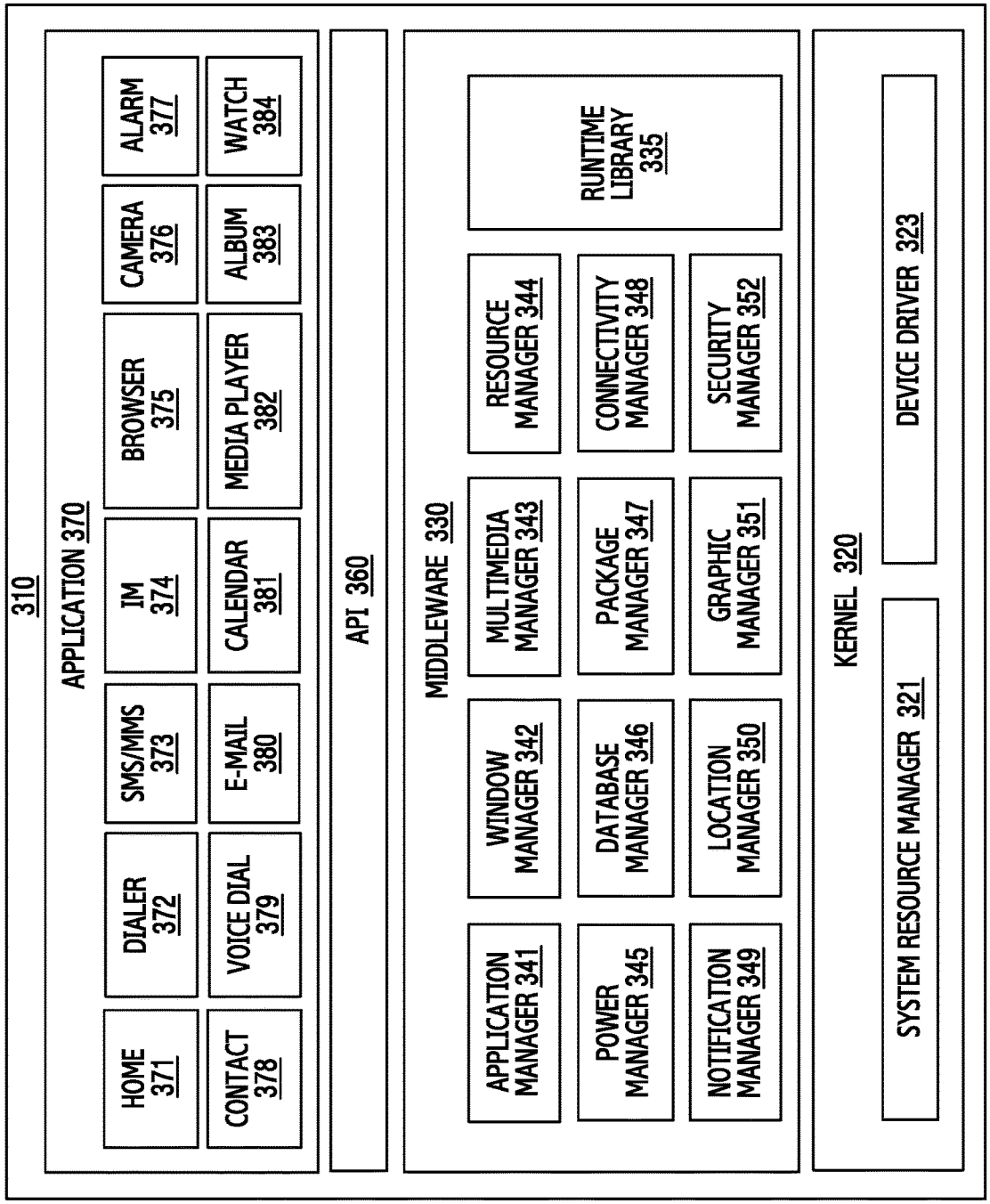
FIG. 3 is a block diagram illustrating a program module according to various embodiments of the disclosure.

FIG. 3 is a block diagram illustrating a program module according to various embodiments of the disclosure.

Referring to FIG. 3, according to an embodiment of the disclosure, a program module 310 (for example, the program 140) may include an OS to control resources of an electronic device (for example, the electronic device 101), and/or various applications (for example, the application program 147) executable in the OS. The OS may include, for example, Android™, iOS™, Windows™, Symbian™ Tizen™, or Bada™.

Referring to FIG. 3, the program module 310 may include a kernel 320 (for example, the kernel 141), a middleware 330 (for example, the middleware 143 in FIG. 1), an API 360 (for example, the API 145 in FIG. 1), and/or an application 370 (for example, the application program 147 in FIG. 1). At least part of the program module 310 may be pre-loaded on the electronic device, or may be downloaded from an external electronic device (e.g., the first and second external electronic devices 102, 104 or the server 106 in FIG. 1).

The kernel 320 may include, for example, a system resource manager 321 and/or a device driver 323. The system resource manager 321 may control, allocate or collect the system resources. According to an embodiment of the disclosure, the system resource manager 321 may include a process manager, a memory manager, or a file system manager. The device driver 323 may include, for example, a display driver, a camera driver, a Bluetooth driver, a shared memory driver, a USB driver, a keypad driver, a Wi-Fi driver, an audio driver, or an inter-process communication (IPC) driver. The middleware 330 may provide functions which are commonly required by the application 370 or may provide various functions to the application 370 through the API 360, such that the application 370 can use limited system resources in the electronic device. According to an embodiment of the disclosure, the middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, or a security manager 352.

For example, the runtime library 335 may include a library module which is used by a compiler to add a new function through a programming language while the application 370 is executed. The runtime library 335 may perform input/output management, memory management, or an arithmetic function. The application manager 341, for example, may manage the life cycle of the application 370. The window manager 342 may manage GUI resources used on a screen. The multimedia manager 343, for example, may identify a format to be used to play media files, and may encode or decode a media file using a codec appropriate for a corresponding format. The resource manager 344 may manage the source code of the application 370 or a memory space of the memory. The power manager 345, for example, may manage the capacity, temperature, or power of a battery, and determine or provide power information to be used for the operation of the electronic device based on corresponding information of the capacity, temperature, or power of the battery. According to an embodiment of the disclosure, the power manager 345 may interwork with a basic input/output system (BIOS). The database manager 346 may generate, search, or change a database to be used by the application 370. The package manager 347 may manage installation or update of an application that is distributed in the form of a package file.

The connectivity manager 348, for example, may manage a wireless connection. The notification manager 349, for example, may provide an event, such as a received message, an appointment, or a notification of proximity to a user. The location manager 350, for example, may manage locational information on the electronic device. The graphic manager 351, for example, may manage graphic effects to be offered to a user or a user interface related to the graphic effects. The security manager 352, for example, may provide system security or user authentication. According to an embodiment of the disclosure, the middleware 330 may include a telephony manager to manage a speech or video telephony function of the electronic device, or a middleware module to form a combination of the various functions of the above-described elements. According to an embodiment of the disclosure, the middleware 330 may provide a module which is customized according to a kind of an OS. The middleware 330 may dynamically delete a portion of the existing elements or may add new elements. The API 360 may be, for example, a set of API programming functions and may be provided as a different configuration according to an OS. For example, in the case of Android or iOS, a single API set may be provided for each platform. In the case of Tizen™, two or more API sets may be provided for each platform.

The application 370 may include, for example, a home application 371, a dialer application 372, a short message service (SMS)/multimedia messaging service (MIMS) application 373, an instant message (IM) application 374, a browser application 375, a camera application 376, an alarm application 377, a contact application 378, a voice dial application 379, an email application 380, a calendar application 381, a media player application 382, an album application 383, a watch application 384, health care (e.g., for measuring the degree of workout or blood sugar), or environmental information (e.g., for measuring air pressure, humidity, or temperature information) application. According to an embodiment of the disclosure, the application 370 may further include an information exchanging application that is capable of supporting information exchange between the electronic device and the external electronic device. The information exchange application, for example, may include a notification relay application adapted to transfer designated information to the external electronic device or a device management application adapted to manage the external electronic device. The notification relay application may transfer notification information occurring at another application of the electronic device to the external electronic device. Additionally or alternatively, the notification relay application may receive notification information from the external electronic device and provide the notification information to a user of the electronic device. The device management application may control the function (e.g., turn-on or turn-off of the external electronic device (or some components), or adjustment of brightness (or resolution) of the display) of the external electronic device communication with the electronic device, and may support installation, delete, or update of an application running on the external electronic device. According to an embodiment of the disclosure, the application 370 may include an application (for example, a health care application of a mobile medical device) which is assigned in accordance with an attribute of the external electronic device. According to an embodiment of the disclosure, the application 370 may include an application which is received from the external electronic device. At least part of the program module 310 may be implemented (for example, executed) by software, firmware, hardware (for example, the processor 210), or a combination of two or more thereof, and may include modules, programs, routines, sets of instructions, or processes for performing one or more functions.

The term "module" used herein may include a unit including hardware, software, or firmware, and, for example, may be interchangeably used with the terms "logic," "logical block," "component" or "circuit". The "module" may be an integrally configured component or a minimum unit for performing one or more functions or a part thereof. The "module" may be implemented mechanically or electronically. For example, the "module" may include an application-specific IC (ASIC) chip, a field-programmable gate array (FPGA), and a programmable-logic device for performing some operations, which are known or will be developed. At least part of a device (for example, modules or functions thereof) or a method (for example, operations) according to various embodiments of the disclosure, for example, may be implemented by instructions stored in a computer-readable storage media (for example, the memory 130) in the form of a programmable module. When the instruction is executed by a processor (for example, the processor 120), the processor may perform a function corresponding to the instruction. A computer-readable recording media may include a hard disk, a floppy disk, a magnetic media (for example, a magnetic tape), an optical media (for example, compact disc ROM (CD-ROM) and a DVD, a magneto-optical media (for example, a floptical disk)), an internal memory, or the like. In addition, an instruction may include a code generated by a compiler or a code executable by an interpreter. A module or a program module according to various embodiments may include at least one of the above-described elements, or a portion of the above-described elements may be omitted, or additional other elements may be further included. Operations performed by a module, a program module, or other elements according to various embodiments may be executed sequentially, in parallel, repeatedly, or in a heuristic method. In addition, at least part of operations may be executed in different sequences, omitted, or other operations may be added.

Figure 4A:
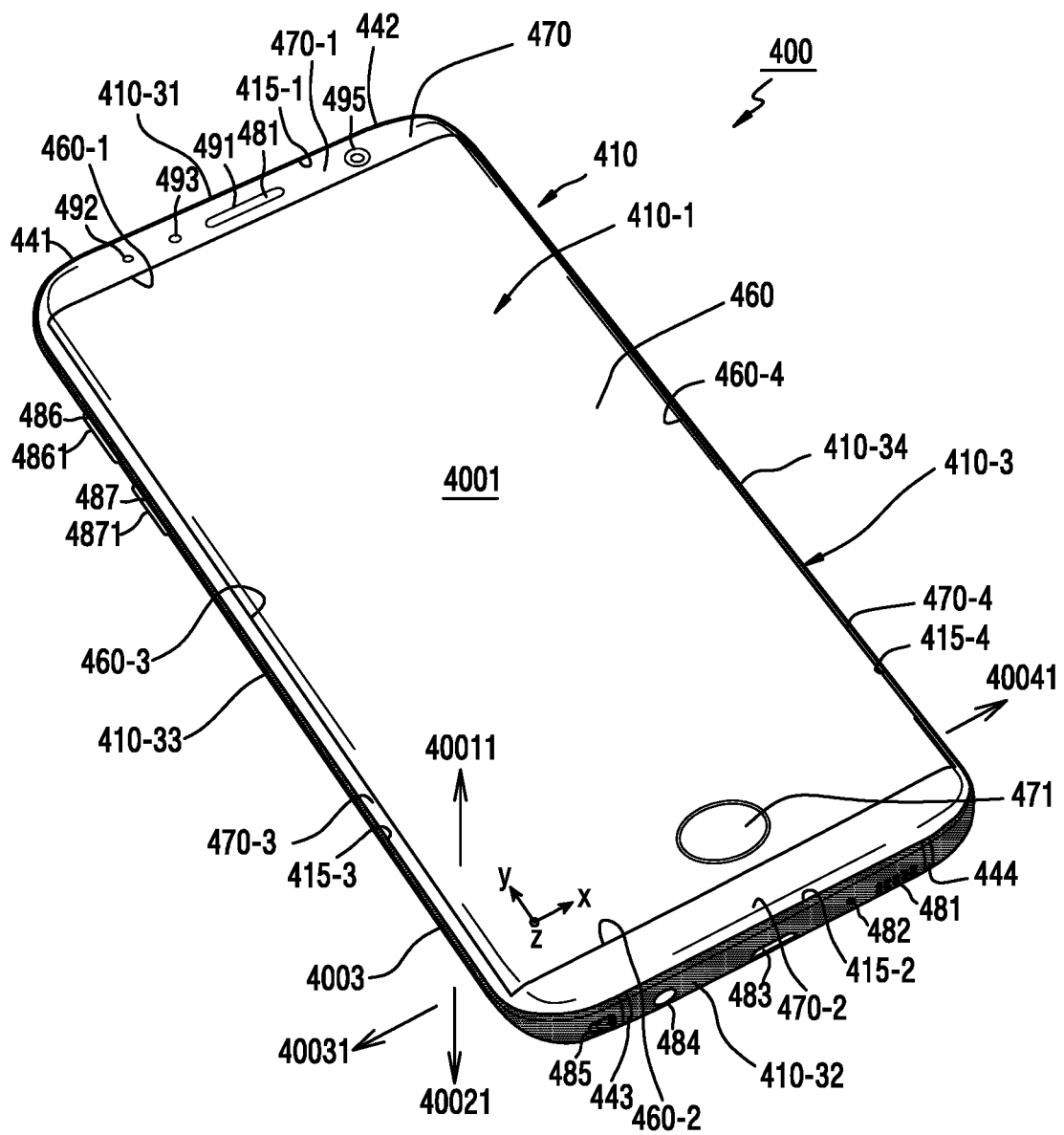
FIGS. 4A and 4B are views illustrating an electronic device including a light emitting unit and a light receiving unit of at least one light sensor disposed adjacent to a display according to an embodiment of the disclosure.
Figure 4B:
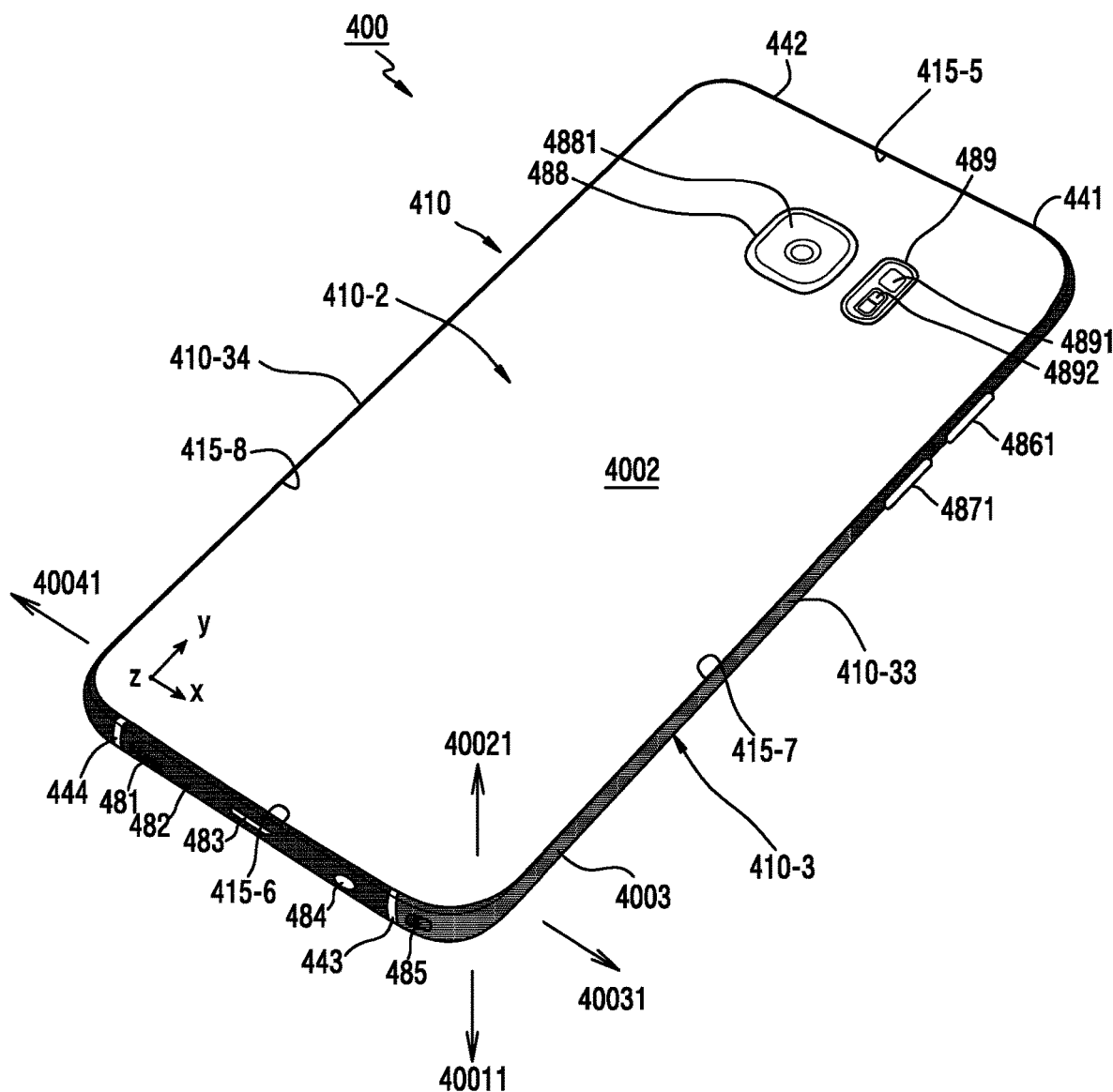

FIGS. 4A and 4B are views illustrating an electronic device including a light emitting unit and a light receiving unit of at least one light sensor disposed adjacent to a display according to an embodiment of the disclosure.

According to various embodiments of the disclosure, an electronic device 400 may include at least a portion of the electronic device 101 of FIG. 1 or the electronic device 201 of FIG. 2.

Referring to FIGS. 4A and 4B, in an embodiment of the disclosure, the electronic device 400 may include a housing 410 forming an entirety or at least a portion of an exterior of the electronic device 400.

According to an embodiment of the disclosure, the housing 410 may form an exterior including a first surface 4001, a second surface 4002, and a third surface 4003. The first surface 4001 may substantially face toward a first direction 40011. The second surface 4002 may substantially face toward a second direction 40021 opposite the first direction 40011. The third surface 4003 may be a surface (for example, a side surface) surrounding between the first surface 4001 and the second surface 4002.

According to an embodiment of the disclosure, the housing 410 may include a first cover (or a first plate) 410-1 forming the first surface 4001, and a second cover (or a second plate) 410-2 forming the second surface 4002. The housing 410 may include a side member 410-3 surrounding a space between the first cover 410-1 and the second cover 410-2. The side member 410-3 may form the third surface 4003.

According to an embodiment of the disclosure, the first cover 410-1 may be substantially rectangular, including a first edge 415-1, a second edge 415-2, a third edge 415-3, and a fourth edge 415-4. For example, the first edge 415-1 and the second edge 415-2 may face each other and may be parallel to each other. The third edge 415-3 and the fourth edge 415-4 may face each other and may be parallel to each other. According to various embodiments of the disclosure, a distance between the first edge 415-1 and the second edge 415-2 may be longer than a distance between the third edge 415-3 and the fourth edge 415-4. According to various embodiments of the disclosure, although not shown, a connection portion between the first edge 415-1 and the third edge 415-3, a connection portion between the first edge 415-1 and the fourth edge 415-4, a connection portion between the second edge 415-2 and the third edge 415-3, or a connection portion between the second edge 415-2 and the fourth edge 415-4 may be rounded.

According to various embodiments of the disclosure, a region (or an edge region) (not shown) of the first cover 410-1 that is adjacent to (for example, about 10 mm or less) the first edge 415-1, the second edge 415-2, the third edge 415-3, or the fourth edge 415-4 may be designed to have a curved shape. For example, the edge region adjacent to the third edge 415-3 may include a curved surface in the form of descending in the second direction 40021 with respect to coordinates increased in a third direction 40031. For example, the edge region adjacent to the fourth edge 415-4 may include a curved surface in the form of descending in the second direction 40021 with respect to coordinates increased in a fourth direction 40041.

According to an embodiment of the disclosure, the second cover 410-2 may be disposed opposite the first cover 410-1. According to an embodiment of the disclosure, the second cover 410-2 may be substantially symmetrical to the first cover 410-1. The second cover 410-2 may be substantially rectangular, including a fifth edge 415-5 corresponding to the first edge 415-1, a sixth edge 415-6 corresponding to the second edge 415-2, a seventh edge 415-7 corresponding to the third edge 415-3, and an eighth edge 415-8 corresponding to the fourth edge 415-4.

According to an embodiment of the disclosure, the side member 410-3 may include a first frame 410-31 coupled between the first edge 415-1 and the fifth edge 415-5, a second frame 410-32 coupled between the second edge 415-2 and the sixth edge 415-6, a third frame 410-33 coupled between the third edge 415-3 and the seventh edge 415-7, and a fourth frame 410-34 coupled between the fourth edge 415-4 and the eighth edge 415-8. According to various embodiments of the disclosure, a connection portion between the first frame 410-31 and the third frame 410-33, a connection portion between the first frame 410-31 and the fourth frame 410-34, a connection portion between the second frame 410-32 and the third frame 410-33, or a connection portion between the second frame 410-32 and the fourth frame 410-34 may be rounded.

According to various embodiments of the disclosure, the side member 410-3 may include an extension portion (for example, a mid-plate) extending from at least one of the first frame 410-31, the second frame 410-32, the third frame 410-33, and the fourth frame 410-34 toward a space (not shown) formed between the first cover 410-1 and the second cover 410-2.

According to various embodiments of the disclosure, at least a portion of the side member 410-3 may include a conductive material. According to various embodiments of the disclosure, at least one of the first frame 410-31, the second frame 410-32, the third frame 410-33 or the fourth frame 410-34 of the side member 410-3 may include a plurality of metallic portions physically separated from one another. According to an embodiment of the disclosure, nonconductive members 441, 442, 443, 444 may be disposed between the plurality of metallic portions. For example, the nonconductive members 441, 442, 443, 444 may be a part of an internal structure included in the mid-plate coupled to the side member 410-3, and the internal structure is formed of a material, such as polymer, or the like.

The electronic device 400 may include, for example, various elements arranged between the first cover 410-1 and the second cover 410-2. According to an embodiment of the disclosure, the electronic device 400 may include a display (not shown) (for example, the panel 262 of FIG. 2) disposed between the first cover 410-1 and the second cover 410-2. The display may include light emitting units (for example, OLEDs) including a plurality of pixels, and may be exposed to the outside through the first cover 410-1.

According to an embodiment of the disclosure, the display may be disposed along at least a portion of the first cover 410-1. The first cover 410-1 may include a first region 460 which is a region covering the display, and a second region 470 (for example, a bezel region) which is a region not covering the display. The first region 460 may be a region through which light generated from the display passes.

According to an embodiment of the disclosure, the first region 460 may be substantially rectangular, including an a edge 460-1 adjacent to (for example, about 10 mm or less) the first edge 415-1, a b edge 460-2 adjacent to the second edge 415-2, a c edge 460-3 adjacent to the third edge 415-3, and a d edge 460-4 adjacent to the fourth edge 415-4. The second region 470 (hereinafter, a bezel region) may have a rectangular ring shape, surrounding the first region 460. The bezel region 470 may include a first bezel region 470-1 disposed between the first edge 415-1 and the a edge 460-1, a second bezel region 470-2 disposed between the second edge 415-2 and the b edge 460-2, a third bezel region 470-3 disposed between the third edge 415-3 and the c edge 460-3, and a fourth bezel region 470-4 disposed between the fourth edge 415-4 and the d edge 460-4.

According to various embodiments of the disclosure, the bezel region 470 may be designed to have a color distinguished from the first region 460. For example, the bezel region 470 may have dark color, such as black, or may have a similar or same color to or as the color of the side member 430-3. According to an embodiment of the disclosure, the bezel region 470 may include a black printed layer.

According to an embodiment of the disclosure, the first region 460 of the first cover 410-1 and the display may be defined as a "display region." According to various embodiments of the disclosure, the display region may be designed to further include various members (for example, a layer) (not shown) coupled to the first cover 410-1 or the display.

According to an embodiment of the disclosure, a light receiving unit (or a light receiving module) of at least one light sensor may be disposed below or beneath the display region, or inside the display region or on a layer forming the display region. According to an embodiment of the disclosure, the light receiving unit of the at least one light sensor may be disposed along at least a portion of a rear surface of the display region.

According to an embodiment of the disclosure, a light emitting unit (a light emitting module or a light source) of the at least one light sensor may be mounted in a position aligned with the bezel region 470. According to an embodiment of the disclosure, the at least one sensor may be the illuminance sensor 240K, the RGB sensor 240H, the UV sensor 240M, the proximity sensor 240G, or the gesture sensor 240A of the sensor module 240 of FIG. 2.

The at least one light sensor may measure, for example, an intensity, or the like, on various wavelength bands of light, and may quantitatively or qualitatively analyze a material by using data measured by the at least one light sensor. According to an embodiment of the disclosure, light outputted from the light emitting unit of the at least one light sensor may pass through the bezel region 470 and may be discharged to the outside. Light (or light signal) scattered or reflected from an object (or an external object) may pass through the display region and enter the light receiving unit of the at least one light sensor. The light receiving unit of the at least one light sensor may generate an electric signal (or a digital value) based on the received light.

On the assumption of an example in which the light emitting unit of the at least one light sensor is designed to be disposed below or beneath the display region although it is not illustrated, at least a portion of the light outputted from the light emitting unit of the at least one light sensor may pass through the display region and may be discharged to the outside. In an embodiment of the disclosure, the light emitting unit of the at least one light sensor may be disposed in a space (for example, a side space of the display region) other than the display region or below or beneath the space. This can reduce the light outputted from the at least one light emitting unit to enter the display region, can reduce an effect of the light outputted from the light emitting unit of the light sensor on the display, or can prevent malfunction (for example, spot) of the display (for example, an OLED display) attributable to the light outputted from the light emitting unit of the light sensor.

On the assumption of the example in which the light emitting unit of the at least one light sensor is designed to be disposed below or beneath the display region although it is not illustrated, at least a portion of the light outputted from the light emitting unit may pass through the display region and may be discharged to the outside. When a light transmission ratio of the display region is low (for example, about 20% or less), the light outputted from the light emitting unit of the at least one light sensor may pass through the display region, but may not be discharged to the outside more than a designed amount of light. This may degrade light detection performance of the light sensor. In an embodiment of the disclosure, the light emitting unit of the at least one light sensor may be disposed in a space other than the display region (for example, a side space of the display region), or below or beneath the space. Since the light outputted from the light emitting unit of the at least one light sensor passes through the bezel region 470 of the first cover 410-1 having a higher light transmission ratio than that of the display region, and is discharged to the outside, light detection performance of the light sensor can be guaranteed.

On the assumption of an example in which both the light receiving unit and the light emitting unit of the at least one light sensor are disposed in a space other than the display region (for example, a side space of the display region) or below or beneath the space although it is not illustrated, the side space of the display region should be designed to have a width for the light receiving unit and the light emitting unit. This may make it difficult to extend the display region, while maintaining the size of the electronic device 400. In an embodiment of the disclosure, since the light receiving unit of the at least one light sensor is disposed below or beneath the display region, and the light emitting unit of the at least one light sensor is disposed in the side space of the display region or below or beneath the side space, the display region can be easily extended, while maintaining the size of the electronic device 400.

According to an embodiment of the disclosure, the first bezel region 470-1 or the second bezel region 470-2 may be designed to be wider than the width of the third bezel region 470-3 or the fourth bezel region 470-4. According to an embodiment of the disclosure, the light emitting unit of the at least one light sensor may be mounted in a position aligned with the first bezel region 470-1 or the second bezel region 470-2 of the bezel region 470.

According to various embodiments of the disclosure, the first cover 410-1 may include at least one light penetration region or a penetration hole 493 formed in a position aligned with the light emitting unit of the at least one light sensor. Light outputted from the light emitting unit of the at least one light sensor may be discharged to the outside through the light penetration region or the penetration hole 493.

According to various embodiments of the disclosure, the first cover 410-1 may further include an additional light penetration region or penetration hole formed on a position aligned with a light emitting unit of another light sensor although it is not illustrated.

According to various embodiments of the disclosure, the display may include a touch panel for a touch input or hovering input using the first surface 4001. According to various embodiments of the disclosure, the touch panel may be a digitizer panel (for example, the pen sensor 254 of FIG. 2) supporting a touch input or a hovering input using a stylus.

According to various embodiments of the disclosure, the electronic device 400 may include various other electronic components (hereinafter, "first side components") mounted in positions aligned with the first bezel region 470-1.

According to various embodiments of the disclosure, the first side components may include a light emitting element (not shown) (for example, an LED) indicating various states of the electronic device 400. For example, when a remaining capacity of a battery is low, the electronic device 400 may display a corresponding color through the light emitting element. For example, when a screen is turned off, the electronic device 400 may display a corresponding color through the light emitting element. For example, when the electronic device 400 is connected to a wire charger or a wireless charger, the electronic device 400 may display a corresponding color through the light emitting element. According to an embodiment of the disclosure, the first cover 410-1 may include a light penetration region or a penetration hole 492 formed in a position aligned with the light emitting element. According to various embodiments of the disclosure, when the electronic device 400 is designed to display various states of the electronic device 400 through the display, the light emitting element or the light penetration region or the penetration hole 492 therefor may be omitted from the electronic device 400.

According to various embodiments of the disclosure, the first side components may include a receiver 481 to output a voice signal received from the other device during communication as a sound. The first cover 410-1 may include a penetration hole 491 formed in a position aligned with the receiver 481. The receiver 481 may be coupled to the penetration hole 491.

According to various embodiments of the disclosure, the first side components may include at least one camera (for example, a front facing camera) (for example, the camera module 291 of FIG. 2). The first cover 410-1 may include a light penetration region or a penetration hole 495 formed in a position aligned with the at least one camera.

According to various embodiments of the disclosure, when viewed from the second direction 40021, the penetration hole 491 for the receiver 481 may be disposed between the light penetration region 493 for the at least one light sensor and the light penetration region or the penetration hole 495 for the camera. According to various embodiments of the disclosure, when viewed from the second direction 40021, the light penetration region 493 for the at least one sensor may be disposed between the light penetration region 492 for the light emitting element and the penetration hole 491 for the receiver 481.

According to various embodiments of the disclosure, the electronic device 400 may display a software home button 471 through the display. A control circuit (for example, the processor 120 of FIG. 1 or the processor 210 of FIG. 2) may display the software home button 471 in the proximity of (for example, within about 20 mm from) the second bezel region 470-2. The software home button 471 may be displayed on the middle of the first region 460 between the c edge 460-3 and the d edge 460-4. According to various embodiments of the disclosure, although not shown, the control circuit may display the software home button 471 on various other positions. According to various embodiments of the disclosure, the control circuit may determine the display position of the software home button 471 according to user environment setting (user preference), an executed application (or mode), or the like.

When the software home button 471 is selected by a touch input or a hovering input, the control circuit (for example, the processor 120 of FIG. 1 or the processor 210 of FIG. 2) may display a main home screen through the display. The main home screen may be the first screen that is displayed on the display when power of the electronic device 400 is turned on. When a plurality of home screens are provided in the form of togglable pages, the main home screen may include icons for executing applications, time, weather, or the like. According to various embodiments of the disclosure, the home screen may display a state of the electronic device 400, such as a battery charging state, an intensity of a received signal, or a current time. According to an embodiment of the disclosure, when the software home button 471 is selected, the control circuit may allow the electronic device 400 to enter a sleep mode or a low-power mode. In the sleep mode or the low-power mode, the control circuit may perform only set basic operations, such as periodically listening to a radio signal from the outside. In the sleep mode or the low-power mode, the control circuit may include an operation of inactivating at least one element (for example, the display). The sleep mode or the low-power mode may include an operation of inactivating at least a portion of the control circuit. According to various embodiments of the disclosure, when the software home button 471 is selected, the control circuit may convert the sleep mode or the low-power mode into a wake-up mode. For example, in the wake-up mode, the control circuit may activate the display.

According to various embodiments of the disclosure, when the electronic device is designed to have the second bezel region 470-2 extended, the electronic device 400 may include various electronic components (hereinafter, "second side components") mounted in positions aligned with the second bezel region 470-2. According to an embodiment of the disclosure, the second side components may include a hardware home button (not shown). The hardware home button may substitute for a software home button.

According to various embodiments of the disclosure, the side member 410-3 may include penetration holes for various electronic components. According to an embodiment of the disclosure, the side member 410-3 may include a penetration hole 481 aligned with a speaker, a penetration hole 482 aligned with a microphone, penetration holes aligned with connectors (for example, a penetration hole 483 for a USB connector, a penetration hole 484 for a plug), a penetration hole 485 for inserting a stylus, or penetration holes 486, 487 for installing buttons 4861, 4871.

According to various embodiments of the disclosure, the second cover 410-2 may include penetration holes for various electronic components. According to an embodiment of the disclosure, the second cover 410-2 may include a penetration hole 488 to which a camera (or a rear facing camera) 4881 is coupled, or a penetration hole 489 to which a flash 4891 or a light sensor (for example, a heart rate measurement sensor) 4892 is coupled.

According to various embodiments of the disclosure, the electronic device 400 may further include various elements (or modules) according to a providing form thereof. Such elements may have their forms changed in various ways according to the trend toward convergence of digital devices, and the device may further include elements (for example, various elements of FIG. 2) having equal levels to those of the above-mentioned elements although all of them are not listed herein. According to various embodiments of the disclosure, the electronic device 400 may omit specific elements of the above-described elements or substitute them with other elements according to a providing form thereof.

Figure 5:
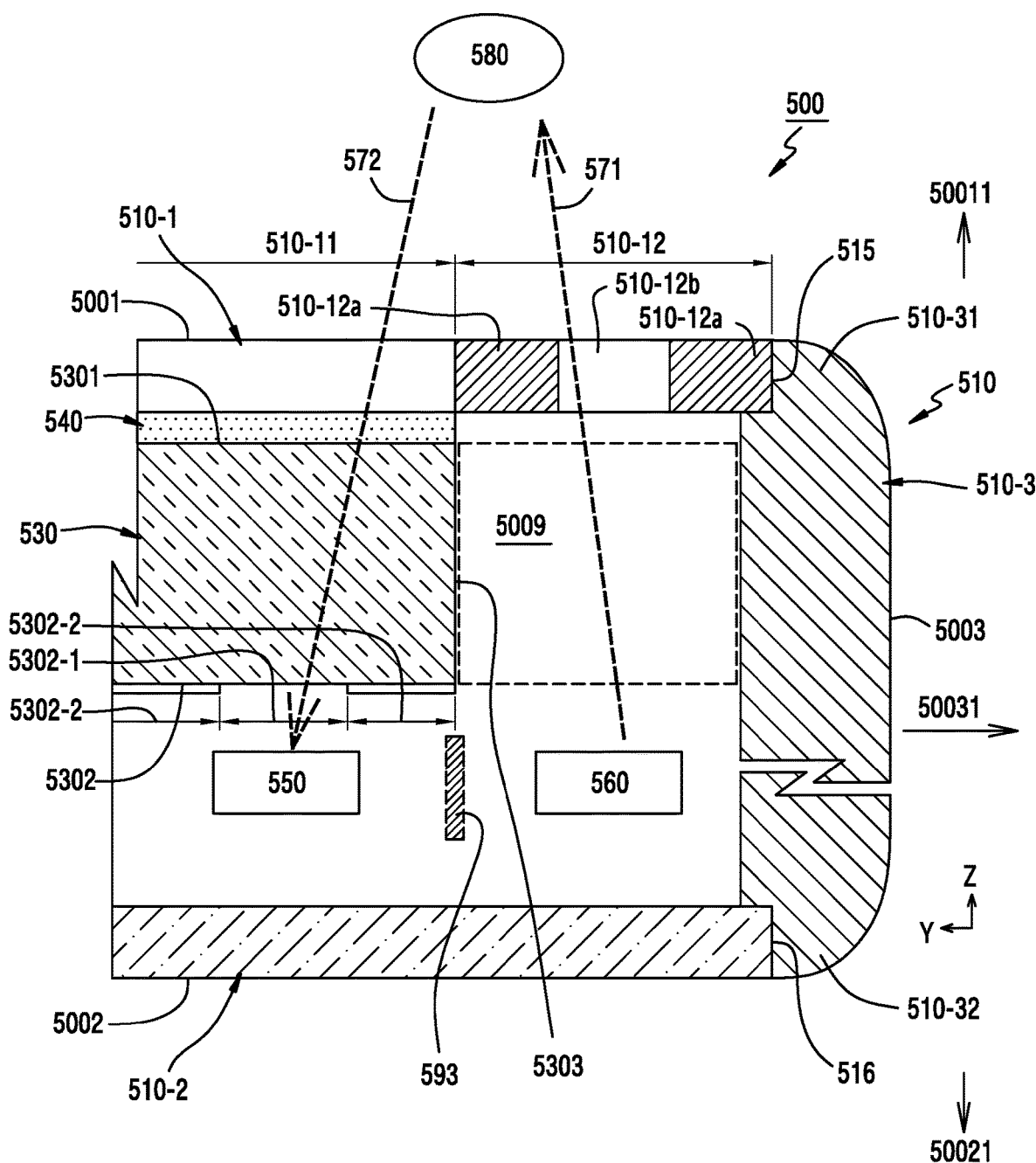
FIG. 5 is a cross-sectional view illustrating an electronic device including a light emitting unit and a light receiving unit of at least one light sensor disposed adjacent to a display according to an embodiment of the disclosure.

FIG. 5 is a cross-sectional view illustrating an electronic device including a light emitting unit and a light receiving unit of at least one light sensor disposed adjacent to a display according to an embodiment of the disclosure.

Referring to FIG. 5, according to various embodiments of the disclosure, an electronic device 500 of FIG. 5 may include at least a portion of the electronic device 101 of FIG. 1, the electronic device 201 of FIG. 2, or the electronic device 400 of FIG. 4A.

Referring to FIG. 5, in an embodiment of the disclosure, the electronic device 500 may include a housing 510 forming an entirety or at least a portion of an exterior of the electronic device 500. According to various embodiments of the disclosure, the housing 510 may include a nonmetallic material and/or metallic material. For example, the housing 510 may be formed of a material, such as plastic, metal, carbon fiber, and other fiber composites, ceramic, glass, wood, or a combination of these materials. According to various embodiments of the disclosure, the housing 510 may be entirely formed of one material or a combination of a plurality of materials. According to various embodiments of the disclosure, the housing 510 may be in part formed of materials having different material properties.

According to an embodiment of the disclosure, the housing 510 (for example, 410 of FIG. 4A or 4B) may form an exterior including a first surface 5001 (for example, 4001 of FIG. 4A), a second surface 5002 (for example, 4002 of FIG. 4B), and a third surface 5003. According to an embodiment of the disclosure, the housing 510 may include a first cover 510-1 forming the first surface 5001 and a second cover 510-2 forming the second surface 5002. The housing 510 may include a side member 510-3 surrounding a space between the first cover 510-1 and the second cover 510-2, and forming the third surface 5003. The first cover 510-1, the second cover 510-2, and the side member 510-3 may be similar to or the same as the first cover 410-1, the second cover 410-2, and the side member 410-3 of FIG. 4A, respectively.

According to an embodiment of the disclosure, one end 510-31 of the side member 510-3 may be coupled to an edge 515 of the first cover 510-1 (for example, the edges 415-1, 415-2, 415-3, or 415-4 of the first cover 410-1 of FIG. 4A). The other end 510-32 of the side member 510-3 may be coupled to an edge 516 of the second cover 510-2 (for example, the edges 415-5, 415-6, 415-7, or 415-8 of the second cover 410-2 of FIG. 4B). For example, the electronic device 500 may include an adhesive material disposed between one end 510-31 of the side member 510-3 and the edge 515 of the first cover 510-1, or between the other end 510-32 of the side member 510-3 and the edge 516 of the second cover 510-2.

According to an embodiment of the disclosure, at least a portion of the first surface 5001 or the second surface 5002 may be substantially a flat surface. For example, thickness of the first cover 510-1 or the second cover 510-2 may be uniform, and the first cover 510-1 or the second cover 510-2 may be a plate extending in a third direction (for example, 40031 of FIG. 4B) perpendicular to a first direction 50011 (for example, 40011 of FIG. 4B) or a second direction 50021 (for example, 40021 of FIG. 4A).

The electronic device 500 may include, for example, various elements disposed between the first surface 5001 and the second surface 5002. For example, when an A element, a B element, and a C element are disposed in the second direction 50021 in sequence, it may be defined that the "A element is disposed above the B element and the C element is disposed below or beneath the B element."

According to an embodiment of the disclosure, the electronic device 500 may include a display 530 (for example, the display 160 of FIG. 1 or the display 260 of FIG. 2) disposed between the first cover 510-1 and the second cover 510-2. The display 530 may include a panel (for example, the panel 262 of FIG. 2) extending along at least a portion of the first cover 510-1. For example, the display 530 may include a display first surface 5301 facing toward a first direction 50011, a display second surface 5032 facing toward the second direction 50021, and a display third surface (or a side surface) 5303 facing toward a third direction 50031.

According to an embodiment of the disclosure, the display 530 may be coupled to the first cover 510-1. For example, the electronic device 500 may include various adhesive materials 540 disposed between the display 530 and the first cover 510-1. For example, the adhesive material 540 may be designed to cover at least a portion of the display first surface 5301. According to various embodiments of the disclosure, the adhesive material 540 may include a light transmission material (for example, an optical clear adhesive (OCA)).

According to an embodiment of the disclosure, the first cover 510-1 may include a first region 510-11 (for example, 460 of FIG. 4A) covering the display 530. Light outputted from the display 530 may pass through the first region 510-11 and may be discharged to the outside. The first cover 510-1 may include a second region 510-12 (for example, 470 of FIG. 4A) except for the first region 510-11. The second region 510-12 may be disposed over a space 5009 between the display 530 and the side member 510-3.

According to an embodiment of the disclosure, the display 530 may include a plurality of layers. The display 530 may include a display panel (for example, the panel 262 of FIG. 2) having a light emitting unit including a plurality of pixels, and layers of various materials coupled to the display panel. According to an embodiment of the disclosure, the display panel may be an active matrix organic light emitting diodes (AMOLED) display panel. According to various embodiments of the disclosure, the display panel may be display panels of various other types, such as a passive matrix organic light emitting diode (PMOLED).

According to various embodiments of the disclosure, the display 530 may include one or more various optical layers (not shown) related to image quality. The one or more optical layers may be a polarizing layer, a phase difference layer, a birefringence compensation layer, an anti-glare layer, a brightness enhancement layer, a visual compensation layer, an anti-reflection layer, or the like. According to various embodiments of the disclosure, the one or more optical layer may be disposed in various positions, such as on, under, or inside the display panel.

According to various embodiments of the disclosure, the display 530 may include a first conductive pattern (not shown). The first conductive pattern may be used to detect a touch input or a hovering input. According to various embodiments of the disclosure, the first conductive pattern may include, for example, and without limitation, aluminum (Al), copper (Cu), silver (Ag), graphene, indium-tin-oxide (ITO), indium-zinc-oxide (IZO), or the like.

The electronic device 400 may include a touch/hovering input detection circuit (not shown) electrically connected to the first conductive pattern. The touch/hovering input detection circuit may activate at least a portion of the first conductive pattern, based on a signal from a control circuit (for example, the processor 120 of FIG. 1 or the processor 210 of FIG. 2). The touch/hovering input detection circuit may detect a signal related to a touch input or a hovering input through the first conductive pattern, and may provide the signal to the control circuit. The control circuit may detect a touch input or a hovering input based on a signal obtained from the touch/hovering input detection circuit. The touch input may be defined as an input occurring when an object (for example, a finger or a stylus) substantially touches the first surface 5001. The hovering input may be defined as an input occurring when an object (for example, a finger or a stylus) is spaced apart from the first surface 5001 by a threshold distance (for example, about 10 cm) or less.

According to various embodiments of the disclosure, the first conductive pattern may include the touch panel 252 or the pen sensor 254 of FIG. 2.

According to various embodiments of the disclosure, the display 530 may be an on-cell touch screen panel (TSP) AMOLED (OCTA) panel including the first conductive pattern.

According to various embodiments of the disclosure, the electronic device 500 may include a second conductive pattern (not shown) disposed along at least a portion of the first surface 5001, the second surface 5002, and the third surface 5003. According to an embodiment of the disclosure, the second conductive pattern may be disposed along at least a portion of the display 530. According to various embodiments of the disclosure, the second conductive pattern may be designed to be disposed in various positions between layers included in the display 530.

According to various embodiments of the disclosure, the electronic device 500 may include a pressure detection circuit (not shown) electrically connected to the second conductive pattern. According to an embodiment of the disclosure, the pressure detection circuit may activate at least a portion of the second conductive pattern, based on a signal from the control circuit (for example, the processor 120 of FIG. 1 or the processor 210 of FIG. 2). The pressure detection circuit may detect a signal related to a pressure through the second conductive pattern, and may provide the signal to the control circuit (for example, the processor 120 of FIG. 1 or the processor 210 of FIG. 2). For example, the second conductive pattern may include a plurality of first electrodes and a plurality of second electrodes. The plurality of first electrodes may be arranged on one layer, and the plurality of second electrodes may be arranged on another layer. According to various embodiments of the disclosure, the second electrode may be provided in various forms of the electronic device 500. For example, the second electrode may include a ground mounted in the electronic device 500. The pressure detection circuit may apply a voltage to the plurality of first electrodes and the plurality of second electrodes, and accordingly, a capacitance may be generated between the first electrode and the second electrode. For example, when a pressure is applied to the outer surface of the electronic device 500, a distance between the first electrode and the second electrode may become shorter and the capacitance may be changed (for example, the capacitance increases). The pressure detection circuit may provide a signal according to the change in the capacitance to the control circuit. The control circuit may detect a position where the pressure is generated and a size of the pressure, based on the signal obtained from the pressure detection circuit.

According to various embodiments of the disclosure, the electronic device 500 may include a third conductive pattern (not shown) disposed along at least a portion of the first surface 5001, the second surface 5002, and the third surface 5003. According to an embodiment of the disclosure, the third conductive pattern may be disposed between a light transmission substrate (for example, the first cover 510-1) and the first conductive pattern. In another example, the third conductive pattern may be disposed between the first conductive pattern and the display 530 (for example, the panel 262 of FIG. 2). According to various embodiments of the disclosure, the third conductive pattern may be designed to be disposed inside the display 530.

According to various embodiments of the disclosure, the third conductive pattern may include an electrode pattern of a mesh structure. The electrode pattern of the mesh structure may be defined as a "metal mesh pattern." The metal mesh pattern may include openings. Light generated at the display 530 may be discharged to the outside through the openings of the metal mesh pattern. According to various embodiments of the disclosure, the metal mesh pattern may have various mesh shapes. The mesh shape may be, for example, rectangular, hexagonal, or the like. According to various embodiments of the disclosure, the mesh shape of the metal mesh pattern may be designed to be entirely uniform or different in part. According to various embodiments of the disclosure, the mesh size of the metal mesh pattern may be designed to be entirely uniform or different in part. According to various embodiments of the disclosure, thickness of the metal mesh pattern may be designed to be entirely uniform or different in part.

The electronic device 500 may include, for example, a wireless communication circuit (for example, the communication module 220 of FIG. 2) electrically connected to the third conductive pattern. The wireless communication circuit may activate at least a portion of the third conductive pattern, based on a signal from the control circuit (for example, the processor 120 of FIG. 1 or the processor 210 of FIG. 2). The wireless communication circuit may wirelessly transmit the signal from the control circuit to the outside by using the third conductive pattern. The wireless communication circuit may receive a radio signal from the outside by using the third conductive pattern, and may provide the radio signal to the control circuit.

According to an embodiment of the disclosure, the electronic device 500 may include a light receiving unit 550 (or a light receiving module) of at least one light sensor disposed between the display 530 and the second surface 5002. According to an embodiment of the disclosure, the light receiving unit 550 may be disposed under or below (for example, at a distance within about 10 mm from) the display 530. According to an embodiment of the disclosure, the light receiving unit 550 may be disposed in a position vertically aligned with at least a portion of the first region 510-11 of the first cover 510-1.

According to an embodiment of the disclosure, the electronic device 500 may include a light emitting unit (or a light emitting module) 560 of the at least one light sensor disposed in a position vertically aligned with at least a portion of the second region (or bezel region) 510-12 of the first cover 510-1. According to an embodiment of the disclosure, the light emitting unit 560 may be disposed under or below a space 5009 (hereinafter, a "side space") between the side surface 5303 of the display 530 and the side member 510-3. According to various embodiments of the disclosure, the light emitting unit 560 of the at least one light sensor may be designed to have a portion thereof inserted into the side space 5009 although it is not illustrated.

For example, light outputted from the light emitting unit 560 may pass through the first cover 510-1 (for example, the second region 510-12), and may be discharged to the outside (571). According to an embodiment of the disclosure, at least a portion of the display 530 may include a light transmission material. Light (or light signal) scattered or reflected from an object 580 (or an external object) may pass through the first cover 510-1 (for example, the first region 510-11), the adhesive material 540, and the display 530, and may enter the light receiving unit 550 (572). The light receiving unit 550 may generate an electric signal (or a digital value) based on the received light. According to various embodiments of the disclosure, the electronic device 500 may include an analog digital converter (ADC) (not shown) electrically connected with the light receiving unit 550. The ADC may generate a detection value (or a digital value) (or an "ADC value") corresponding to an amount of light received by the light receiving unit 550 (for example, quantization). According to various embodiments of the disclosure, the light receiving unit 550 may be designed to include the ADC.

According to various embodiments of the disclosure, the first region 510-11 of the first cover 510-1 or the adhesive material 540 may be designed to have a light transmission ratio of about 50% or more or a light reflection ratio of about 10% or less. According to various embodiments of the disclosure, the display 530 may be designed to have a light transmission ratio of about 20% or more or a light reflection ratio of about 10% or less.

According to various embodiments of the disclosure, the second region 510-12 of the first cover 510-1 may include a color region 510-12a and a transparent region 510-12b. The color region 510-12a may have a color distinguished from the first region 510-11. For example, the color region 501-12a may have a dark color, such as black, or may have a similar or same color to or as that of the side member 510-3. According to an embodiment of the disclosure, the color region 510-12a may include a black printed layer.

According to various embodiments of the disclosure, light of at least one wavelength band outputted from the light emitting unit 560 may pass through the transparent region 501-12b, and may be discharged to the outside. The color region 510-12a may be designed to block the light of the at least one wavelength band outputted from the light emitting unit 560.

According to various embodiments of the disclosure, the entirety of the second region 510-12 of the first cover 510-1 may be designed to be a color region, and may be designed to allow the light of the at least one wavelength band outputted from the light emitting unit 560 to pass therethrough although it is not illustrated.

On the assumption of an example in which the light emitting unit is designed to be disposed under or below the display 530 although it is not illustrated, at least a portion of light outputted from the light emitting unit may pass through the display 530 and may be discharged to the outside. According to an embodiment of the disclosure, the light emitting unit 560 may be disposed in the side space 5009 or under or below the side space 5009. This may reduce light outputted from the light emitting unit 560 to enter the display 430, and may prevent an electric influence (for example, malfunction, such as spot) of light (or light energy) outputted from the light emitting unit 560 on the display 530.

On the assumption of the example in which the light emitting unit 530 is designed to be disposed under or below the display 530 although it is not illustrated, at least a portion of the light outputted from the light emitting unit may pass through the display 530 and may be discharged to the outside. When a light transmission ratio of the display 530 is low (for example, about 20% or less), light outputted from the light emitting unit may pass through the display 530, and may not be discharged to the outside more than a designed amount of light. This may degrade light detection performance of the light sensor. In an embodiment of the disclosure, the light emitting unit 560 may be disposed in the side space 5009 or under or below the side space 5009. Light outputted from the light emitting unit 560 may pass through the first cover 510-1 having a higher light transmission ratio than that of the display 530, and may be discharged to the outside. Therefore, light detection performance of the light sensor can be guaranteed.

On the assumption of an example in which both the light receiving unit and the light emitting unit are disposed in the side space 5009 or under or below the side space 5009 although it is not illustrated, the side space 5009 should be designed to have a width for the light receiving unit and the light emitting unit, which may make it difficult to extend the display 530 while maintaining the size of the electronic device 500. In an embodiment of the disclosure, the light receiving unit 550 may be disposed under or below the display 530 and the light emitting unit 560 may be disposed in the side space 5009 or under or below the side space 5009. Therefore, the display 530 can be easily extended while maintaining the size of the electronic device 500.

In various embodiments of the disclosure, the electronic device 500 may further include a light blocking element to prevent light outputted from the light emitting unit 560 from entering at least a portion of the display 530. According to an embodiment of the disclosure, the light blocking element may include a first light blocking material (not shown) covering at least a portion of the side surface 5303 of the display 530. The first light blocking material may reduce the light outputted from the light emitting unit 560 to enter the display 530 through the side surface 5303 of the display 530, or prevent the light from entering the display 530. This can reduce an electric influence of the light outputted from the light emitting unit 560 on the display 530.

A display second surface 5302 may include, for example, a received light penetrating region 5302-1 to allow external light to pass therethrough when the light enters the light receiving unit 550. According to an embodiment of the disclosure, the light blocking element may include a second light blocking material (not shown) covering at least a portion of a region 5302-2 except for the received light penetrating region 5302-1 of the display second surface 5302. The second light blocking material may reduce the light outputted from the light emitting unit 560 to enter the display 530 through the display second surface 5302, or may prevent the light from entering the display 530. This can reduce an electric influence of the light outputted from the light emitting unit 560 on the display 530.

According to various embodiments of the disclosure, the electronic device 500 may include a light shielding member 593 disposed between the light receiving unit 550 and the light emitting unit 560. The light shielding member 593 may prevent light outputted from the light emitting unit 560 from being transmitted to the light receiving unit 550 or the display 530. According to various embodiments of the disclosure, the light shielding member 593 may be a portion of various members mounted in the electronic device 500.

According to various embodiments of the disclosure, the light receiving unit 550 and the light emitting unit 560 may be disposed on a plane substantially parallel to the first surface 5001. For example, the light receiving unit 550 and the light emitting unit 560 may be mounted on a substrate of a plate shape extending in the third direction 50031.

According to an embodiment of the disclosure, the light receiving unit 550 and the light emitting unit 560 may be elements of the same light sensor. According to various embodiments of the disclosure, the light receiving unit 550 may be an element of a first light sensor (for example, a proximity sensor), and the light emitting unit 560 may be an element of a second light sensor (for example, a biometric sensor) which is different from the first light sensor.

Figure 6A:
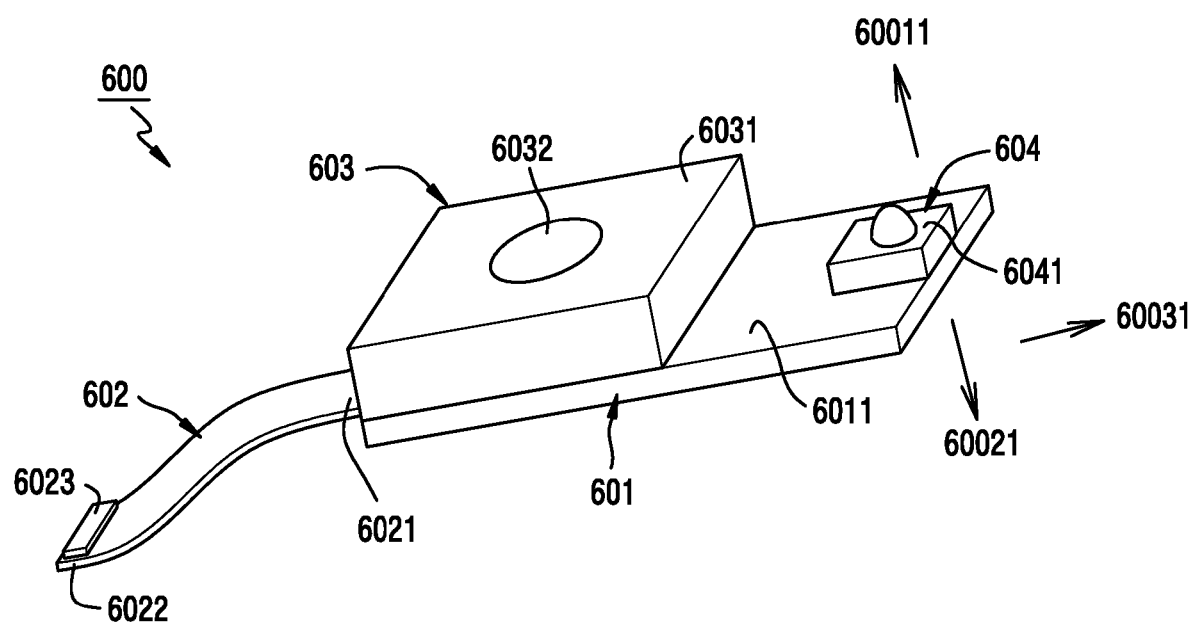
FIG. 6A is a view illustrating a light sensor according to an embodiment of the disclosure.

FIG. 6A is a view illustrating a light sensor according to an embodiment of the disclosure.

Figure 6B:
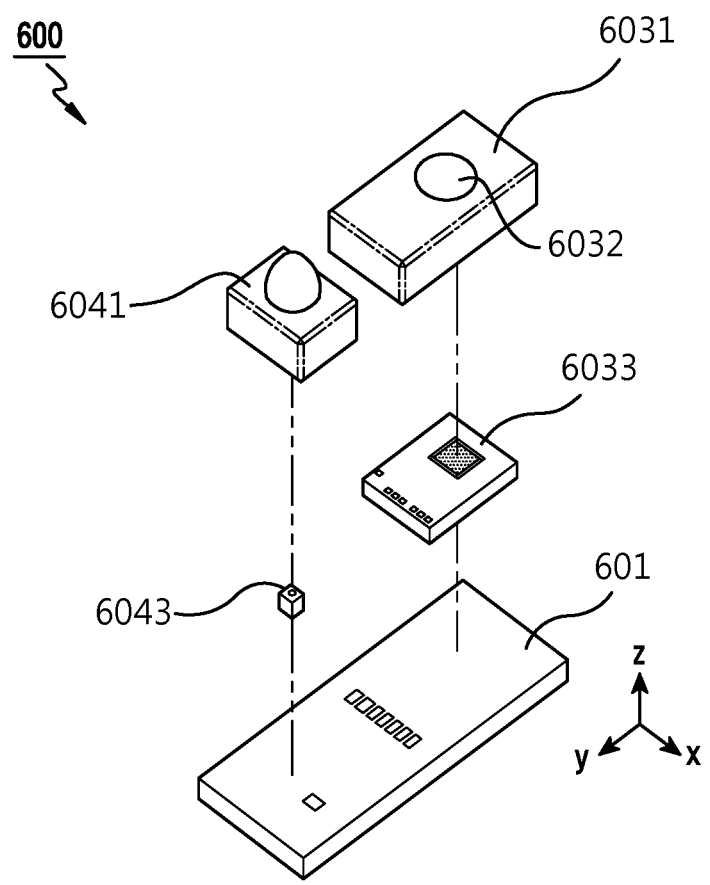
FIG. 6B is an exploded perspective view illustrating a light sensor according to an embodiment of the disclosure.

FIG. 6B is an exploded perspective view of a light sensor according to an embodiment of the disclosure.

Referring to FIGS. 6A and 6B, a light sensor 600 may be provided as a single module in the form of a package (for example, a system in package (SIP)). The light sensor 600 may include a substrate (hereinafter, a light sensor substrate) 601, a light receiving unit 603, and a light emitting unit 604. According to various embodiment of the disclosure, the light receiving unit 603 may be the light receiving unit 550 of FIG. 5, and the light emitting unit 604 may be the light emitting unit 560 of FIG. 5.

According to an embodiment of the disclosure, the light sensor substrate 601 may be a plate extending in a 13th direction 60031 and may include a circuit. The light sensor substrate 601 may include a substrate first surface 6011 facing toward a 11th direction 60011 perpendicular to the 13th direction 60031, and a substrate second surface (not shown) facing toward a 12th direction 60021 opposite the 11th direction 60011. According to an embodiment of the disclosure, the light receiving unit 603 and the light emitting unit 604 may be mounted on the substrate first surface 6011.

According to an embodiment of the disclosure, the light emitting unit 604 may include a light source (for example, an LED) 6043 and a second mold compound (hereinafter, a light emitting unit cover) 6041. The light source 6043 may be mounted on the light sensor substrate 601 by soldering (for example, surface mounting technology (SMT)). The light emitting unit cover 6041 may have a vessel shape which is convex in the 11th direction 60011. When the light emitting unit cover 6041 is coupled to the light sensor substrate 601, a space may be formed to accommodate the light source 6043. The light emitting unit cover 6041 may include a light transmission material, and light outputted from the light source 6043 may pass the light emitting unit cover 6041, and may be discharged to the outside of the light sensor 600.

According to an embodiment of the disclosure, the light receiving unit 603 may include a light receiving sensor (or a light detector) (for example, a photo diode) 6033 and a first mold compound (hereinafter, a light receiving unit cover) 6031. The light receiving sensor 6033 may be mounted on the light sensor substrate 601 by soldering. The light receiving unit cover 6031 may have a vessel shape which is convex in the 11th direction 60011. The light receiving unit cover 6031 may have a rectangular vessel shape, but is not limited thereto, and may be designed to have various cross-sectional shapes, such as trapezoid or arc. When the light receiving unit cover 6031 is coupled to the light sensor substrate 601, a space may be formed to accommodate the light receiving sensor 6033. The light receiving unit cover 6031 may include a penetration hole 6032 vertically aligned with the light receiving sensor 6033. External light may pass through the penetration hole 6032 of the light receiving unit cover 6031, and may enter the light receiving sensor 6033. According to various embodiments of the disclosure, the penetration hole 6032 may be substituted with a light transmission region.

According to various embodiments of the disclosure, a portion of the light receiving unit cover 6031 (for example, the light shielding element 493 of FIG. 4A) may be disposed between the light receiving sensor 6033 and the light emitting unit 604, and may prevent light outputted from the light source 6043 of the light emitting unit 604 from entering the light receiving sensor 6033.

According to an embodiment of the disclosure, the light sensor 600 may include a flexible conductive member 602 electrically connected to the light sensor substrate 601. One end 6021 of the flexible conductive member (for example, a flexible printed circuit board (FPCB)) 602 may be connected to the light sensor substrate 601. The other end 6022 of the flexible conductive member 602 may be electrically connected to a PCB (not shown) mounted in the electronic device (for example, 500 of FIG. 5). According to an embodiment of the disclosure, the other end 6022 of the flexible conductive member 602 may include a connector 6023 to be electrically connected with the printed circuit board (PCB).

According to various embodiments of the disclosure, the light emitting unit and the light receiving unit of the light sensor may be mounted on the electronic device (for example, 500 of FIG. 5), separately, unlike the structure in which the light emitting unit and the light receiving unit are installed on a single light sensor substrate 891 (see FIG. 6A or 6B). In an embodiment of the disclosure, the light emitting unit may be electrically connected to a PCB (not shown) mounted in the electronic device (for example, 500 of FIG. 5) by using a first flexible conductive member (for example, a first FPCB), and the light receiving unit may be electrically connected to a PCB of the electronic device by using a second flexible conductive member (for example, a second FPCB).

Figure 7:
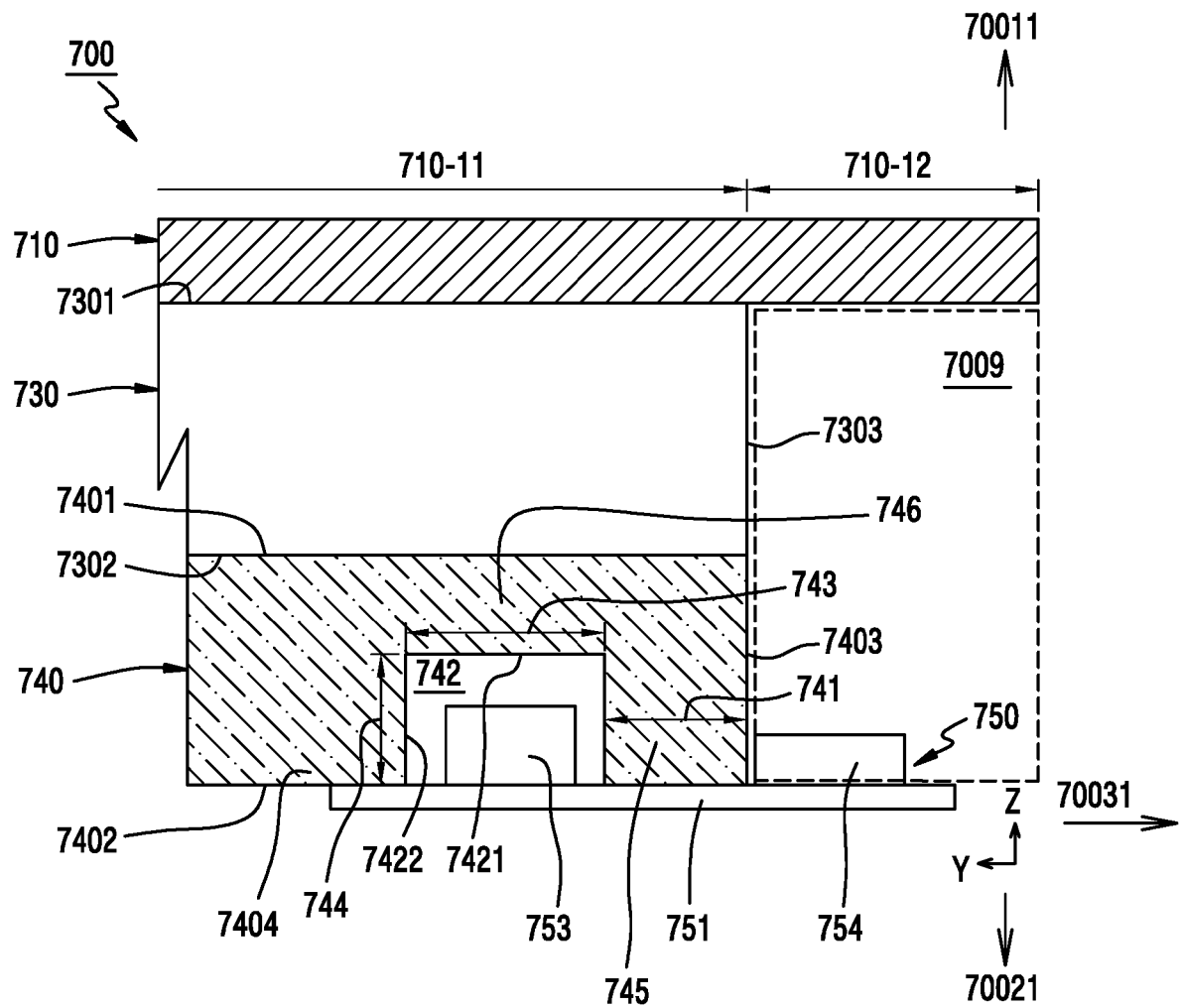
FIG. 7 is a cross-sectional view illustrating an electronic device including a light emitting unit and a light receiving unit of at least one light sensor disposed adjacent to a display according to an embodiment of the disclosure.

FIG. 7 is a cross-sectional view illustrating an electronic device including a light emitting unit and a light receiving unit of at least one light sensor disposed adjacent to a display according to an embodiment of the disclosure.

Referring to FIG. 7, according to various embodiments of the disclosure, an electronic device 700 may include at least a portion of the electronic device 101 of FIG. 1, the first external electronic device 102 of FIG. 2, the electronic device 400 of FIG. 4A, or the electronic device 500 of FIG. 5.

Referring to FIG. 7, according to an embodiment of the disclosure, the electronic device 700 may include a plate 710, a display 730, a support member 740, and a light sensor 750.

According to various embodiments of the disclosure, the plate 710 may be similar to or the same as the first cover 510-1 of FIG. 5. For example, the plate 710 may include a first region 710-11 (for example, the first region 510-11 of FIG. 5) covering the display 730, and a second region 710-12 (for example, the second region 510-12 of FIG. 5) adjacent to the first region 710-11. Light outputted from the display 730 may pass through the first region 710-11, and may be discharged to the outside. According to an embodiment of the disclosure, the first cover 510-1 may be formed of a light transmission material.

According to various embodiments of the disclosure, the display 730 may be similar to or the same as the display 530 of FIG. 5. For example, the display 730 may include a display first surface 7301 facing toward a first direction 70011 (for example, the first direction 50011 of FIG. 5), a display second surface 7302 facing toward a second direction 70021 (for example, the second direction 50021 of FIG. 5), and a display third surface 7303 facing toward a third direction 70031 (for example, the third direction 50031 of FIG. 5). According to an embodiment of the disclosure, the display 730 may have a light transmission property.

According to various embodiments of the disclosure, the light sensor 750 may be similar to or the same as the light sensor 600 of FIGS. 6A and 6B. For example, the light sensor 750 may include a substrate 751 (for example, the light sensor substrate 601 of FIG. 6A), and a light receiving unit 753 (for example, 603 of FIG. 6A) and a light emitting unit 754 (for example, 604 of FIG. 6A) mounted on the substrate 751.

According to an embodiment of the disclosure, the support member 740 may be designed to cover at least a portion of the display second surface 7302. The support member 740 may include, for example, a support member first surface 7401 facing toward the first direction 70011 and coupled to the display second surface 7302, a support member second surface 7402 facing toward the second direction 70021, and a support member third surface 7403 facing toward the third direction 70031.

According to an embodiment of the disclosure, the support member third surface 7403 may be designed to avoid protruding toward the third direction 70031 with respect to the display third surface 7303. For example, the support member third surface 7403 and the display third surface 7303 may be connected to be substantially flush with each other. According to an embodiment of the disclosure, the second region 710-12 of the first cover 710 may be disposed over a side portion space (hereinafter, a side space) 7009 (for example, 5009 of FIG. 5) of the display 730 and the support member 740.

According to an embodiment of the disclosure, the support member 740 may include a space (hereinafter, a light receiving unit receiving portion 742) which is dented from the support member second surface 7402 in the first direction 70011. When the substrate 751 of the light sensor 750 is coupled to the support member second surface 7402, the light receiving unit 753 of the light sensor 750 may be inserted into the light receiving unit receiving portion 742, and the light emitting unit 754 of the light sensor 750 may be disposed in the side space 7009.

According to an embodiment of the disclosure, a distance 741 between the light receiving unit receiving portion 742 and the display third surface 7303 in the third direction 70031 may be about 20 mm or less. According to various embodiments of the disclosure, the light receiving unit receiving portion 742 may be disposed at a distance longer than 20 mm from the display third surface 7303 in the third direction 70031.

When viewed in cross section, the light receiving unit receiving portion 742 may have a substantially rectangular cross section including an inner top surface 7421 and an inner side surface 7422. According to various embodiments of the disclosure, the light receiving unit receiving portion 742 may be designed to have various other cross sections having a dent in the first direction 70011 although it is not illustrated. For example, when viewed in cross section, the light receiving unit receiving portion 742 may be designed to have various cross sections, such as trapezoid, arc, or the like, although it is not illustrated. According to various embodiments of the disclosure, when viewed from the second direction 70021, the light receiving unit receiving portion 742 may be designed to have various plane shapes although it is not illustrated.

According to various embodiments of the disclosure, the support member 740 may include a portion (hereinafter, a receiving portion side portion) 745 disposed between the light receiving unit receiving portion 742 and the side space 7009. According to various embodiments of the disclosure, the support member 740 may be designed to omit the receiving portion side portion 745.

According to an embodiment of the disclosure, the support member 740 may include a portion 746 (hereinafter, a receiving portion upper portion) disposed between the light receiving unit receiving portion 742 and the display 730. According to various embodiments of the disclosure, the support member 740 may be designed to omit the receiving portion upper portion 746 although it is not illustrated. According to various embodiments of the disclosure, the light receiving unit receiving portion 742 may be designed in the form of an opening although it is not illustrated.

According to various embodiments of the disclosure, the light receiving unit receiving portion 742 may be designed to have various width 743 or depth 744 according to a providing form or structure of the light receiving unit 753. According to an embodiment of the disclosure, the width 743 or depth 744 of the light receiving unit receiving portion 742 may be about 5 mm or less.

According to an embodiment of the disclosure, at least a portion of the support member 740 may be designed to include a light transmission material although it is not illustrated. External light passing through the first region 710-11 of the plate 710 and the display 730 may pass through the support member 740, and may enter the light receiving unit 753.

According to an embodiment of the disclosure, the support member 740 may include one or more layers. According to various embodiments of the disclosure, at least a portion of the support member 740 may include a flexible material. For example, the support member 740 may include a layer (for example, an embo layer or sponge layer) including various materials, such as polymer, or the like.

According to an embodiment of the disclosure, at least a portion of the support member second surface 7402 may be designed to include a conductive material. For example, the support member 740 may include a conductive layer (for example, an FPCB) 7404 forming the support member second surface 7402.

According to an embodiment of the disclosure, when the substrate 751 of the light sensor 750 is coupled to the support member second surface 7402, one or more contacts (not shown) of the substrate 751 and one or more contacts (not shown) formed on the conductive layer 7404 of the support member 740 may be electrically connected with each other. According to various embodiments of the disclosure, one or more contacts of the substrate 751 and one or more contacts of the conductive layer 7404 may be soldered to each other. According to various embodiments of the disclosure, the electronic device 700 may include a flexible conductive member (for example, a C clip 1110, a pogo-pin, a spring, conductive phorone and rubber, a conductive tape or copper connector, or the like) disposed between one or more contacts of the substrate 751 and one or more contacts of the conductive layer 7404.

Figure 8:
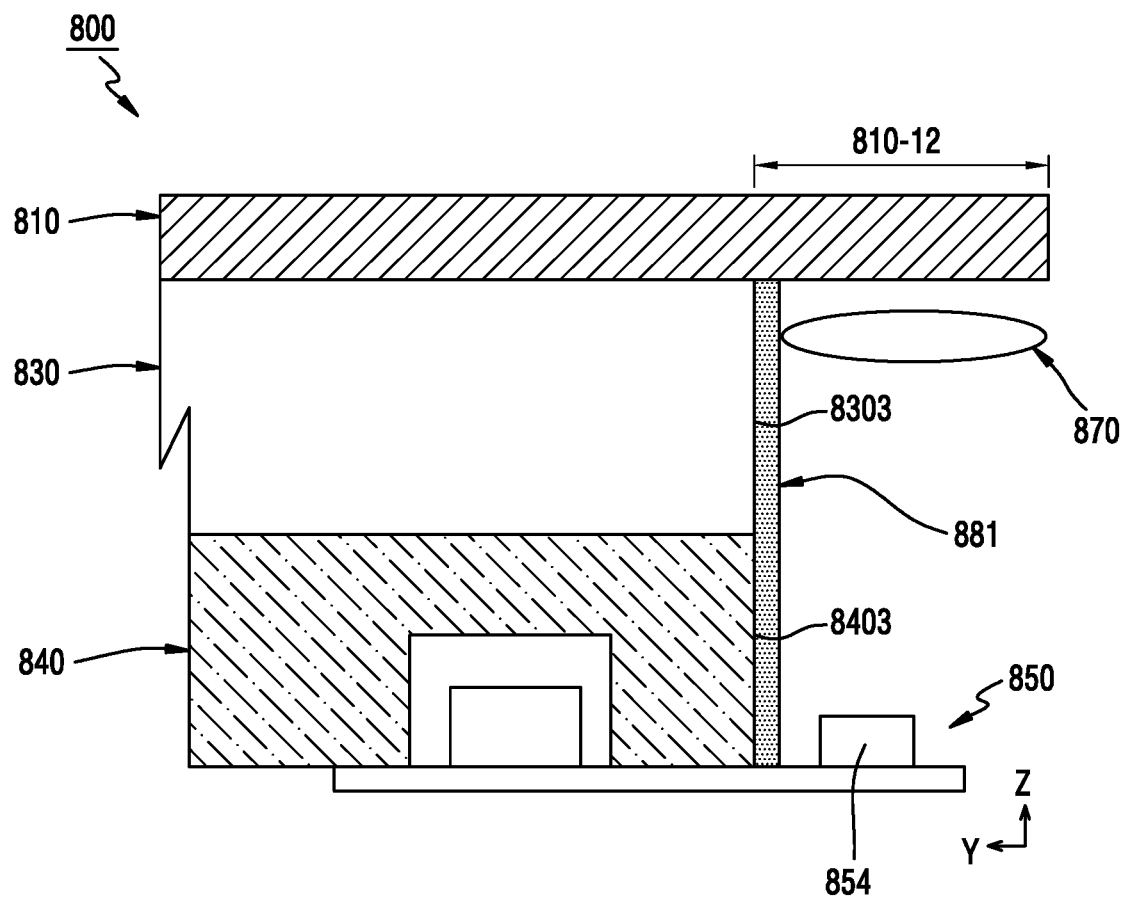
FIG. 8 is a cross-sectional view illustrating an electronic device including a light emitting unit and a light receiving unit of at least one light sensor disposed adjacent to a display according to various embodiments of the disclosure.

FIG. 8 is a cross-sectional view illustrating an electronic device including a light emitting unit and a light receiving unit of at least one sensor disposed adjacent to a display according to various embodiments of the disclosure.

Referring to FIG. 8, according to various embodiments of the disclosure, the electronic device 800 may include at least a portion of the electronic device 101 of FIG. 1, the first external electronic device 102 of FIG. 2, the electronic device 400 of FIG. 4A, the electronic device 500 of FIG. 5, or the electronic device 700 of FIG. 7.

According to an embodiment of the disclosure, the electronic device 800 may include a plate 810, a display 830, a support member 840, and a light sensor 850. According to various embodiments of the disclosure, the plate 810, the display 830, the support member 840, and the light sensor 850 may be similar to or the same as the plate 710, the display 730, the support member 740, and the light sensor 750 of FIG. 7, respectively.

According to various embodiments of the disclosure, the electronic device 800 may include a lens (or a lens module) 870 of various types disposed to be at least vertically aligned with a light emitting unit 854 (for example, 754 of FIG. 7). The lens 870 may be vertically aligned with a second region 810-12 (for example, 710-12 of FIG. 7) of the plate 810 and the light emitting unit 854. According to various embodiments of the disclosure, the lens 870 may be designed to be coupled to the plate 810 or to be included in the plate 810. The lens 870 may provide a function of allowing light outputted from the light emitting unit 854 to pass substantially through the second region 810-12 of the plate 810 and to be discharged to the outside (for example, a function of enhancing directivity, or guiding or changing a light direction).

According to various embodiments of the disclosure, the electronic device 800 may further include a light blocking element to prevent light outputted from the light emitting unit 854 from entering at least a portion of the display 830. According to an embodiment of the disclosure, the electronic device 800 may include a light blocking material 881 covering at least a portion of a side surface 8303 (for example, 7303 of FIG. 7) of the display 830 and a side surface 8403 (for example, 7403 of FIG. 7) of the support member 840. According to various embodiments of the disclosure, the electronic device 800 may include light blocking materials covering the side surface 8303 of the display 830 and the side surfaces 8403 of the support member 840, respectively, although they are not illustrated.

Figure 9:
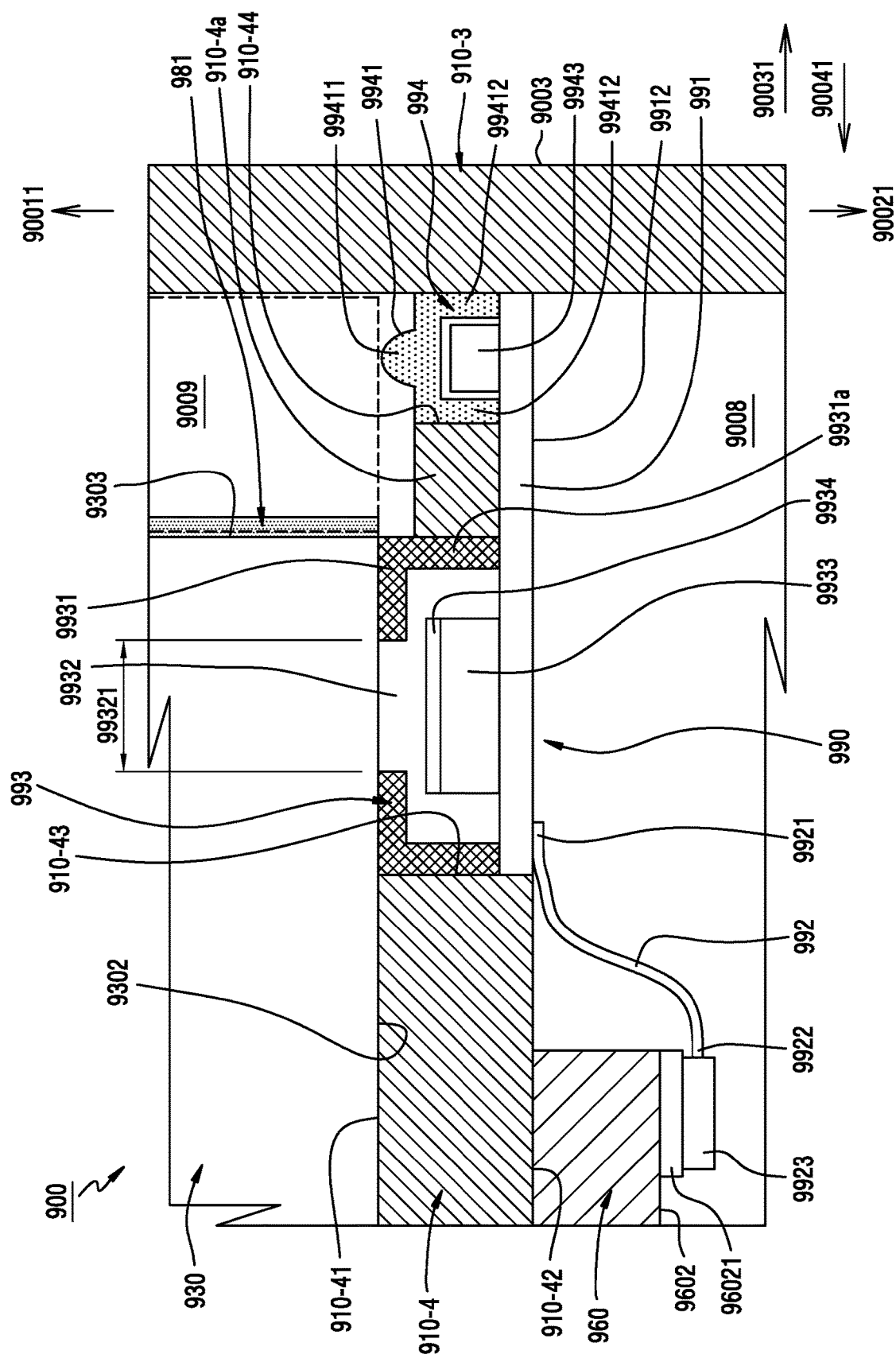
FIG. 9 is a cross-sectional view illustrating an electronic device including a light emitting unit and a light receiving unit of at least one light sensor disposed adjacent to a display according to various embodiments of the disclosure.

FIG. 9 is a cross-sectional view illustrating an electronic device including a light emitting unit and a light receiving unit of at least one sensor disposed adjacent to a display according to various embodiments of the disclosure.

Referring to FIG. 9, according to various embodiments of the disclosure, an electronic device 900 may include at least a portion of the electronic device 101 of FIG. 1, the electronic device 201 of FIG. 2, the electronic device 400 of FIG. 4A, or the electronic device 500 of FIG. 5.

According to an embodiment of the disclosure, the electronic device 900 may include a side member 910-3 forming a side surface 9003. According to various embodiments of the disclosure, the side member 910-3 may be similar to or the same as the side member 510-3 of FIG. 5, and may surround a space 9008 between a first cover (not shown) (for example, 510-1 of FIG. 5) and a second cover (not shown) (for example, 510-2 of FIG. 5). The electronic device 900 may include various elements disposed in the space 9008. According to an embodiment of the disclosure, the electronic device 900 may include a display 930, a mid-plate 910-4, a PCB 960, and a light sensor 990.

According to various embodiments of the disclosure, the display 930 may be the display 530 of FIG. 5. The display 930 may include a panel in a form (for example, the panel 262 of FIG. 2) extending in a third direction 90031 (for example, the third direction 50031 of FIG. 5). The display 930 may include a display rear surface 9302 (for example, the display second surface 5302 of FIG. 5) facing toward a second direction 90021 (for example, the second direction 50021 of FIG. 5), and a display side surface 9303 (for example, the display third surface 5303 of FIG. 5) facing toward the third direction 90031.

According to an embodiment of the disclosure, the mid plate 910-4 may be a plate extending from the side member 910-3 toward the inner space 9008 (for example, a fourth direction 90041) or coupling to the side member 910-3. The mid-plate 910-4 may include a first installation surface 910-41 facing toward the first direction 90011 and a second installation surface 910-42 facing toward the second direction 90021.

According to an embodiment of the disclosure, the mid plate 910-4 may be disposed between the display 930 and the PCB 960. For example, the display 930 may be disposed on the first installation surface 910-41 of the mid-plate 910-4, and the PCB 960 may be disposed on the second installation surface 910-42 of the mid-plate 910-4.

According to an embodiment of the disclosure, the light sensor 990 may be a single module in the form of a package, and for example, may be similar to or the same as the light sensor 600 of FIGS. 6A and 6B. For example, a light sensor substrate 991, a light receiving unit 993, and a light emitting unit 994 of the light sensor 990 may correspond to the light sensor substrate 601, the light receiving unit 603, and the light emitting unit 604 of FIGS. 6A and 6B, respectively.

According to various embodiments of the disclosure, a light emitting unit cover 9941 (for example, 6041 of FIG. 6B) may include a first cover part 99411 and a second cover part 99412. The first cover part 99411 may be vertically aligned with a partial region of a light transmission substrate (for example, the second region 510-12 of the first cover 510-1 of FIG. 5). According to various embodiments of the disclosure, the first cover part 99411 may be designed to have a light transmission ratio of about 50% or more, or a light reflection ratio of about 10% or less.

According to an embodiment of the disclosure, the first cover part 99411 may be designed to have a function of allowing light outputted from a light source 9943 (for example, 6043 of FIG. 6B) to pass substantially through a specific region (for example, the second region 510-12 of FIG. 5) of the light transmission substrate, and to be discharged to the outside (for example, a function of enhancing directivity, or guiding or changing a light direction). According to an embodiment of the disclosure, the first cover part 99411 may include a lens, or may be designed to be formed of various materials or in various forms having the similar or same function to or as that of the lens.

According to various embodiments of the disclosure, the electronic device 900 may include a lens (or lens module) (not shown) of various forms disposed to be at least vertically aligned with the light source 9943. The lens may be disposed between the partial region of the light transmission substrate (for example, the second region 510-12 of the first cover 510-1 of FIG. 5) and the light source 9943 (for example, in a side space 9009), and may be vertically aligned with the light source 9943. According to various embodiments of the disclosure, the lens may be designed to be coupled to the light transmission substrate (for example, the first cover 510-1 of FIG. 5), or to be included in the light transmission substrate. The lens may provide a function of allowing light outputted from the light source 9943 to pass substantially through the specific region of the light transmission substrate (for example, the second region 510-12 of FIG. 5), and to be changed to the outside (for example, a function of enhancing directivity, or guiding or changing a light direction).

According to various embodiments of the disclosure, the light source 9943 may be designed to output light of a broad wavelength band (or a plurality of wavelength bands). According to various embodiments of the disclosure, when the electronic device is designed to output light of at least one wavelength band from the light emitting unit 994, the first cover part 99411 may include a filter to allow the light of the at least one wavelength to selectively pass therethrough.

According to various embodiments of the disclosure, the first cover part 99411 of the light emitting unit cover 9941 may be designed to be substituted with a penetration hole although it is not illustrated. Light outputted from the light source 9943 may pass through the penetration hole of the light emitting unit cover 9941, and may be discharged to the outside of the light sensor 990.

The second cover part 99412 of the light emitting unit cover 9941 may be, for example, a sidewall extending from the first cover part 99411. According to various embodiments of the disclosure, the second cover part 99412 may be designed to include a light blocking material. The second cover part 99412 may prevent light from the light source 9943 from being transmitted to peripheral elements, such as the display 930, or the like.

According to an embodiment of the disclosure, the light receiving unit 993 (for example, 603 of FIG. 6A) may include a light receiving sensor 9933 (or a light detector) (for example, a photo diode) (for example, 6033 of FIG. 6B), and a first mold compound 9931 (hereinafter, a light receiving unit cover) (for example, 6031 of FIG. 6B). The light receiving sensor 9933 may be mounted on the light sensor substrate 991 by soldering. The light receiving unit cover 9931 may include a penetration hole 9932 (for example,

6032 of FIG. 6B) vertically aligned with the light receiving sensor 9933. External light may pass through the display 930 and the penetration hole 9932 of the light receiving unit cover 9931, and may enter the light receiving sensor 9933. According to various embodiments of the disclosure, the penetration hole 9932 may be substituted with a light transmission region, and the light transmission region may be designed to have a light transmission ratio of about 50% or more or a light reflection ratio of about 10% or less. According to various embodiments of the disclosure, when the penetration hole 9932 is substituted with the light transmission region, the light transmission region may be designed to have a function of focusing external light onto the light receiving sensor 9933. For example, the light transmission region may include a lens or may be designed to be formed of various materials or in various forms having the similar or same function to or as that of the lens.

According to various embodiments of the disclosure, a portion 9931a of the light receiving unit cover 9931 (for example, the shielding member 593 of FIG. 5) may be disposed between the light receiving sensor 9933 and the light emitting unit 994, and may prevent light outputted from the light source 9943 of the light emitting unit 994 from entering the light receiving sensor 9933.

According to various embodiments of the disclosure, a portion 910-4a (for example, the shielding member 593 of FIG. 5) of the mid-plate 910-4 may be disposed between the light receiving unit 993 and the light emitting unit 994, and may prevent light outputted from the light source 9943 of the light emitting unit 994 from entering the light receiving unit 993.

According to an embodiment of the disclosure, the light receiving unit 993 may be designed to selectively receive light of at least one wavelength band. According to an embodiment of the disclosure, the light receiving unit 993 may include a filter 9934 disposed between the light receiving sensor 9933 and the penetration hole 9932. The filter 9934 may selectively allow light of at least one wavelength band from light of a plurality of wavelength bands passing through the penetration hole 9932 of the light receiving unit cover 9931 to pass therethrough. According to various embodiments of the disclosure, the light receiving sensor 9933 may be designed to include the filter 9934 or to have the function of the filter 9934.

According to an embodiment of the disclosure, when viewed from a second direction 90021, the penetration hole 9932 of the light receiving unit cover 993 may be circular. According to various embodiments of the disclosure, the penetration hole 9932 of the light receiving unit cover 993 may be designed to have various other shapes (for example, a rectangular shape, or the like) although it is not illustrated. The penetration hole 9932 of the light receiving unit cover 993 may be designed to have various widths 99321 according to the range of the light receiving sensor 9933 of receiving light.

According to various embodiments of the disclosure, the light sensor substrate 991 may include wires (not shown) or other electronic components related to the light receiving unit 993 and the light emitting unit 994. The light receiving unit 993 and the light emitting unit 994 may be disposed adjacent to each other (for example, within about 20 mm), and the light sensor substrate 991 may be designed to have a size enough to allow arrangement of the light receiving unit 993 and the light emitting unit 994. For example, the light sensor substrate 991 (for example, 601 of FIG. 6A) may have a rectangular shape, and the light receiving unit 992 and the light emitting unit 994 may be arranged along the longer side of the light sensor substrate 991.

According to an embodiment of the disclosure, the light sensor 990 may be coupled to the mid-plate 910-4. According to an embodiment of the disclosure, the mid-plate 910-4 may include a first penetration hole 910-43. The light receiving unit 993 of the light sensor 990 may be disposed in the first penetration hole 910-43 (for example, press-fitting), and may be disposed adjacent to (for example, about 5 mm or less) the rear surface 9302 of the display 930. External light may pass through the display 930 and the first penetration hole 9932 of the light receiving unit cover 9931 and may enter the light receiving sensor 9933. The mid-plate 910-4 may include a second penetration hole 910-44. According to various embodiments of the disclosure, the second penetration hole 910-44 may be a recess which is dented toward a fourth direction 90041 (for example, the opposite direction of the third direction 90031). The light emitting unit 994 of the light sensor 990 may be disposed in the second penetration hole 91044 (for example, press-fitting), and may be displayed under or below the side space 9009 (for example, 5009 of FIG. 5) between the side surface 9303 of the display 930 and the bezel 910-3.

According to an embodiment of the disclosure, light (for example, light of various wavelength bands, such as ultra-violet rays, visible rays, or infrared rays) outputted from the light emitting unit 994 may pass through the side space 9009 and a portion of the housing disposed over the side space 9009 (for example, the second region 510-12 of FIG. 5), and may be discharged to the outside. Light scattered or reflected from an object positioned outside the electronic device 900 may pass through a portion of the housing (for example, the first region 510-11 of FIG. 5), the display 930, or the like, and may enter the light receiving unit 993. The light receiving sensor 9933 may generate an electric signal (or a digital value) based on the received light.

On the assumption of an example in which the light emitting unit is disposed under or below the display 930 although it is not illustrated, at least a portion of the light outputted from the light emitting unit may pass through the display 930 and may be discharged to the outside. The display 930 may be electrically influenced by the light (or light energy) outputted from the light emitting unit. For example, a semiconductor layer (not shown) included in the display 930 may be excited by the light outputted from the light emitting unit (or electronic excitation), and thus an electric current may be leaked to at least a portion of a switch (not shown). To this end, light may be generated (for example, malfunction of the display (spot)). According to an embodiment of the disclosure, the light emitting unit 994 may be disposed in the side space 9009 or under or below the side space 9009. This can reduce the light outputted from the light emitting unit 994 to enter the display 930, and can reduce an influence of the light outputted from the light emitting unit 994 on the display 930, or can prevent malfunction (for example, spot) of the display 930 attributable to the light outputted from the light emitting unit 994.

According to various embodiments of the disclosure, the electronic device 900 may further include a light blocking element to prevent light outputted from the light emitting unit 994 from entering at least a portion of the display 930. According to an embodiment of the disclosure, the light blocking element may include a light blocking material 981 covering at least a portion of the side surface 9303 of the display 930. The light blocking material 981 may reduce the light outputted from the light emitting unit 994 to enter the display 930 through the side surface 9303 of the display 930, or may prevent the light from entering the display 930. This can reduce an electric influence of the light outputted from the light emitting unit 994 on the display 930.

According to various embodiments of the disclosure, a part of the mid-plate 910-4 may be extended into the side space 9009. According to various embodiments of the disclosure, the portion 910-4a of the mid-plate 910-4 may substitute the light blocking material 981.

On the assumption of the example in which the light emitting unit is designed to be disposed under or below the display 930 although it is not illustrated, at least a portion of the light outputted from the light emitting unit may pass through the display 930 and may be discharged to the outside. When a light transmission ratio of the display 930 is low (for example, about 30% or less), the light outputted from the light emitting unit may pass through the display 930, but may not be discharged more than a designed amount of light. This may degrade light detection performance of the light sensor. According to an embodiment of the disclosure, the light emitting unit 994 may be disposed in the side space 9009 or under or below the side space 9009. The light outputted from the light emitting unit 994 may pass through a region having a higher light transmission ratio than that of the display 930 (for example, the first cover 510-1 of FIG. 5), and may be discharged to the outside, and thus light detection performance of the light sensor can be guaranteed.

On the assumption of an example in which both the light receiving unit and the light emitting unit are disposed in the side space 9009 or under or below the side space 9009 although it is not illustrated, the side space 9009 should be designed to have a width for the light receiving unit and the light emitting unit. This may make it difficult to extend the display 930 while maintaining the size of the electronic device 900. In an embodiment of the disclosure, the light receiving unit 993 may be disposed under or below the display 930, and the light emitting unit 994 may be disposed in the side space 9009 or under or below the side space 9009, and thus the display 930 can be easily extended while maintaining the size of the electronic device 900.

According to an embodiment of the disclosure, the light sensor 990 may include an extension portion 992 extending from the light sensor substrate 991. One end 9921 of the extension portion 992 may be electrically connected to the light sensor substrate 991, and the other end 9922 of the extension portion 992 may be electrically connected to the PCB 960. According to an embodiment of the disclosure, the other end 9922 of the extension portion 992 may include a first connector (for example, a header connector) 9923, and the PCB 960 may include a second connector (for example, a socket connector) 96021 disposed on a rear surface 9602 of the PCB 960. The first connector 9923 and the second connection 96021 may be coupled to each other to electrically connect the extension portion 992 and the PCB 960. According to an embodiment of the disclosure, the extension portion 992 may be an FPCB.

According to an embodiment of the disclosure, the PCB 960 may be designed to avoid overlapping the penetration holes 910-43, 910-44 of the mid-plate 910-4 or the light sensor substrate 991.

According to various embodiments of the disclosure, the light sensor 990 may be mounted on the PCB 960 although it is not illustrated. For example, the PCB 960 may be formed to have a size to cover the light sensor substrate 991, and the light sensor 990 may be mounted on the PCB 960 although it is not illustrated. According to various embodiments of the disclosure, in the example in which the light sensor 990 is mounted on the PCB 960, the light sensor substrate 991 may be mounted on the PCB 960 by the medium of an additional substrate (hereinafter, an interposer) (not shown) disposed between the light sensor substrate 991 and the PCB 960. The interposer may intermediate for access wiring between the light sensor substrate 991 and the PCB 960. According to various embodiments of the disclosure, the interposer may include various components (for example, passive components) (not shown) related to the light sensor 990. When the light sensor 990 is mounted on the PCB 960, the extension portion 992 of the light sensor 990 may be omitted.

Figure 10:
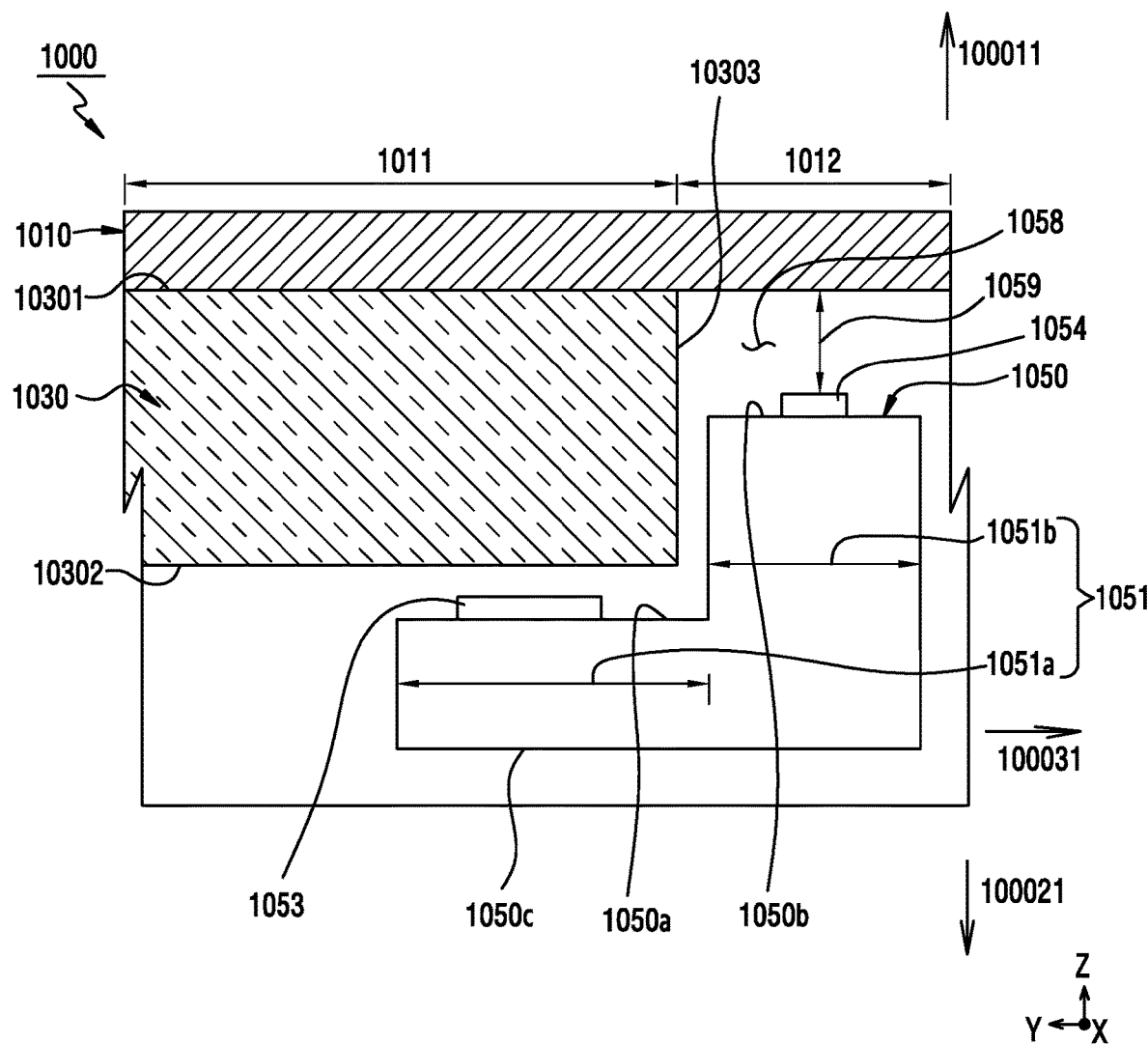
FIG. 10 is a schematic cross-sectional view illustrating an electronic device including a light emitter and a light receiver of at least one light sensor disposed adjacent to a display according an embodiment of the disclosure.

FIG. 10 is a schematic cross-sectional view illustrating an electronic device including a light emitter and a light receiver of at least one light sensor disposed adjacent to a display according to an embodiment of the disclosure.

Referring to FIG. 10, in an embodiment of the disclosure, an electronic device 1000 may include at least a portion of the electronic device 101 of FIG. 1, the first external electronic device 102 of FIG. 2, the electronic device 400 of FIG. 4A, or the electronic device 500 of FIG. 5.

According to an embodiment of the disclosure, the electronic device 1000 may include a plate 1010, a display 1030, and a light sensor 1050.

According to an embodiment of the disclosure, the plate 1010 may be similar to or the same as the first cover 510-1 of FIG. 5. For example, the plate 1010 may include a first region 1011 (for example, the first region 510-11 of FIG. 5) covering the display 1030, and a second region 1012 (for example, the second region 510-12 of FIG. 5) disposed on the periphery of the first region 1011. Light outputted from the display 1030 may be discharged to the outside through the first region 1011.

According to various embodiments of the disclosure, the display 1030 may be similar to or the same as the display 530 of FIG. 5. For example, the display 1030 may include a first surface 10301 (for example, the display first surface 5301 of FIG. 5) facing toward a first direction 100011 (for example, the first direction 50011 of FIG. 5), a second surface 10302 (for example, the display second surface 5302 of FIG. 5) facing toward a second direction 100021 (for example, the second direction 50021 of FIG. 5) opposite the first direction 100011, and a third surface 10303 (for example, the display third surface 5303 of FIG. 5) facing toward a third direction 100301 (for example, the third direction 50031 of FIG. 5) perpendicular to the first direction 100011. According to an embodiment of the disclosure, the display 1030 may have a light transmission property.

According to an embodiment of the disclosure, the light sensor 1050 may include a printed circuit board 1051, a light receiver 1053, and a light emitter 1054 which are mounted on the printed circuit board 1051.

According to an embodiment of the disclosure, the printed circuit board 1051 may include a first portion 1051a of a first thickness, and a second portion 1051b of a second thickness which is larger than the first thickness. When the light sensor 1050 is mounted in the electronic device 1000, the first portion 1051a may be disposed under or below the display 1030, and the second portion 1051b may be disposed under or below the second region 1012 of the plate 1010. A portion of the second portion 1051b that protrudes with respect to the first portion 1051a may be disposed in a side space 1058 of the third surface 10303. According to an embodiment of the disclosure, the second region 1012 of the plate 1010 may be formed to have a width of about 1 mm or less in the third direction 100031. According to an embodiment of the disclosure, the second portion 1051b of the printed circuit board 1051 may be formed to have a width of about 1 mm or less in the third direction 100031.

According to an embodiment of the disclosure, the printed circuit board 1051 may include fourth surfaces 1050a, 1050b facing toward the first direction 100011, and a fifth surface 1050c facing toward the second direction 100021. According to an embodiment of the disclosure, the fourth surfaces 1050a, 1050b may include a sixth surface 1050a on which the light receiver 1053 (for example, a light receiving element, such as a photo diode) is disposed, and a seventh surface 1050b on which the light emitter 1054 (for example, a light emitting element, such as an LED) is disposed, and the seventh surface 1050b may be disposed further apart from the fifth surface 1050c than the sixth surface 1050a. The sixth surface 1050a may face the display 1030, and the seventh surface 1050b may face the second region 1012 of the plate 1010. The structure in which the seventh surface 1050b is disposed further apart from the fifth surface 1050c than the sixth surface 1050a may reduce a gap or distance 1059 between the second region 1012 of the plate 1010 and the light emitter 1054. This structure may reduce thickness of an air layer through which light outputted from the light emitter 1054 reaches the second region 1012 of the plate 1010, and may reduce diffused reflection or attenuation of light, caused by the air layer, thereby reducing degradation of light detection performance. According to an embodiment of the disclosure, the gap 1059 between the light emitter 1054 and the second region 1012 of the plate 1010 may be about 0.2 mm or less. According to various embodiments of the disclosure, the gap 1059 between the seventh surface 1050b and the second region 1012 of the plate 1010 may be about 0.2 mm or less.

According to an embodiment of the disclosure, although not shown, the printed circuit board 1051 of the light sensor 1050 may be electrically connected with another printed circuit board having a process or the like mounted thereon. For example, the printed circuit board 1051 may be electrically connected with another printed circuit board by the medium of a flexible printed circuit board (FPCB). In another example, the printed circuit board 1051 may be disposed to at least overlap another printed circuit board, and one or more terminals formed on the fifth surface 1050c of the printed circuit board 1051 may be electrically connected with one or more terminals formed on another printed circuit board by the medium of conductive materials, such as a solder.

According to various embodiments of the disclosure, the electronic device 1000 may further include a light blocking element to prevent light outputted from the light emitter 1054 from entering at least a portion of the display 1030. For example, the electronic device 1000 may include a light blocking material (for example, the light blocking material 981 of FIG. 9) covering at least a portion of the side surface, i.e., the third surface 10303, of the display 1030.

According to an embodiment of the disclosure, the printed circuit board 1051 may be a multiple printed circuit board which has a plurality of inner layers (or inner layer substrates) having circuits formed thereon by using copper clad laminates (CCLs), and has the plurality of inner layers stacked one on another. For example, although not shown, the printed circuit board 1051 include a structure including inner layers having circuits formed thereon by using CCLs, a first outer layer (not shown) and a second outer layer (not shown) disposed on both sides of the inner layers and having circuits formed thereon, and prepregs bonding and insulating between the layers, and the circuits between the layers may be electrically connected through a via formed in the printed circuit board 1051.

FIGS. 11A, 11B, 11C, 11D, 12A, 12B, 12C, 12D, 12E, and 12F are cross-sectional views illustrating a manufacturing flow for a printed circuit board of a light sensor according to an embodiment of the disclosure.

Figure 11A:
FIGS. 11A, 11B, 11C, 11D, 12A, 12B, 12C, 12D, 12E, and 12F are cross-sectional views illustrating a manufacturing flow for a printed circuit board of a light sensor according to an embodiment of the disclosure.

Referring to FIG. 11A, in an embodiment of the disclosure, a CCL 1110 may be formed. The CCL 1110 is a laminate that is used for a printed circuit, and may include a structure in which copper foils 1112, 1113 are attached to both side surfaces of an insulation layer (or an insulation plate) 1111 formed by various insulating base materials (for example, a resin) and a bonding agent.

The copper foils 1112, 1113 may be electrolytic copper foils formed by chemical-electrical decomposition reaction. According to an embodiment of the disclosure, to enhance adhesion with the resin of the insulation layer 1111, the copper foils 1112, 1113 may be formed to chemically react with the resin and to dig into a portion (about 5 μm (micrometer) of the resin. Thickness of the electrolytic copper foil may be about 18 to 70 μm, but the cooper foils 1112, 1113 may be formed variously, for example, may be formed to have thinner thickness, such as 5 μm, 7 μm, 15 μm according to a wiring density or miniaturization. According to an embodiment of the disclosure, the copper foils 1112, 1113 may be rolled copper foils which are formed thin by rolling copper. The copper foils 1112, 1113 may have various thicknesses according to a current allowed for a pattern.

The insulation layer 1111 of the CCL 1110 may include a resin, such as phenol or epoxy. The CCL 1110 may further include a reinforcing base material (not shown), such as paper, glass fiber, glass non-woven fabric, or the like. The reinforcing base material may increase rigidity (for example, rigidity in perpendicular and horizontal directions) of the insulation layer 1111 that is not satisfied only by the resin, or may reduce a dimension change rate of the insulation layer to temperature.

The CCL 1110 may be, for example, a glass-epoxy CCL including a base material having glass fiber impregnated (or permeated) with an epoxy resin, and copper foils 1112, 1113 bonded to the base material. According to an embodiment of the disclosure, the national electrical manufacturers association (NEMA) classifies the CCL into flame retardant (FR)-1, FR-2, FR-3, FR-4, FR-5, or FR-6 based on a base material and a flame resistance (flammability), and the glass-epoxy CCL may be one of FR-4 and FR-5. According to an embodiment of the disclosure, FR-4 or FR-5 may include a base material in which woven glass fiber impregnated with an epoxy resin is multi-layered, and copper foils bonded to the base material.

The CCL 1110 may be a paper-phenol CCL including a base material having paper impregnated with a phenol resin and copper foils 1112, 1113 coupled thereto. According to an embodiment of the disclosure, the paper-phenol CCL may be one of FR-1, FR-2, or FR-3 classified by the NEMA.

The CCL 1110 may be, for example, a complex CCL formed by a complex of two or more types of reinforcing materials. According to an embodiment of the disclosure, the complex CCL may include composite type of laminate material bonded with a flame retardant epoxy resin (CEM)-1 or CEM-3 defined by the NEMA. The CEM-1 includes a core base material (or core) having paper impregnated with an epoxy resin, an outer base material having woven glass fiber impregnated with an epoxy resin, and a copper foil bonded to the outer base material. The CEM-3 may include a core base material having non-woven glass fiber (for example, glass non-woven fabric) impregnated with an epoxy resin, an outer base material having woven glass fiber impregnated with an epoxy resin, and a copper foil bonded to the outer base material. The glass fiber or paper may enhance mechanical machinability, heat resistance, or dimension stability. According to an embodiment of the disclosure, the CCL may be FR-6 including a core base material having non-woven glass fiber (for example, glass non-woven fabric) impregnated with a polyester resin, an outer baser material having glass fiber impregnated with a resin, and a copper foil bonded to the outer base material.

According to various embodiments of the disclosure, the CCL 1110 may be a CCL for a high frequency that is made of a material corresponding to high-speed signal transmission. For example, a propagation speed of a signal in a printed circuit board is in inverse proportion to permittivity of a material. Therefore, the propagation speed of the signal may be increased by using a material having low permittivity.

According to an embodiment of the disclosure, the CCL 1110 may be formed by placing a film prepreg of an insulation material on a plate formed of metal, such as aluminum or iron, and then bonding a copper foil to the film prepreg.

According to an embodiment of the disclosure, the CCL 1110 may include a flexible CCL for an FPCB. The flexible CCL may have a polyester film or a polyimide film having flexibility and bonded with a copper foil by an adhesive.

According to various embodiments of the disclosure, the CCL 1110 may be formed of a structure including an insulation layer 1111 of various other materials or structures.

A printed circuit board (for example, the printed circuit board 1051 of FIG. 10) of a light sensor (for example, the light sensor 1050 of FIG. 10) may be formed by forming a plurality of plates (hereinafter, inner layers or inner layer substrates), each having circuits formed thereon by processing the CCL 1110, and stacking the plurality of inner layers one on another. The printed circuit board (for example, the printed circuit board 1051 of FIG. 10) of the light sensor may be formed by a series of flows including, for example, an inner layer circuit printing process, an inner layer etching and resist peeling process, a laying-up process, a stacking process, a hole processing process, a plating process, an outer layer circuit printing process, an outer layer etching and resist peeling process, a solder mask printing process, and an exterior processing process.

Figure 11B:
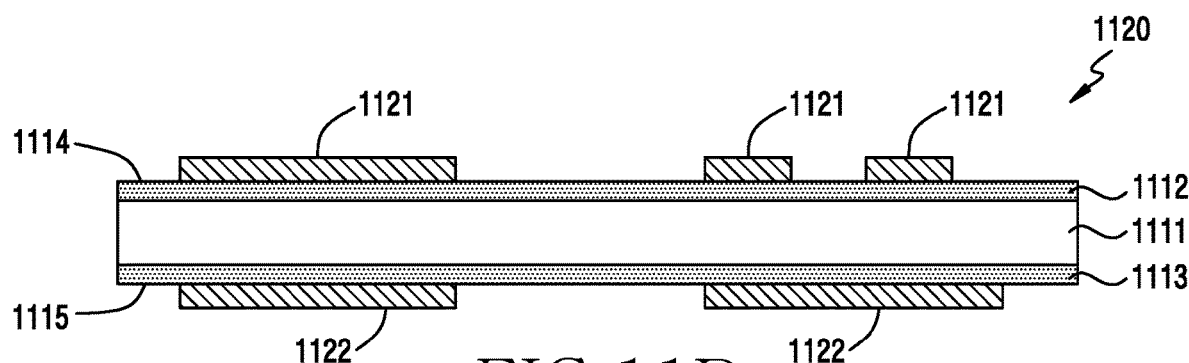

Referring to FIGS. 11A and 11B, a structure 1120 having circuit patterns 1121, 1122 printed on surfaces 1114, 1115 of the CCL 1110 for an inner layer may be formed by the inner layer circuit printing according to an embodiment. According to an embodiment of the disclosure, the circuit patterns 1121, 1122 (for example, left portions on a dry film) may be printed on the surfaces 1114, 1115 by a method (for example, a photoprint method) of coating the surfaces 1114, 1115 of the CCL 1110 for the inner layer with a dry film having photosensitivity with heat and pressure, projecting light by using a master film having a pattern, and then developing. According to another embodiment of the disclosure, the circuit patterns corresponding to circuits may be printed on the surfaces 1114, 1115 through a method (for example, a screen printing method) of using a silk screen having a circuit pattern, instead of the dry film.

Figure 11C:
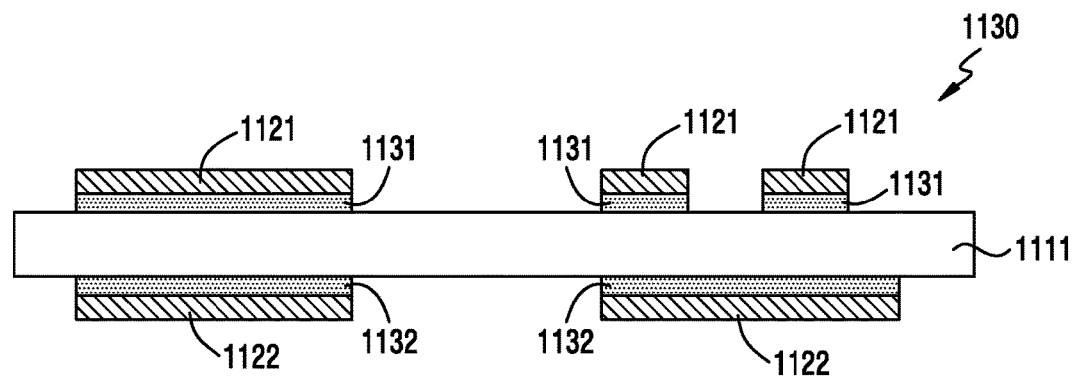

Referring to FIGS. 11B and 11C, a structure 1130 may be formed by leaving portions 1131, 1132 of the copper foils 1112, 1113 corresponding to the printed circuit patterns 1121, 1122, and removing the other portions by using a caustic material, through the inner layer etching process according to an embodiment. The portions 1131, 1132 that are covered by the circuit patterns 1121, 1122 and are left without being corroded may be defined as circuits.

Figure 11D:
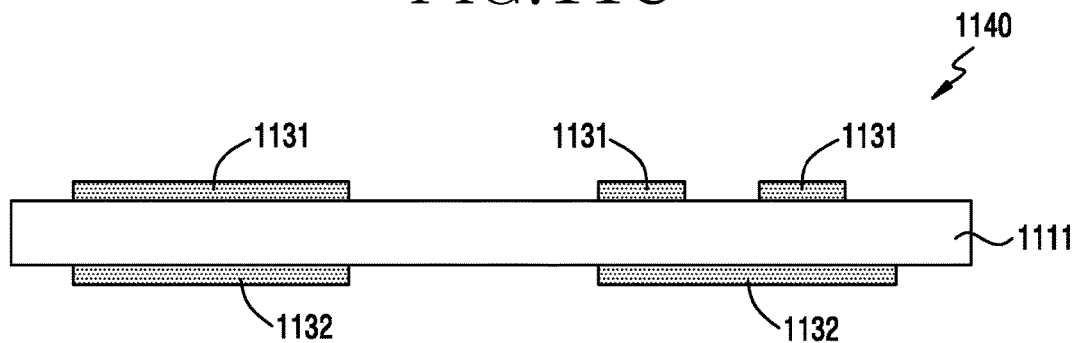

Referring to FIGS. 11C and 11D, an inner layer 1140 having the circuits 1131, 1132 bonded to the insulation layer 111 may be formed by removing the circuit patterns (or etching resists) 1121, 1122 through the resist peeling process according to an embodiment. The inner layer 1140 may include the first circuit 1131 and the second circuit 1132 disposed on both side surfaces of the insulation layer 1111. Although the first circuit 1131 or the second circuit 1132 are illustrated as a plurality of cross section regions in cross sections, the first circuit 1131 or the second circuit 1132 may be formed as an integrated conductive pattern. According to an embodiment of the disclosure, the first circuit 1131 or the second circuit 1132 may include a plurality of patterns physically separated from one another.

According to an embodiment of the disclosure, an inner layer including a circuit may be formed by processing a CCL of a structure having a copper foil attached to one side surface of an insulation layer. The inner layer formed by processing such a CCL may be a structure having a circuit disposed on one side surface thereof.

Figure 12A:
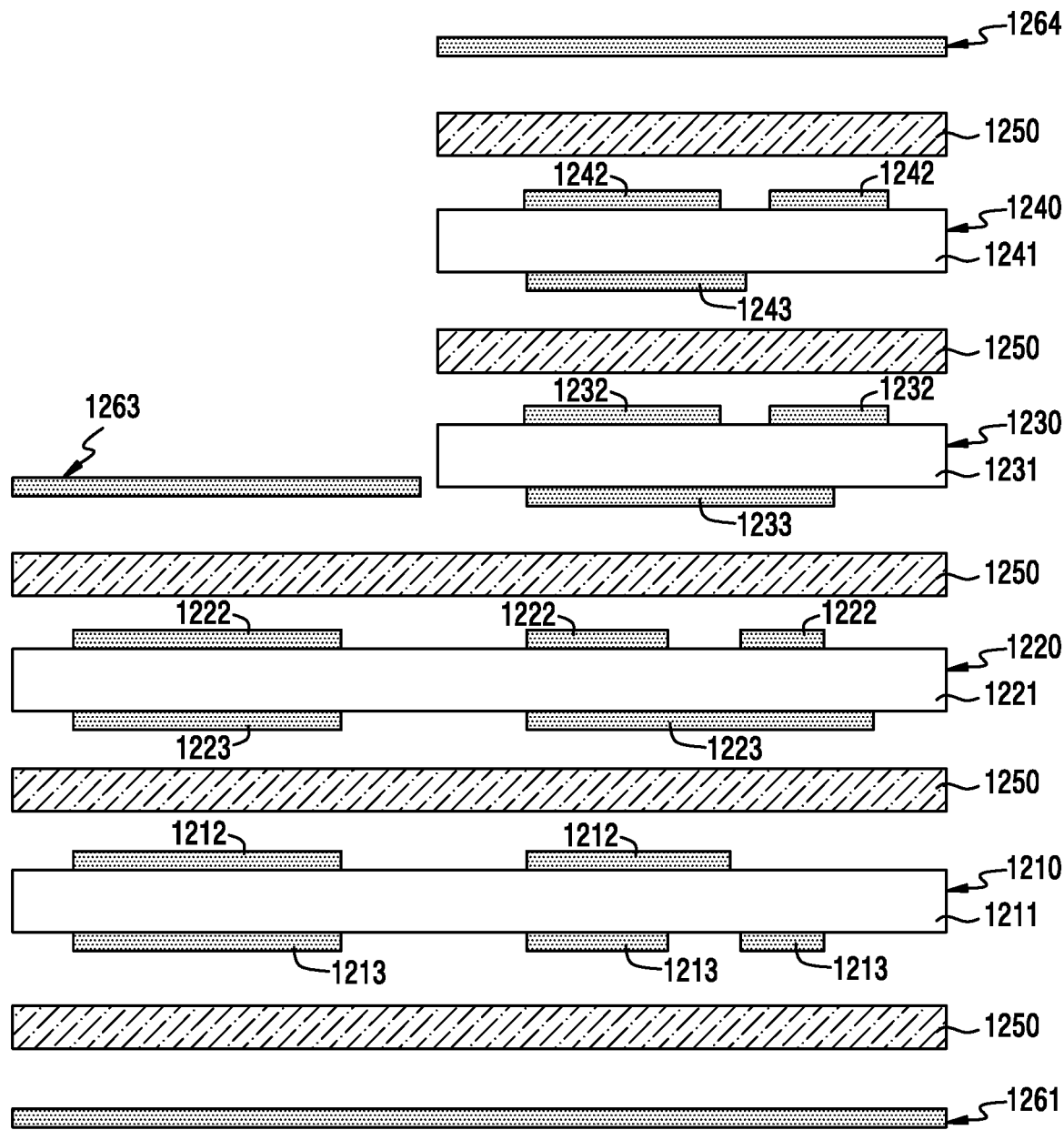
Figure 12B:
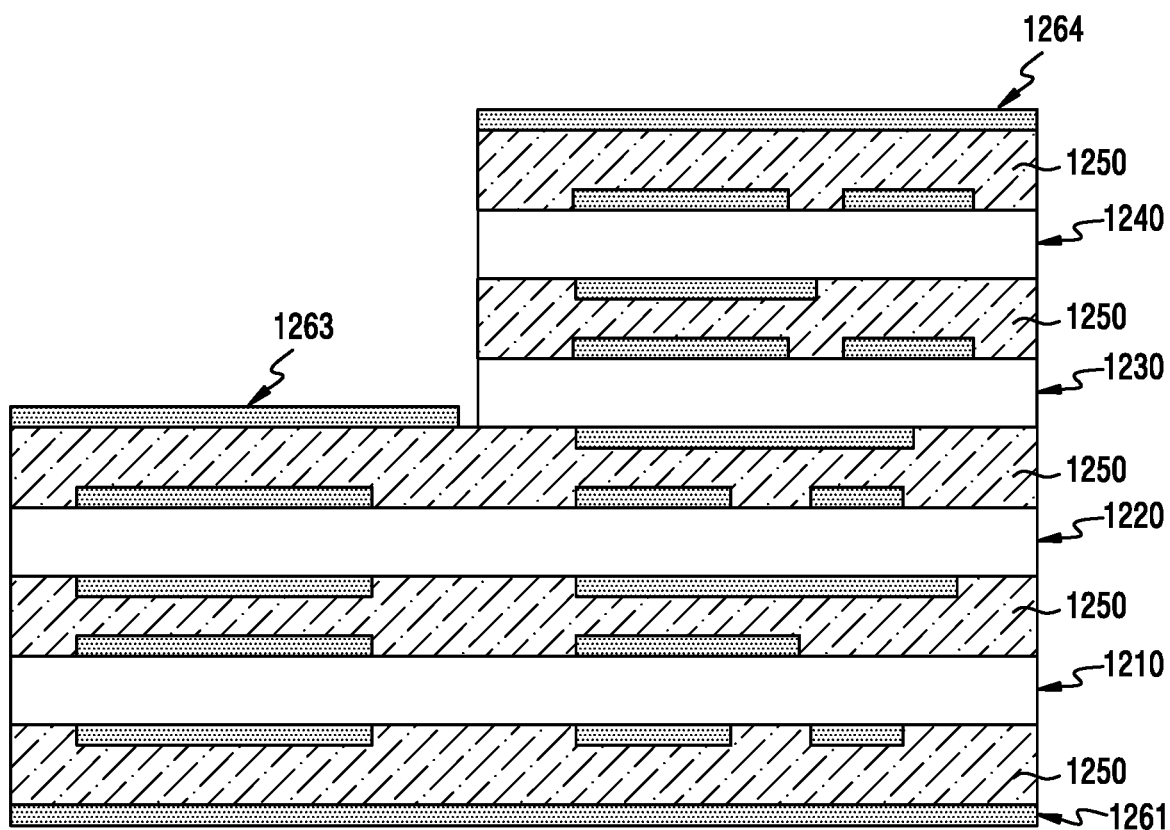

Referring to FIGS. 12A and 12B, inner layers 1210, 1220, 1230, 1240 having circuits formed thereon may be arranged between a first outer layer 1261 and a second outer layer 1263, 1264 which are formed of copper foils in sequence according to a designed layered structure for each layer, through the laying-up process according to an embodiment. According to an embodiment of the disclosure, the second outer layer 1263, 1264 may include a third outer layer 1263 aligned with a portion of the first outer layer 1261, and a fourth outer layer 1264 aligned with the other portion of the first outer layer 1261. For example, the first inner layer 1210 and the second inner layer 1220 may be formed to have a width corresponding to the first outer layer 1261, and the third inner layer 1230 and the fourth inner layer 1240 may be arranged between the second inner layer 1220 and the fourth outer layer 1264, and may be formed to have a width corresponding to the fourth outer layer 1264. The inner layers 1210, 1220, 1230, 1240 have structures in which circuits 1212, 1213, 1222, 1223, 1232, 1233, 1242, 1243 are bonded to insulation layers 1211, 1221, 1231, 1241, and may be formed by processing CCLs according to the manufacturing flow described above with reference to FIGS. 11A, 11B, 11C, and 11D. When the layers 1210, 1220, 1230, 1240, 1261, 1263, 1264 are arranged, the circuits (or wires) 1212, 1213, 1222, 1223, 1232, 1233, 1242, 1243 disposed on the inner layers 1210, 1220, 1230, 1240 may be aligned on designed locations. A first structure 1201 having the layers 1210, 1220, 1230, 1240, 1250, 1261, 1263, 1264 bonded to one another may be formed by arranging prepregs 1250 having adhering and insulating functions between the layers (for example, the first outer layer 1261, the second outer layer 1263, 1264, and the inner layers 1210, 1220, 1230, 1240), and then applying high heat and pressure, through the stacking process. The prepregs 1250 may be an epoxy resin, or a thermosetting resin including glass impregnated with an epoxy resin. According to various embodiments of the disclosure, the disclosure is not limited to the illustrated example, and the number of inner layers included in the first structure 1201 may vary. Although the circuits are arranged on both side surfaces of the inner layers 1210, 1220, 1230, 1240, at least one of the inner layers 1210, 1220, 1230, 1240 may have circuits arranged on one side surface of the insulating layer.

Figure 12C:
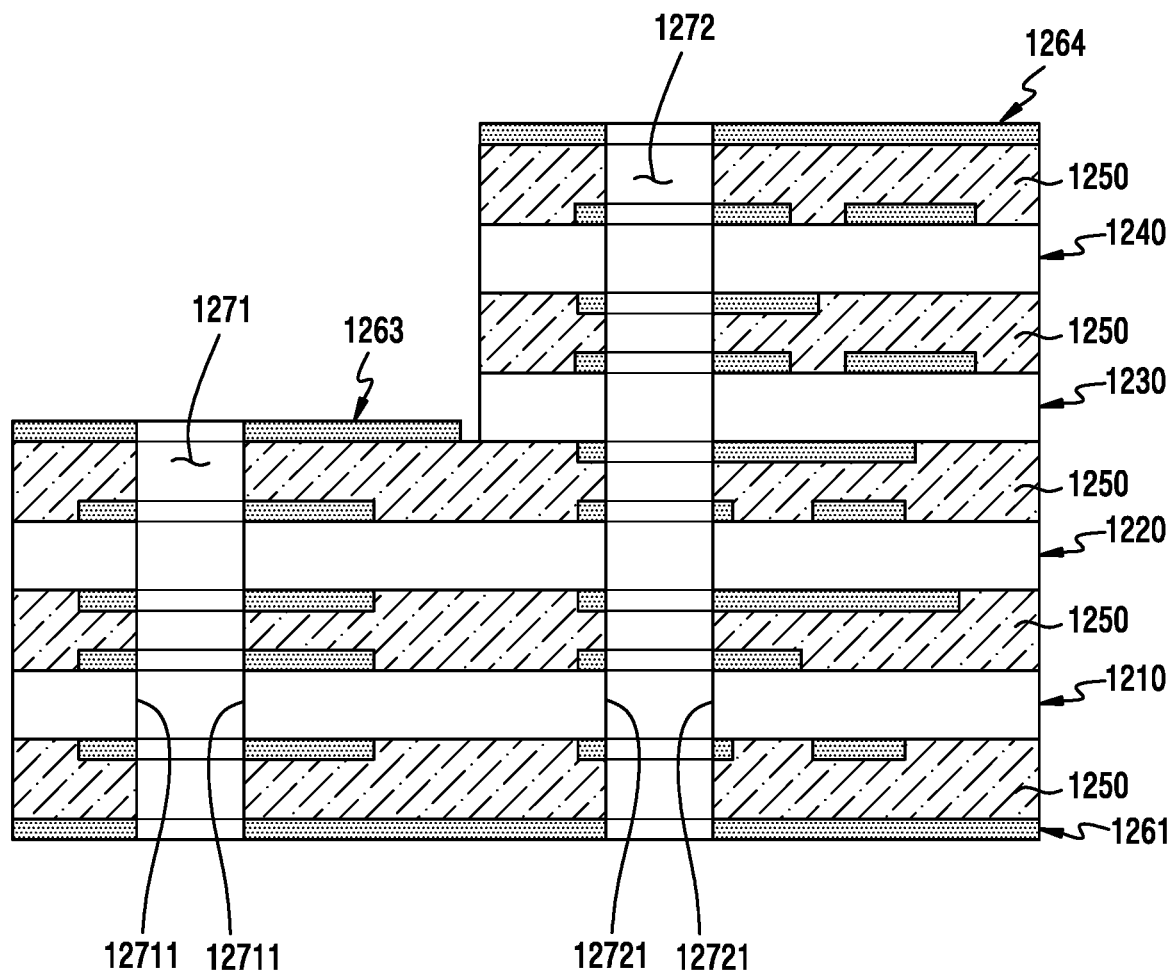

Referring to FIGS. 12B and 12C, in an embodiment of the disclosure, a second structure 1202 including a through-hole (or vias 1271, 1272) may be formed by hole-processing the first structure 1201 (for example, drilling). The through-hole may be defined as a hole drilled in a substrate (for example, the first structure 1201) formed of outer layers (for example, the layers 1261, 1263, 1264), prepregs (for example, the prepregs 1250), and inner layers (for example, the layers 1210, 1220, 1230, 1240), for the purpose of arranging a connection leading wire to electrically connect conductor layers arranged on different layers. According to an embodiment of the disclosure, the through-holes 1271, 1272 may include a hole 1271 penetrating between the first outer layer 1261 and the third outer layer 1263, and a hole 1272 penetrating between the first outer layer 1261 and the fourth outer layer 1264. The conductor layers (for example, the first outer layer 1261 and the second outer layer 1263, 1264, and one or more circuits included in the inner layers arranged therebetween) through which the through-hole penetrates may vary according to a location of the through-hole and a layered structure corresponding to the location.

Figure 12D:
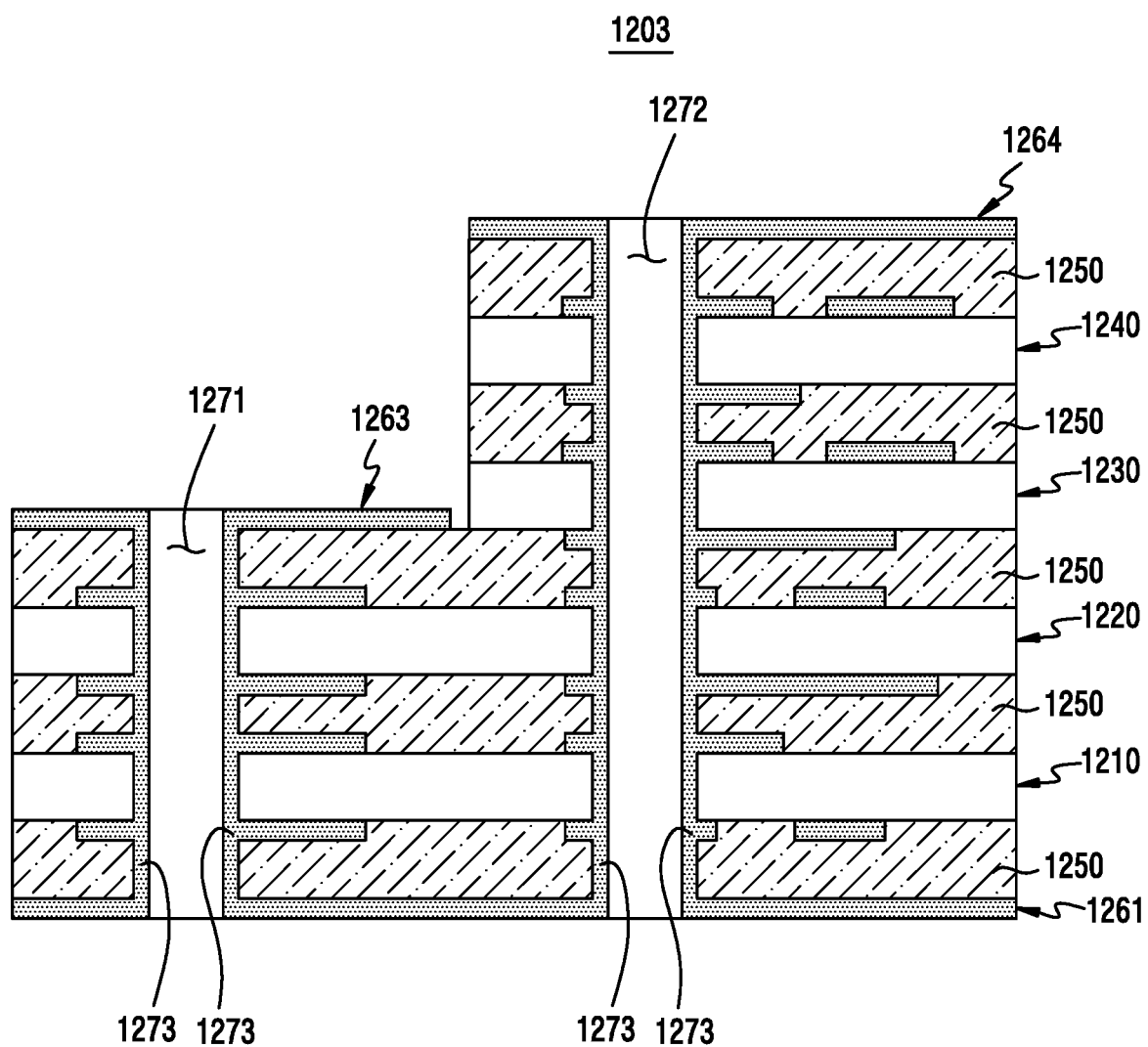

Referring to FIGS. 12C and 12D, in an embodiment of the disclosure, a third structure 1203 having the through-holes 1271, 1272 coated with a conductive material 1273, such as copper may be formed by plating the second structure 1202. Since surfaces 12711, 12721 of the through-holes 1271, 1272 do not have an electrical property, a first plating process may be performed by electroless copper (cu) plating which does not require electricity by a chemical agent, and then a second plating process may be performed thereon by electro copper plating. The plated conductive material 1273 may electrically connect between conductive portions (for example, the first outer layer 1261, the second outer layer 1263, 1264, or the circuits of the inner layers 1210, 1220, 1230, 1240), which are split into layers. According to an embodiment of the disclosure, a hole may be formed by digging in part in a direction from the first outer layer 1261 to the second outer layer 1263 or 1264, or a hole may be formed by digging in part in a direction from the second outer layer 1263 or 1264 to the first outer layer 1261, and the surface of the hole may be plated with a conductive material.

Figure 12E:
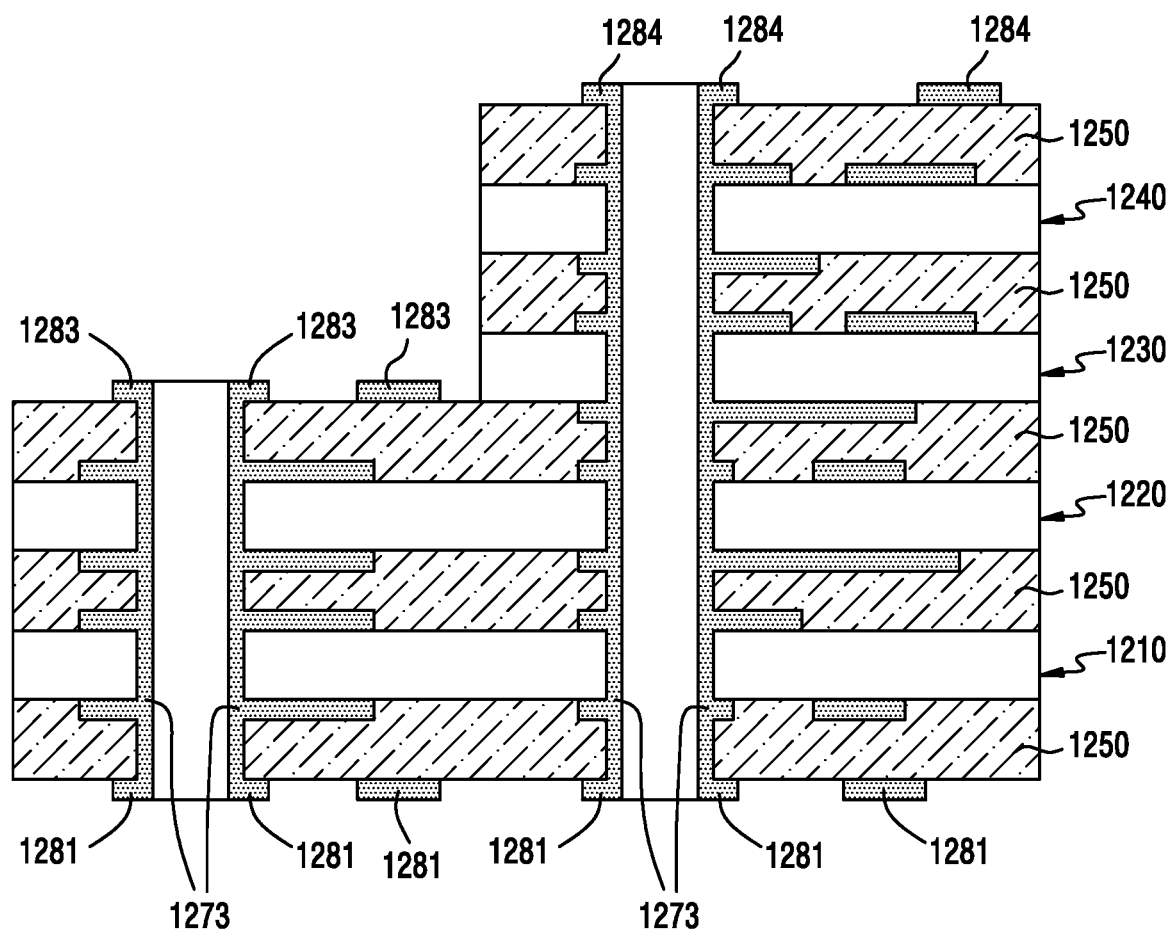

Referring to FIGS. 12D and 12E, in an embodiment of the disclosure, an outer layer circuit printing may be performed to print circuit patterns on the surfaces of the first outer layer 1261 and the second outer layer 1263, 1264 of the third structure 1203 by applying the same method as the inner layer circuit printing process, and an outer layer etching and resist peeling process may be performed to remove a portion of the first outer layer 1261 and to remove a portion of the second outer layer 1263, 1264 by applying the same method as the inner layer etching and resist peeling process. In a fourth structure 1204 formed therethrough, a first outer layer circuit 1281 may be left by removing a portion from the first outer layer 1261, and a second outer layer circuit 1283, 1284 may be left by removing a portion from the second outer layer 1263, 1264. The second outer layer circuit 1283, 1284 may include a third outer layer circuit 1283 left on the third outer layer 1263, and a fourth outer layer circuit 1284 left on the fourth outer layer 1264. The conductor layers (for example, one or more circuits included in the inner layers) having circuits of the first outer layer 1261 and/or circuits of the second outer layer 1263, 1264 electrically connected with one another by the medium of the conductive material 1273 may vary according to a location of the through-hole or a layered structure corresponding to the location.

Figure 12F:
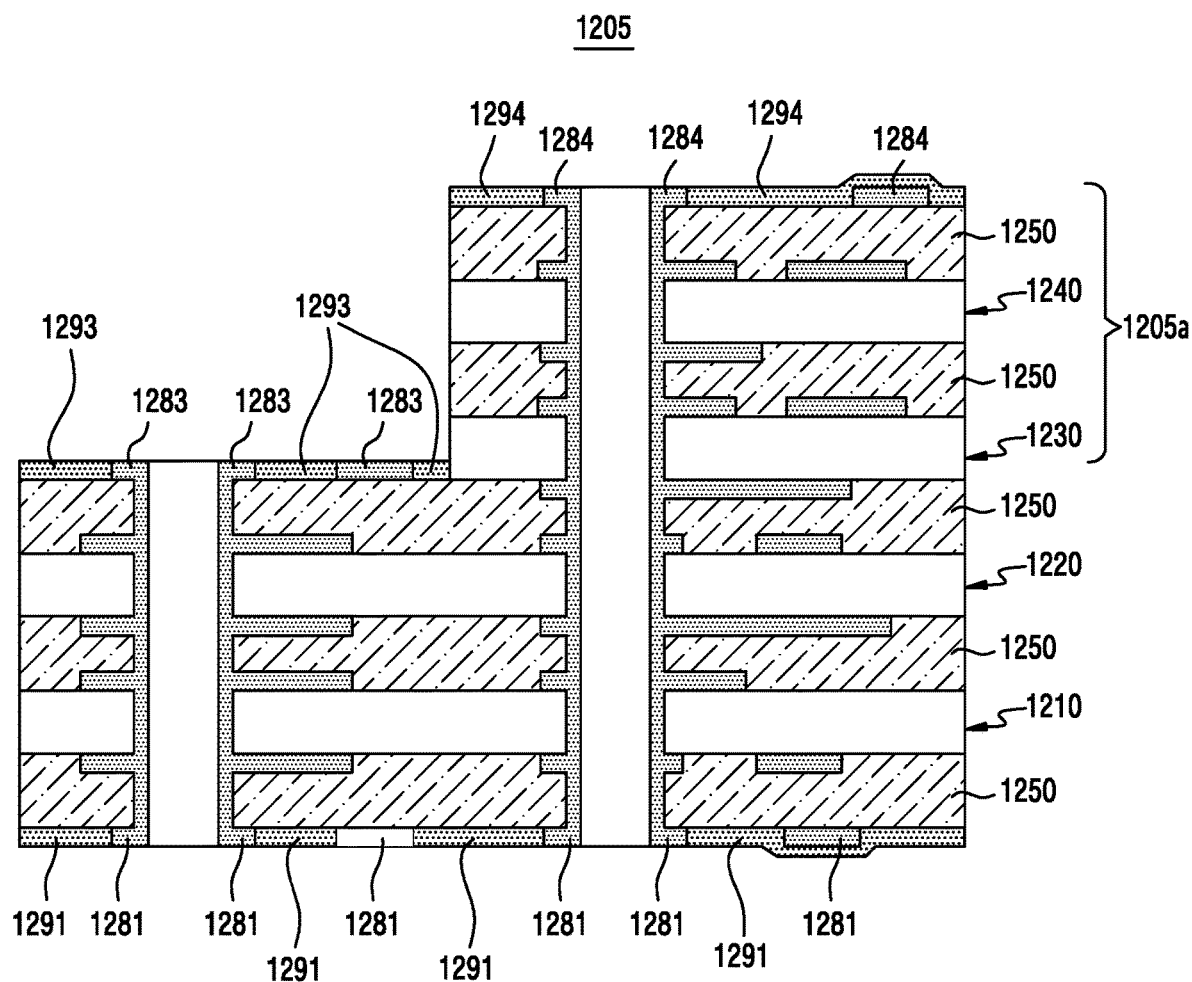

Referring to FIGS. 12E and 12F, in an embodiment of the disclosure, a fifth structure 1205 may be formed by printing a solder mask on the fourth structure 1204, and coating at least a portion of the first outer layer circuit 1281 or at least a portion of the second outer layer circuit 1283, 1284 with insulation materials 1291, 1293, 1294, such as solder mask insulation ink having an epoxy component. Portions of the outer layer circuits 1281, 1283, 1284 that are covered with the insulation materials 1291, 1293, 1294 are not exposed to the outside, and thus are prevented from being oxidized. The insulation materials 1291, 1293, and 1294 may play the role of preventing a bridge of solder from being generated when components are mounted. According to an embodiment of the disclosure, the solder mask printing process may be performed by uniformly coating a corresponding surface with photosensitive ink (for example, photo S/R) according to a silk screen printing method or a spray coating method, removing an unnecessary portion by scanning and developing, and then curing the left portion. According to an embodiment of the disclosure, the solder mask printing process may be performed by directly coating the corresponding region with thermosetting ink according to the silk screen printing method. Portions (not shown) of the first outer layer circuit 1281 or the second outer layer circuit 1283, 1284 that are exposed to the outside may be utilized as terminal (or pads) for soldering to the other elements. The printed circuit board according to the structure 1205 of FIG. 12F may be designed to have wires of various different forms.

According to an embodiment of the disclosure, although not shown, a light receiver (or a light receiving element) (for example, the light receiver 1053 of FIG. 10) may be electrically connected with at least one terminal formed by the third outer layer circuit 1283 by the medium of conductive materials, such as a solder, and a light emitter (or a light emitting element) (for example, the light emitter 1054 of FIG. 10) may be electrically connected with at least one terminal formed by the fourth outer layer circuit 1284 by the medium of conductive materials, such as a solder. The printed circuit board 1205 of FIG. 12F may have a relatively protruding portion 1205a, and, when a light sensor having the light receiver and the light emitter mounted on the printed circuit board 1205 is installed in an electronic device (for example, the electronic device 1000 of FIG. 10) as does the light sensor 1050, the light emitter may be disposed closer to an exterior plate (for example, the plate 1010 of FIG. 10) due to the protruding portion 1205a.

According to various embodiments of the disclosure, an FPCB utilized to electrically connect to another printed circuit board may be electrically connected with at least one terminal formed by the third outer layer circuit 1283, or at least one terminal formed by the fourth outer layer circuit 1284.

According to an embodiment of the disclosure, although not shown, at least one terminal formed by the first outer layer circuit 1281 may be utilized to be electrically connected with another printed circuit board by the medium of conductive materials, such as a solder.

According to an embodiment of the disclosure, the printed circuit board formed based on the CCL may be a single-side printed circuit board having circuits formed only one side surface, or may be a double-sided printed circuit board having circuits formed on both side surfaces. The double-sided printed circuit board may include through-holes or vias to connect upper and lower circuits.

For example, the single-side printed circuit board may be formed through a series of flows including a circuit printing process, a copper foil etching process, a resist peeling process, a solder mask printing process, a hole processing process, and an exterior processing process, based on a CCL. Each process has been described in the flow for forming the multiple printed circuit board, and a detailed description thereof is omitted.

For example, the double-sided printed circuit board may be formed through a series of flows including a hole processing process, a plating process, a circuit printing process, a copper foil etching and resist peeling process, a solder mask printing process, and an exterior processing process, based on a CCL. According to an embodiment of the disclosure, the double-sided printed circuit board may be formed through a series of flows including a hole processing process, a plating process, a circuit printing process, a resist peeling process, a copper foil etching process, a solder mask printing process, and an exterior processing process, based on a CCL. Each process has been described in the flow for forming the multiple printed circuit board, and a detailed description thereof is omitted.

Figure 13:
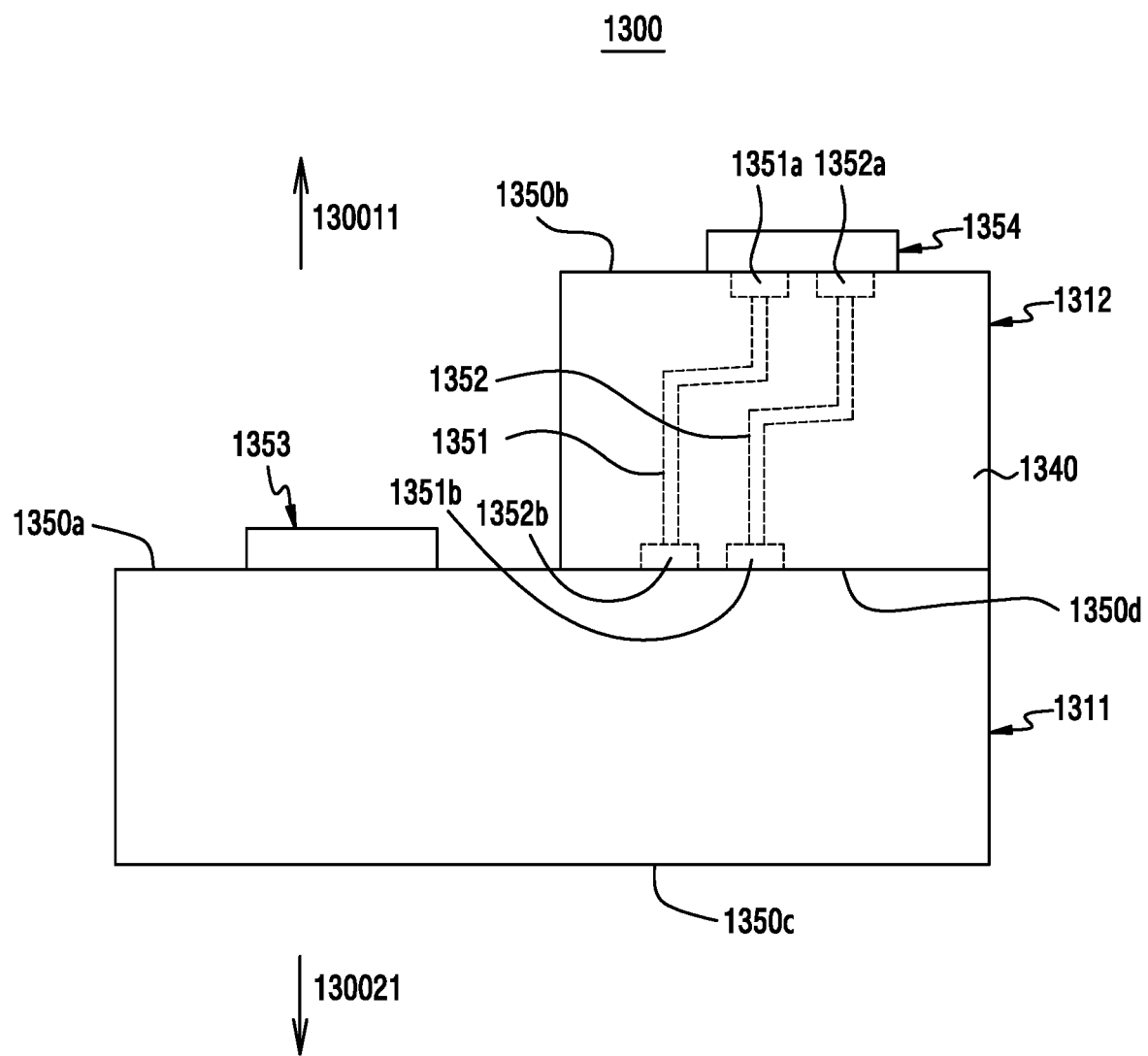
FIG. 13 is a schematic cross-sectional view illustrating a light sensor according to various embodiments of the disclosure.

FIG. 13 is a schematic perspective view illustrating a light sensor according to various embodiments of the disclosure.

Referring to FIG. 13, a light sensor 1300 (for example, the light sensor 1050 of FIG. 10) may include a front surface 1350a, 1350b (for example, the fourth surface 1050a, 1050b of FIG. 10) facing toward a first direction 130011, and a rear surface 1350c (for example, the fifth surface 1050c of FIG. 10) facing toward a second direction 130021 opposite the first direction 130011. According to an embodiment of the disclosure, the front surface 1350a, 1350b may include a first front surface 1350a (for example, the sixth surface 1050a of FIG. 10) on which a light receiver 1353 (for example, the light receiver 1053 of FIG. 10) is disposed, and a second front surface 1350b (for example, the seventh surface 1050b of FIG. 10) on which a light emitter 1354 (for example, the light emitter 1054 of FIG. 10) is disposed, and the second front surface 1350b may be disposed further away from the rear surface 1350c than the first front surface 1350a.

According to an embodiment of the disclosure, the light sensor 1300 may include a first plate 1311 forming the first front surface 1350a and the rear surface 1350c, and a second plate 1312 stacked on the first plate 1311 and forming the second front surface 1350b.

According to an embodiment of the disclosure, the second plate 1312 may include a housing 1340 of an insulation material, including the second front surface 1350b, a second rear surface 1350d facing the second front surface 1350b, and one or more side surfaces surrounding between the second front surface 1350b and the second rear surface 1350d. According to an embodiment of the disclosure, the second plate 1312 may include one or more conductors 1351, 1352 electrically connecting between the second front surface 1350b and the second rear surface 1350d. The one or more conductors 1351, 1352 may be coupled with the housing 1340 to have a portion thereof disposed inside the housing 1340, and may include terminals 1351a, 1352a arranged on the second front surface 1350b and terminals 1351b, 1352b arranged on the second rear surface 1350d. The first plate 1311 formed by a printed circuit board may face the second rear surface 1350d, and may be electrically connected with the terminals 1351b, 1352b arranged on the second rear surface 1350d. The light emitter 1354 (for example, an IR LED) may be electrically connected with the terminals 1351a, 1352a arranged on the second front surface 1350b by the medium of conductive material, such as s solder.

According to various embodiments of the disclosure, the first plate 1311 or the second plate 1312 may further include a metal plate (not shown) disposed on an outer surface thereof or inside. The metal plate may be physically separated from other conductive materials of the light sensor 1300. When a signal is transmitted through a wire of the light sensor 1300, the metal plate may reduce interference of an electromagnetic noise in signal transmission and reception. The metal plate may reduce loss of signals receiving or transmitting via the light sensor 1300. According to various embodiments of the disclosure, at least a part of the metal plate may be disposed in the first plate 1311 or the second plate 1312. According to various embodiments of the disclosure, the metal plate may be defined as electromagnetic shielding elements. According to various embodiments of the disclosure, the metal plate may be physically separated from conductive elements (for example, circuit, such as the one or more conductors 1351, 1352) of the first plate 1311 or the second plate 1312. According to various embodiments of the disclosure, the metal plate may be electrically connected to another PCB where elements, such as a process (for example, the processor 120 of FIG. 1, or 210 of FIG. 2) are mounted. For example, the metal plate may be electrically connected to a ground of the other PCB. According to an embodiment of the disclosure, a part of the metal plate may be utilized as a terminal, and the terminal may be electrically connected to the ground by the medium of conductive material, such as s solder. According to another embodiment of the disclosure, the metal plate may be electrically connected to the other PCB via various conductive member, such as a FPCB, a coaxial cable or the like. According to various embodiments of the disclosure, the light sensor 1300 and the other PCB may be electrically connected via the FPCB, and a part of circuits in the FPCB may be electrically connected to the metal plate.

According to an embodiment of the disclosure, the second plate 1312 may include a printed circuit board including at least one inner layer formed by the manufacturing flow described above with reference to FIGS. 11A, 11B, 11C, and 11D. For example, the first plate 1311 may include a first printed circuit board and the second plate 1312 may include a second printed circuit board, and the first printed circuit board and the second printed circuit board may be electrically connected with each other by the medium of conductive materials, such as a solder.

According to various embodiments of the disclosure, the second plate 1312 may be defined as an interposer.

According to an embodiment of the disclosure, when the light sensor 1300 of FIG. 13 is installed in an electronic device (for example, the electronic device 1000 of FIG. 10), a gap between the light emitter 1354 and an exterior plate (for example, the plate 1010 of FIG. 10) may be reduced due to the relatively protruding second plate 1312.

Figure 14:
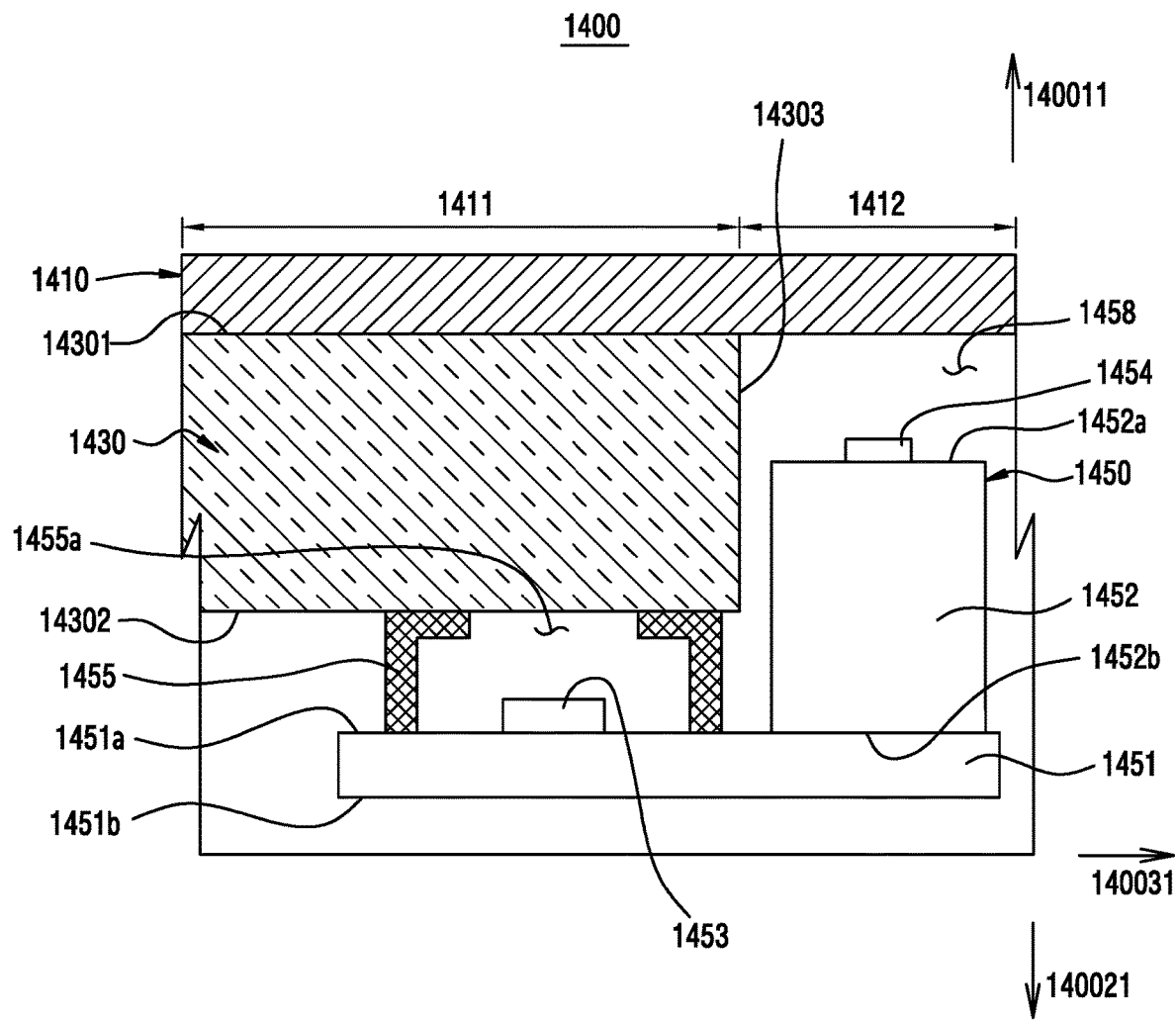
FIG. 14 is a schematic cross-sectional view illustrating an electronic device including at least one light emitter and at least one light receiver disposed adjacent to a display according to an embodiment of the disclosure.

FIG. 14 is a schematic cross-sectional view illustrating an electronic device including at least one light emitter and at least one light receiver disposed adjacent to a display according to an embodiment of the disclosure.

Referring to FIG. 14, in an embodiment of the disclosure, an electronic device 1400 may include at least a portion of the electronic device 101 of FIG. 1, the first external electronic device 102 of FIG. 2, the electronic device 400 of FIG. 4A, or the electronic device 500 of FIG. 5.

According to an embodiment of the disclosure, the electronic device 1400 may include a plate 1410, a display 1430, and a light sensor 1450.

According to an embodiment of the disclosure, the plate 1410 may be similar to or the same as the first cover 510-1 of FIG. 5. For example, the plate 1410 may include a first region 1411 (for example, the first region 510-11 of FIG. 5)

covering the display 1430, and a second region 1412 (for example, the second region 510-12 of FIG. 5) disposed on the periphery of the first region 1411.

According to an embodiment of the disclosure, the display 1430 may be similar to or the same as the display 530 of FIG. 5. For example, the display 1430 may include a first surface 14301 (for example, the display first surface 5301 of FIG. 5) facing toward a first direction 140011 (for example, the first direction 50011 of FIG. 5), a second surface 14302 (for example, the display second surface 5302 of FIG. 5) facing toward a second direction 140021 (for example, the second direction 50021 of FIG. 5) opposite the first direction 140011, and a third surface 14303 (for example, the display third surface 5303 FIG. 5) facing toward a third direction 140031 (for example, the third direction 50031 of FIG. 5) perpendicular to the first direction 140011.

According to an embodiment of the disclosure, the light sensor 1450 may include a printed circuit board 1451, an interpose 1452, a light receiving element 1453, and a light emitting element 1454.

According to an embodiment of the disclosure, the printed circuit board 1451 may include a fourth surface 1451*a* facing toward the first direction 140011 and a fifth surface 1451*b* facing toward the second direction 140021. The light receiving element (or light receiving sensor) 1453 may be mounted on the fourth surface 1451*a*, and may be disposed under or below the display 1430.

According to an embodiment of the disclosure, the light sensor 1450 may include a cover 1455 coupled to the fourth surface 1451*a* of the printed circuit board 1451, and the cover 1455 may be disposed between the printed circuit board 1451 and the display 1430. The cover 1455 may have a space formed therein to accommodate the light receiving element 1453, and may include a penetrating hole 1455*a* vertically aligned with the light receiving element 1453. External light may enter the light receiving element 1453 through the plate 1410, the display 1430, and the penetrating hole 1455*a*. According to an embodiment of the disclosure, the cover 1455 may include a light blocking material.

According to an embodiment of the disclosure, the interposer 1452 is an element for disposing the light emitting element 1454 closer to the plate 1410, and may include a sixth surface 1452*a* facing toward the first direction 140011, and a seventh surface 1452*b* facing toward the second direction 140021 and coupled to the printed circuit board 1451. The interposer 1452 may be inserted into a space 1458 formed under or below the second region 1412 of the plate 1410 and beside the third surface 14303 of the display 1430. The light emitting element 1454 may be mounted on the sixth surface 1452*a* and may be disposed under or below the second region 1412 of the plate 1410.

According to an embodiment of the disclosure, although not shown, the interposer 1452 may include a housing (for example, the housing 1340 of FIG. 13) of an insulation material, and one or more conductors (for example, 1351, 1352) electrically connecting between the sixth surface 1452*a* and the seventh surface 1452*b* of the housing, like the second plate 1312 of FIG. 13.

According to an embodiment of the disclosure, the interposer 1452 may include a printed circuit board including at least one inner layer formed according to the manufacturing flow described above with reference to FIGS. 11A, 11B, 11C, and 11D.

According to various embodiments of the disclosure, the sixth surface 1452*a* of the interposer 1452 on which the light emitting element 1454 is mounted is further away from the fourth surface 1451*a* of the printed circuit board 1451 than the second surface 14302 of the display 1430. However, this should not be considered as limiting.

For example, although not shown, the sixth surface 1452*a* of the interposer 1452 on which the light emitting element 1454 is mounted may be disposed at a distance less spaced from the fourth surface 1451*a* of the printed circuit board 1451, compared to the second surface 14302 of the display 1430. According to an embodiment of the disclosure, a distance between the sixth surface 1452*a* of the interposer 1452 on which the light emitting element 1454 is mounted and the fourth surface 1451*a* of the printed circuit board 1451 may be the same as a distance between the second surface 14302 of the display 1430 and the fourth surface 1451*a* of the printed circuit board 1451.

According to an embodiment of the disclosure, the light emitting element 1454 may include various light sources, such as an IR LED, a laser diode (for example, a vertical-cavity surface-emitting laser (VSEL)).

According to various embodiments of the disclosure, the electronic device 1400 may further include a light blocking element to prevent light outputted from the light emitting unit 1454 from entering at least a portion of the display 1430. For example, the electronic device 1400 may include a light blocking material (for example, the light blocking material 981 of FIG. 9) covering at least a portion of the side surface 14303 of the display 1430.

Figure 15:
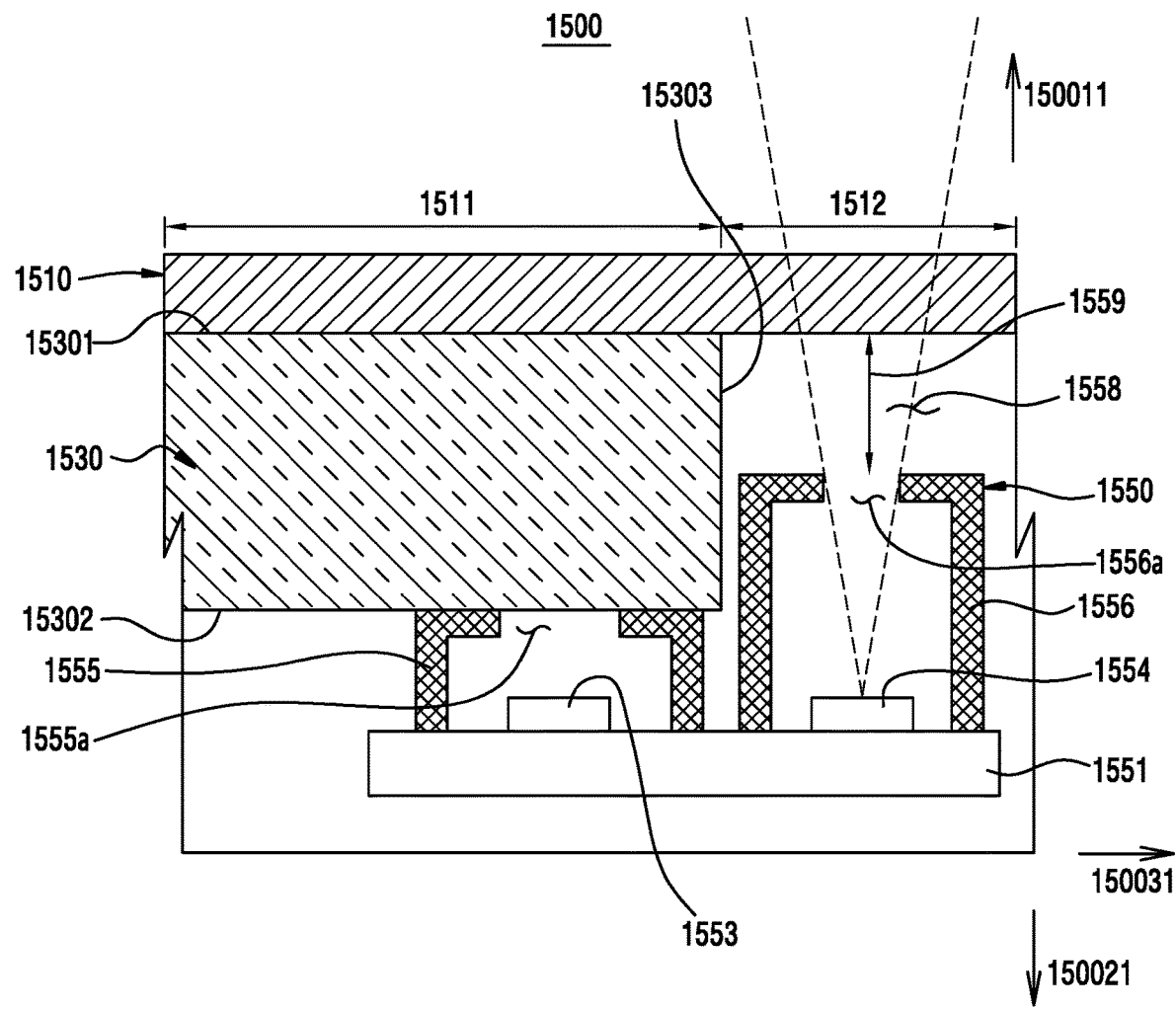
FIG. 15 is a schematic cross-sectional view illustrating an electronic device including at least one light emitter and at least one light receiver disposed adjacent to a display according to an embodiment of the disclosure.

FIG. 15 is a schematic cross-sectional view illustrating an electronic device including at least one light emitter and at least one light receiver disposed adjacent to a display according to an embodiment of the disclosure.

Referring to FIG. 15, in an embodiment of the disclosure, an electronic device 1500 may include at least a portion of the electronic device 101 of FIG. 1, the first external electronic device 102 of FIG. 2, the electronic device 400 of FIG. 4A, or the electronic device 500 of FIG. 5.

According to an embodiment of the disclosure, the electronic device 1500 may include a plate 1510, a display 1530, and a light sensor 1550.

According to an embodiment of the disclosure, the plate 1510 may be similar to or the same as the first cover 510-1 of FIG. 5. For example, the plate 1510 may include a first region 1511 (for example, the first region 510-11 of FIG. 5) covering the display 1530, and a second region 1512 (for example the second region 510-12 of FIG. 5) disposed on the periphery of the first region 1511.

According to an embodiment of the disclosure, the display 1530 may be similar to or the same as the display 530 of FIG. 5. For example, the display 1530 may include a first surface 15301 (for example, the display first surface 5301 of FIG. 5) facing toward a first direction 150011 (for example, the first direction 50011 of FIG. 5), a second surface 15302 (for example, the display second surface 5302 of FIG. 5) facing toward a second direction 150021 (for example, the second direction 50021 of FIG. 5) opposite the first direction 150011, and a third surface 15303 (for example, the display third surface 5303 of FIG. 5) facing toward a third direction 150031 (for example, the third direction 50031 of FIG. 4) perpendicular to the first direction 150011.

According to an embodiment of the disclosure, the light sensor 1550 may include a printed circuit board 1551, and a light receiving element 1553 and a light emitting element 1554 which are mounted on the printed circuit board 1551. The light receiving element 1553 may be aligned with the display 1530, and external light may enter the light receiving element 1553 through the plate 1510 and the display 1530. The light emitting element 1554 may be aligned with the second region 1512 of the plate 1510, and light outputted from the light emitting element 1554 may be discharged to the outside through a space 1558 formed beside the third surface 15303 of the display 1530, and the plate 1510.

According to an embodiment of the disclosure, the light sensor 1550 may include a first cover 1555 (for example, the cover 1455 of FIG. 14) coupled to the printed circuit board 1551, and the first cover 1555 may be disposed between the printed circuit board 1551 and the display 1530. External light may enter the light receiving element 1553 through the plate 1510, the display 1530, and a first penetrating hole 1555a (for example, the penetrating hole 1455a of FIG. 14) of the first cover 1555. According to various embodiments of the disclosure, an element including the first cover 1555 and the light receiving element 1553 is defined as a light receiving unit or a light receiving module.

According to an embodiment of the disclosure, the light sensor 1550 may include a second cover 1556 coupled to the printed circuit board 1551, and the second cover 1556 may be disposed between the printed circuit board 1551 and the second region 1512 of the plate 1510. The light emitting element 1554 may be disposed in a space formed by the second cover 1556, and the second cover 1556 may include a second penetrating hole 1556a vertically aligned with the light emitting element 1554. Light outputted from the light emitting element 1554 may be discharged to the outside through the second penetrating hole 1556a. According to an embodiment of the disclosure, the second cover 1556 may include a light blocking material. According to various embodiments of the disclosure, an element including the second cover 1556 and the light emitting element 1554 is defined as a light emitting unit or a light emitting module.

According to an embodiment of the disclosure, the second penetrating hole 1556a of the second cover 1556 may provide a function of discharging light outputted from the light emitting element 1554 (for example, a laser diode) to the outside substantially through the second region 1512 of the plate 1510 (for example, a function of enhancing directivity, or guiding or changing a light direction).

According to an embodiment of the disclosure, a distance 1559 of the second penetrating hole 1556a of the second cover 1556 from the plate 1510 may be shorter than a distance (not shown) of the second surface 15302 of the display 1530 from the plate 1510. According to various embodiments of the disclosure, the distance 1559 of the second penetrating hole 1556a of the second cover 1556 from the plate 1510 may be formed differently.

According to various embodiments of the disclosure, the first cover 1555 and the second cover 1556 may be formed by an integrated structure.

Figure 16:
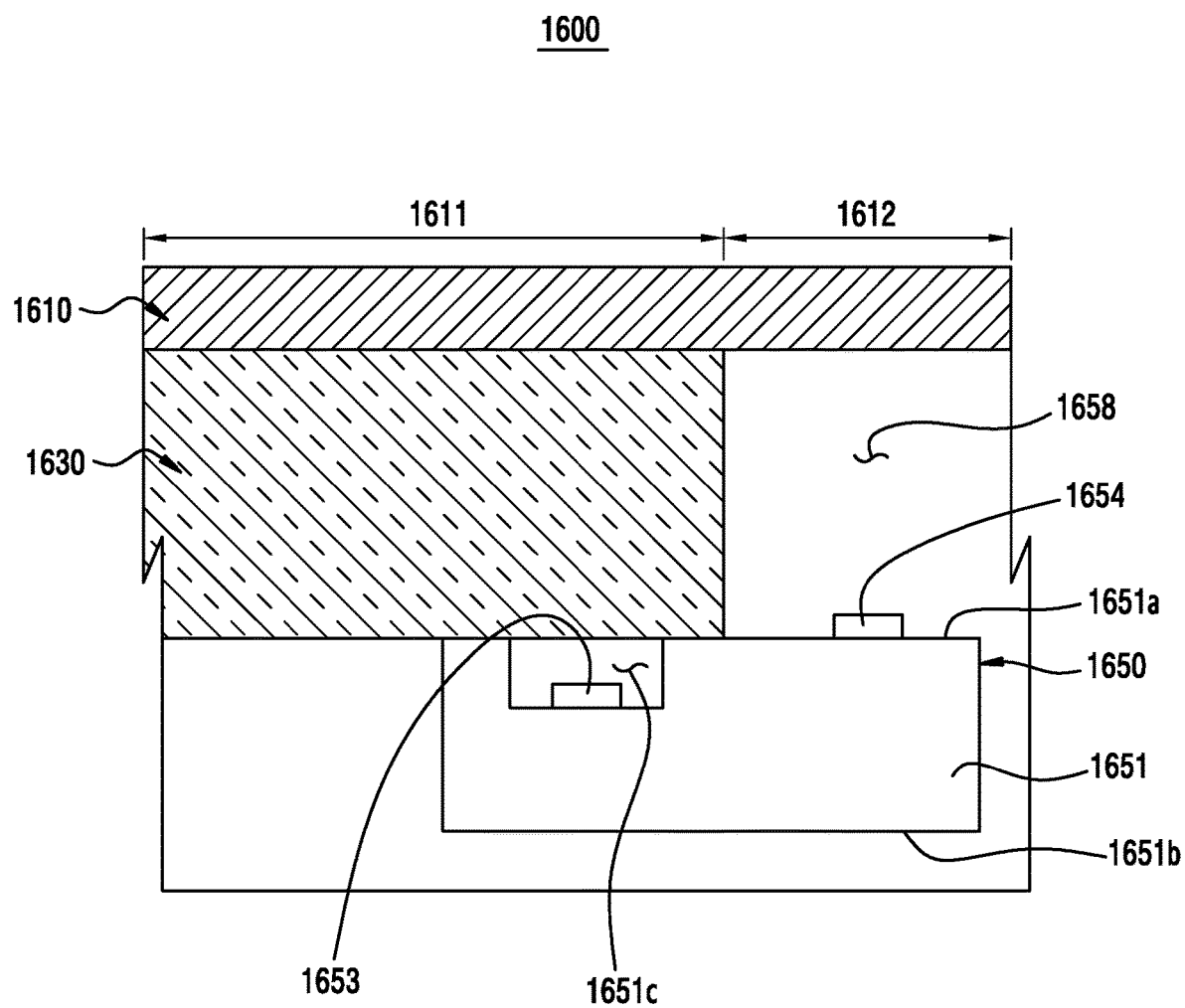
FIG. 16 is a schematic cross-sectional view illustrating an electronic device including at least one light emitter and at least one light receiver disposed adjacent to a display according to an embodiment of the disclosure.

FIG. 16 is a schematic cross-sectional view illustrating an electronic device including at least one light emitter and at least one light receiver disposed adjacent to a display according to an embodiment of the disclosure.

Referring to FIG. 16, in an embodiment of the disclosure, an electronic device 1600 may include at least a portion of the electronic device 101 of FIG. 1, the first external electronic device 102 of FIG. 2, the electronic device 400 of FIG. 4A, or the electronic device 500 of FIG. 5.

According to an embodiment of the disclosure, the electronic device 1600 may include a plate 1610, a display 1630, and a light sensor 1650.

According to an embodiment of the disclosure, the plate 1610 may be similar to or the same as the first cover 510-1 of FIG. 5. For example, the plate 1610 may include a first region 1611 (for example, the first region 510-11 of FIG. 5) covering the display 1630, and a second region 1612 (for example the second region 510-12 of FIG. 5) disposed on the periphery of the first region 1611.

According to an embodiment of the disclosure, the display 1630 may be similar to or the same as the display 530 of FIG. 5.

According to an embodiment of the disclosure, the light sensor 1650 may include a mounting plate 1651, and a light receiving element (or a light receiving unit) 1653 and a light emitting element (or a light emitting unit) 1654 which are mounted on the mounting plate 1651. The light receiving element 1653 may be aligned with the display 1630, and external light may enter the light receiving element 1653 through the plate 1610 and the display 1630. The light emitting element 1654 may be aligned with the second region 1612 of the plate 1610, and light outputted from the light emitting element 1654 may be discharged to the outside through a space 1658 formed beside the display 1630, and the plate 1610.

According to an embodiment of the disclosure, the mounting plate 1651 may include a front surface 1651a facing toward the plate 1610, and a rear surface 1651b facing the front surface 1651a. According to an embodiment of the disclosure, a recess 1651c may be formed on the front surface 1651a of the mounting plate 1651, and the light receiving element 1653 may be disposed in the recess 1651c.

According to an embodiment of the disclosure, the mounting plate 1651 may include a printed circuit board including at least one inner layer formed according to the manufacturing flow described above with reference to FIGS. 11A, 11B, 11C, and 11D.

According to various embodiments of the disclosure, the electronic device 1600 may further include a light blocking element to prevent light outputted from the light emitting unit 1654 from entering at least a portion of the display 1630. For example, the electronic device 1600 may include a light blocking material (for example, the light blocking material 981 of FIG. 9) covering at least a portion of the side surface (for example, the third surface 10303 of FIG. 10).

Figure 17A:
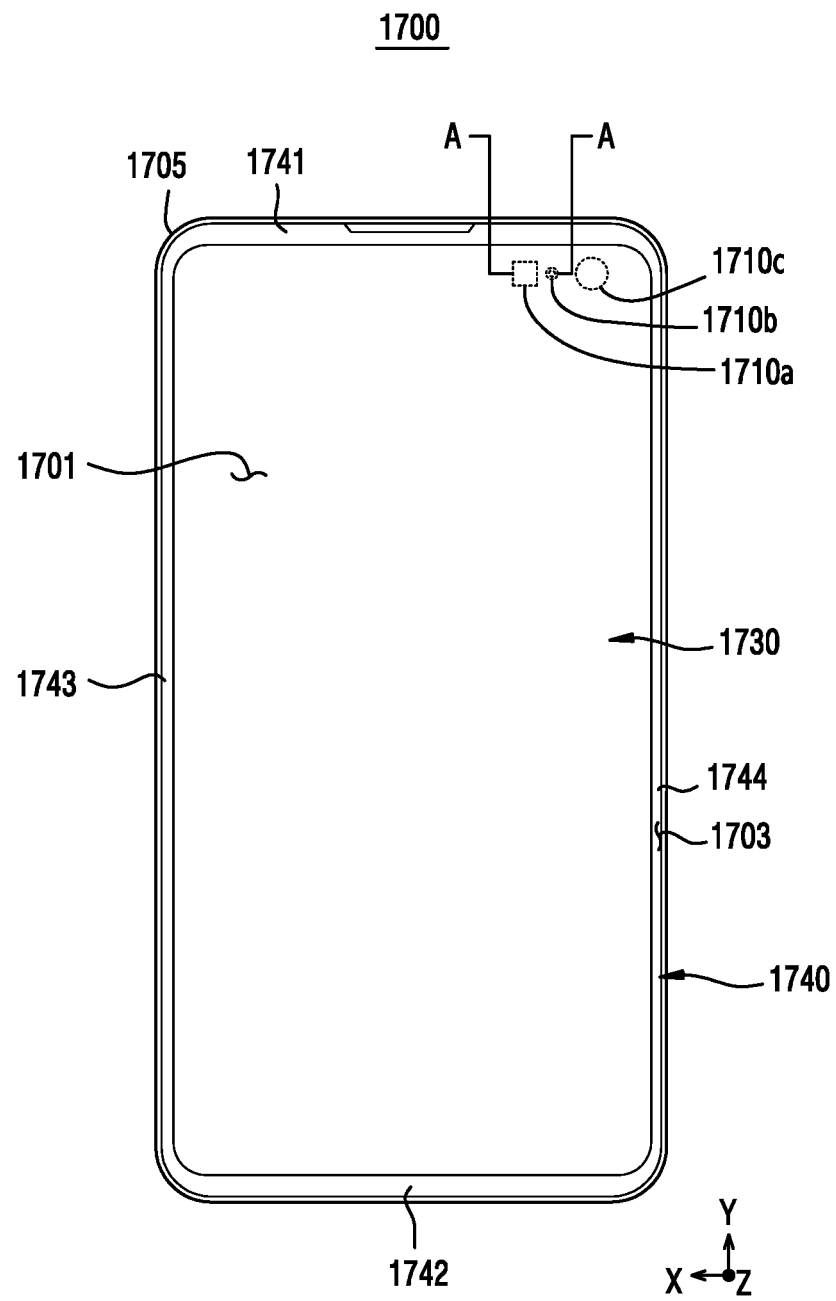
FIG. 17A is a view of an electronic device including at least one light emitter and at least one light receiver disposed adjacent to a display, as viewed from the front, according to an embodiment of the disclosure.
Figure 17B:
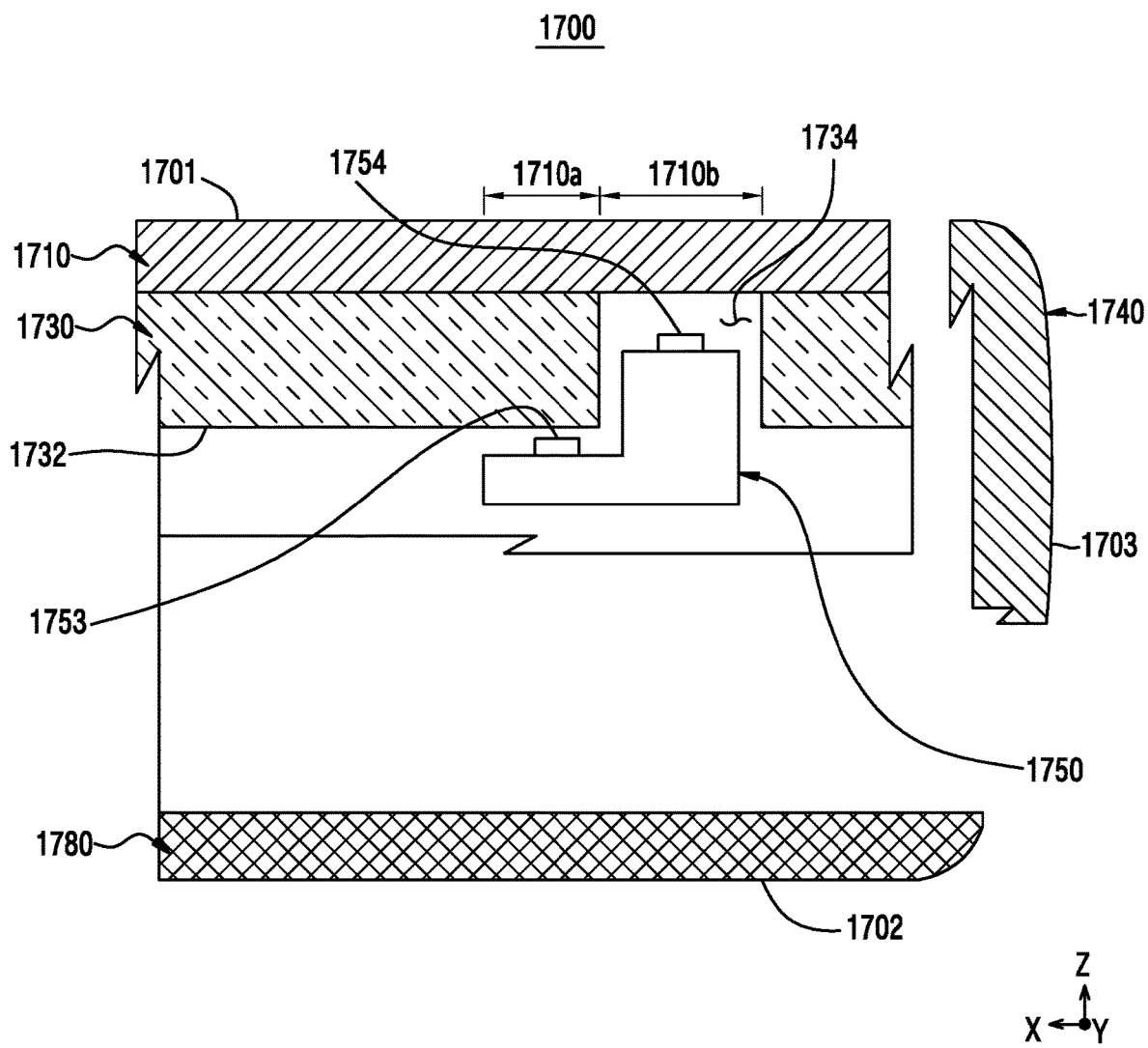
FIG. 17B is a cross-sectional view of an electronic device corresponding to A-A of FIG. 17A according to an embodiment of the disclosure.

FIG. 17A is a view of an electronic device including at least one light emitter and at least one light receiver disposed adjacent to a display, as viewed from the front, according to an embodiment of the disclosure. FIG. 17B is a cross-sectional view of an electronic device corresponding to A-A of FIG. 17A according to an embodiment of the disclosure.

Referring to FIG. 17A, an electronic device 1700 may include a housing 1705 (for example, the housing 410 of FIG. 4A or 4B) including a front surface 1701 (for example, the first surface 4001 of FIG. 4), a rear surface (for example, the second surface 4002 of FIG. 4B), and a side surface 1703 (for example, the third surface 4003 of FIG. 4A or 4B) surrounding a space between the front surface 1701 and the rear surface. According to another embodiment (not shown) of the disclosure, the housing may indicate a structure forming a portion of the front surface 1701, the rear surface, and the side surface 1703. Referring to FIG. 17B, the front surface 1701 may be formed of a front surface plate 1710 (for example, a glass plate including various coating layers, or a polymer plate) having at least a portion substantially transparent. A rear surface 1702 may be formed of a rear surface plate 1780 substantially opaque. The rear surface plate 1780 may be formed by coated or colored glass, ceramic, polymer, metal (for example, aluminum, stainless steel (STS), or magnesium), or a combination of at least two of the above-mentioned materials. The side surface 1703 may be coupled to the front surface plate 1710 and the rear surface plate 1780, and may be formed by a side surface bezel structure (or "side surface member") 1740 including metal and/or polymer. In an embodiment of the disclosure, the rear surface plate 1780 and the side surface bezel structure 1740 may be integrally formed with each other, and may include the same material (for example, metallic material, such as aluminum).

In an embodiment of the disclosure, referring to FIG. 17B, a display 1730 may be exposed through the front surface plate 1710, and may include a penetrating hole 1734. According to an embodiment of the disclosure, a light sensor 1750 may include a light receiver 1753 disposed adjacent to a rear surface 1732 of the display 1730, and a light emitter 1754 disposed in the penetrating hole 1734 of the display 1730. For example, the light sensor 1750 may be similar to or the same as one of the light sensor 1050 of FIG. 10, the light sensor utilizing the printed circuit board of FIG. 12F, the light sensor 1300 of FIG. 13, the light sensor 1450 of FIG. 14, or the light sensor 1550 of FIG. 15. As shown in the drawing, the light sensor 1750 may include a protruding structure to allow a portion on which the light emitter 1754 is mounted to be inserted into the penetrating hole 1734, and this protruding structure may reduce a gap between the light emitter 1754 and the front surface plate 1710.

According to an embodiment of the disclosure, the light sensor 1750 may be substituted with one of the light sensor 550, 560 of FIG. 5, the light sensor 600 of FIG. 6A or 6B, the light sensor 750 of FIG. 7, the light sensor 850 of FIG. 8, the light sensor 990 of FIG. 9, the light sensor 1550 of FIG. 15, or the light sensor 1650 of FIG. 16, and an installation structure of the substituted light sensor may also be changed.

In an embodiment of the disclosure, referring to FIGS. 17A and 17B, the front surface plate 1710 may include a first region 1710a aligned with the light receiver 1753, and a second region 1710b aligned with the penetrating hole 1734 of the display 1730. External light may enter the light receiver 1753 through the first region 1710a and the display 1730. Light outputted from the light emitter 1754 may be discharged to the outside through the second region 1710b.

According to various embodiments of the disclosure, although not shown, the display 1730 may further include an additional penetrating hole utilized by various other optical devices, such as a camera module (or an image sensor). For example, referring to FIG. 17A, external light may enter the camera module through a third region 1710c of the front surface plate 1710 aligned with the penetrating hole.

Referring to FIG. 17A, the side surface bezel structure 1740 may include a first side surface member 1741 (for example, the first frame 410-31 of FIG. 4A), a second side surface member 1742 (for example, the second frame 410-32 of FIG. 4A), a third side surface member 1743 (for example, the third frame 410-33 of FIG. 4A), and a fourth side surface member 1744 (for example, the fourth frame 410-34 of FIG. 4A). The first side surface member 1741 may be parallel to the second side surface member 1742, and may be spaced apart therefrom in parallel in the y-axis direction. The third side surface member 1743 may be parallel to the fourth side surface member 1744, and may be spaced apart therefrom in parallel in the x-axis direction. According to an embodiment of the disclosure, the first region 1710a, the second region 1710b, or the third region 1710c of the front surface plate 1710 may be disposed closer to the first side surface member 1741 out of the first side surface member 1741 and the second side surface member 1742. According to an embodiment of the disclosure, the first region 1710a, the second region 1710b, or the third region 1710c of the front surface plate 1710 may be disposed closer to the fourth side surface member 1744 out of the third side surface member 1743 and the fourth side surface member 1744.

Figure 18A:
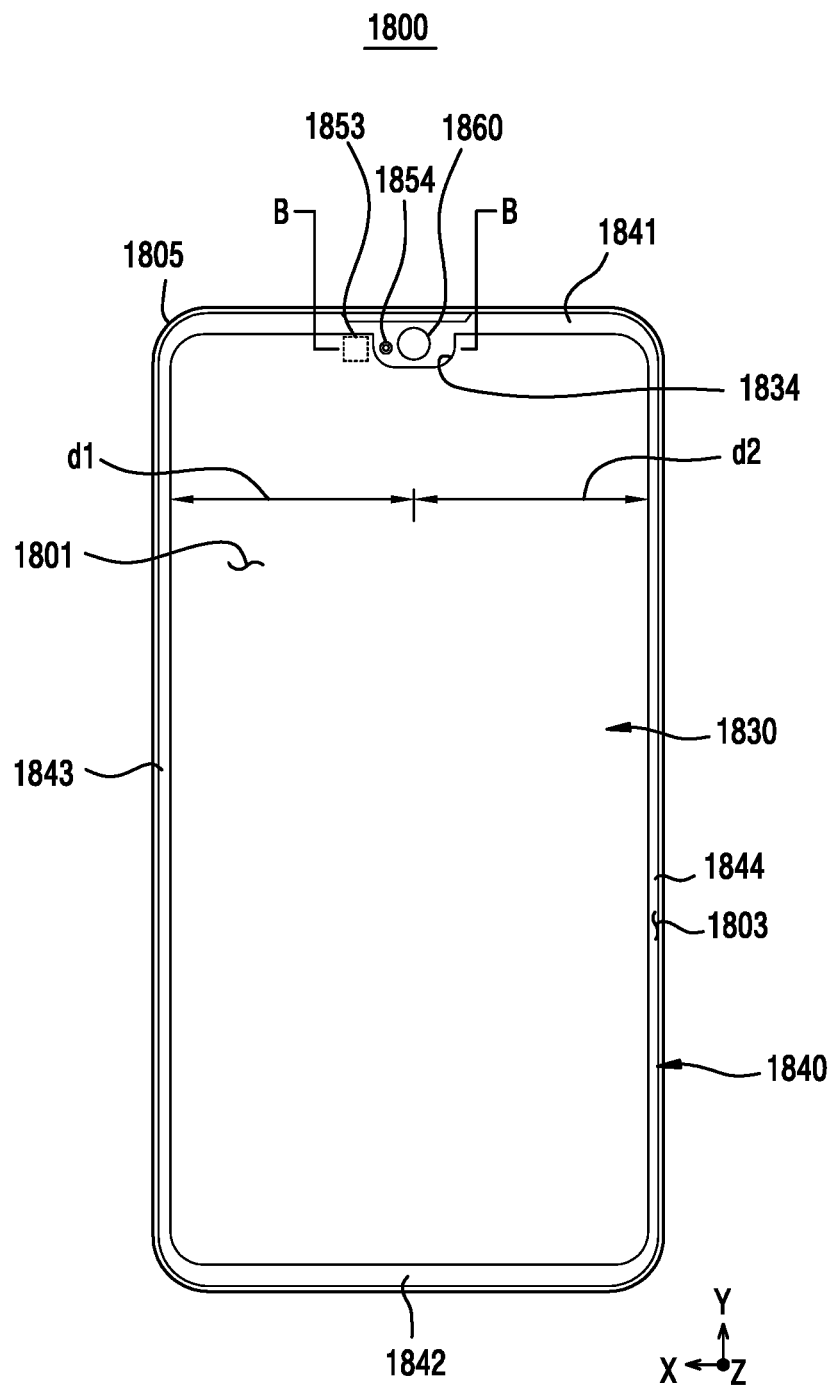
FIG. 18A is a view of an electronic device including at least one light emitter and at least one light receiver disposed adjacent to a display, as viewed from the front, according to an embodiment of the disclosure.
Figure 18B:
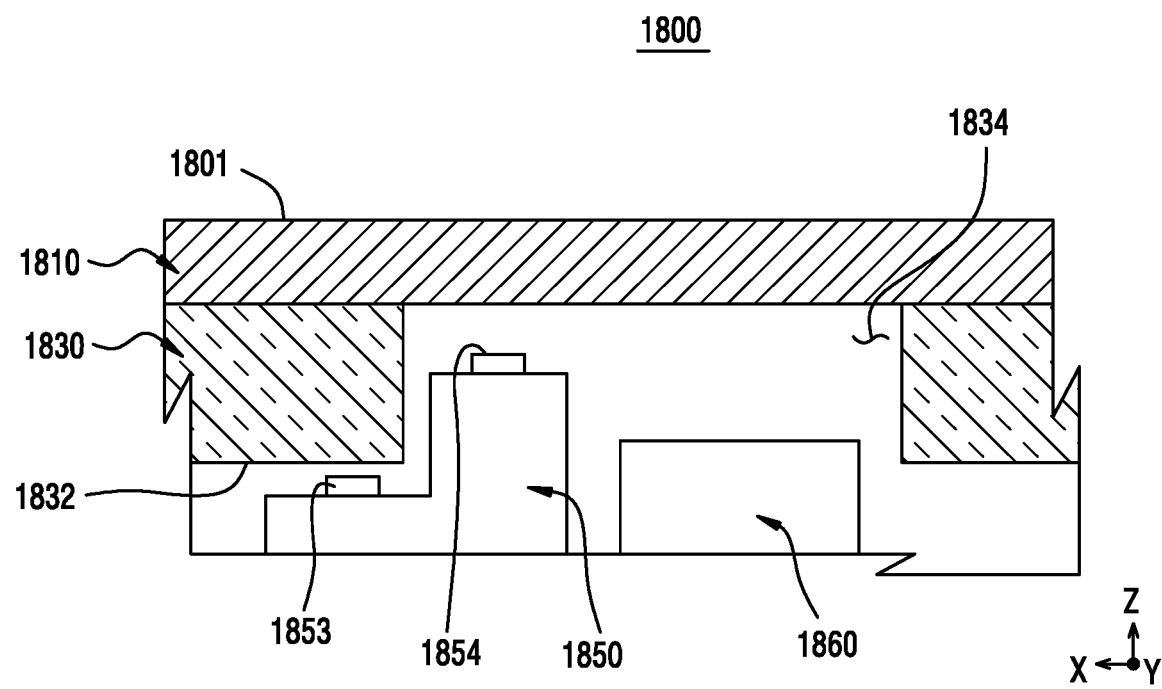
FIG. 18B is a cross-sectional view of an electronic device corresponding to B-B of FIG. 18A according to an embodiment of the disclosure.

FIG. 18A is a view of an electronic device including at least one light emitter and at least one light receiver disposed adjacent to a display, as viewed from the front, according to an embodiment of the disclosure. FIG. 18B is a cross-sectional view of an electronic device corresponding to B-B of FIG. 18A according to an embodiment of the disclosure.

Referring to FIG. 18A, an electronic device 1800 may include a housing 1805 (for example, the housing 410 of FIG. 4A or 4B) including a front surface 1801 (for example, the first surface 4001 of FIG. 4), a rear surface (for example, the second surface 4002 of FIG. 4B), and a side surface 1803 (for example, the third surface 4003 of FIG. 4A or 4B) surrounding a space between the front surface 1801 and the rear surface. The housing 1805 may include a side surface bezel structure 1840 forming the side surface 1803, and the side surface bezel structure 1840 may include a first side surface member 1841 (for example, the first side surface member 1741 of FIG. 17A), a second side surface member 1842 (for example, the second side surface member 1742 of FIG. 17A), a third side surface member 1843 (for example, the third side surface member 1743 of FIG. 17A), and a fourth side surface member 1844 (for example, the fourth side surface member 1744 of FIG. 17A).

In an embodiment of the disclosure, referring to FIGS. 18A and 18B, a display 1830 may be exposed through a front surface plate 1810 forming the front surface 1801, and may include a notch 1834 recessed in a direction from the first side surface member 1841 to the second side surface member 1842. For example, the notch 1834 may have an edge formed in the shape of "U", and may be defined as "U-cut." According to an embodiment of the disclosure, a light sensor 1850 may include a light receiver 1853 disposed adjacent to a rear surface 1832 of the display 1830, and a light emitter 1854 disposed in the notch 1834 of the display 1830. For example, the light sensor 1850 may be similar to or the same as one of the light sensor 1050 of FIG. 10, the light sensor utilizing the printed circuit board of FIG. 12F, the light sensor 1300 of FIG. 13, the light sensor 1450 of FIG. 14, or the light sensor 1550 of FIG. 15. A portion on which the light emitter 1854 is mounted may be inserted into the notch 1834, and this structure may reduce a gap between the light emitter 1854 and the front surface plate 1810.

According to an embodiment of the disclosure, the light sensor 1850 may be substituted with one of the light sensor 550, 560 of FIG. 5, the light sensor 600 of FIG. 6A or 6B, the light sensor 750 of FIG. 7, the light sensor 850 of FIG. 8, the light sensor 990 of FIG. 9, the light sensor 1550 of FIG. 15, or the light sensor 1650 of FIG. 16, and an installation structure of the substituted light sensor may also be changed.

According to an embodiment of the disclosure, an optical device, such as camera module 1860 (for example, or an image sensor) may be aligned with the notch 1834. According to an embodiment of the disclosure, the camera module 1860 may be inserted into the notch 1834. According to an embodiment of the disclosure, a distance d1 between the camera module 1860 and the third side surface member 1843, and a distance d2 between the camera module 1860 and the fourth side surface member 1844 may be the same as each other. According to an embodiment of the disclosure, the first distance d1 and the second distance d2 may be different from each other. When viewed from the front surface 1801, the light emitter 1854 may be disposed between the light receiver 1853 and the camera module 1860.

According to various embodiments of the disclosure, although not shown, a partition dividing the light sensor 1850 and the camera module 1860 may be extended to the notch 1834. This partition may be a portion of a support member (for example, a mid-plate or bracket) extended from the side surface bezel structure 1840 or coupled to the side surface bezel structure 1840.

Figure 19A:
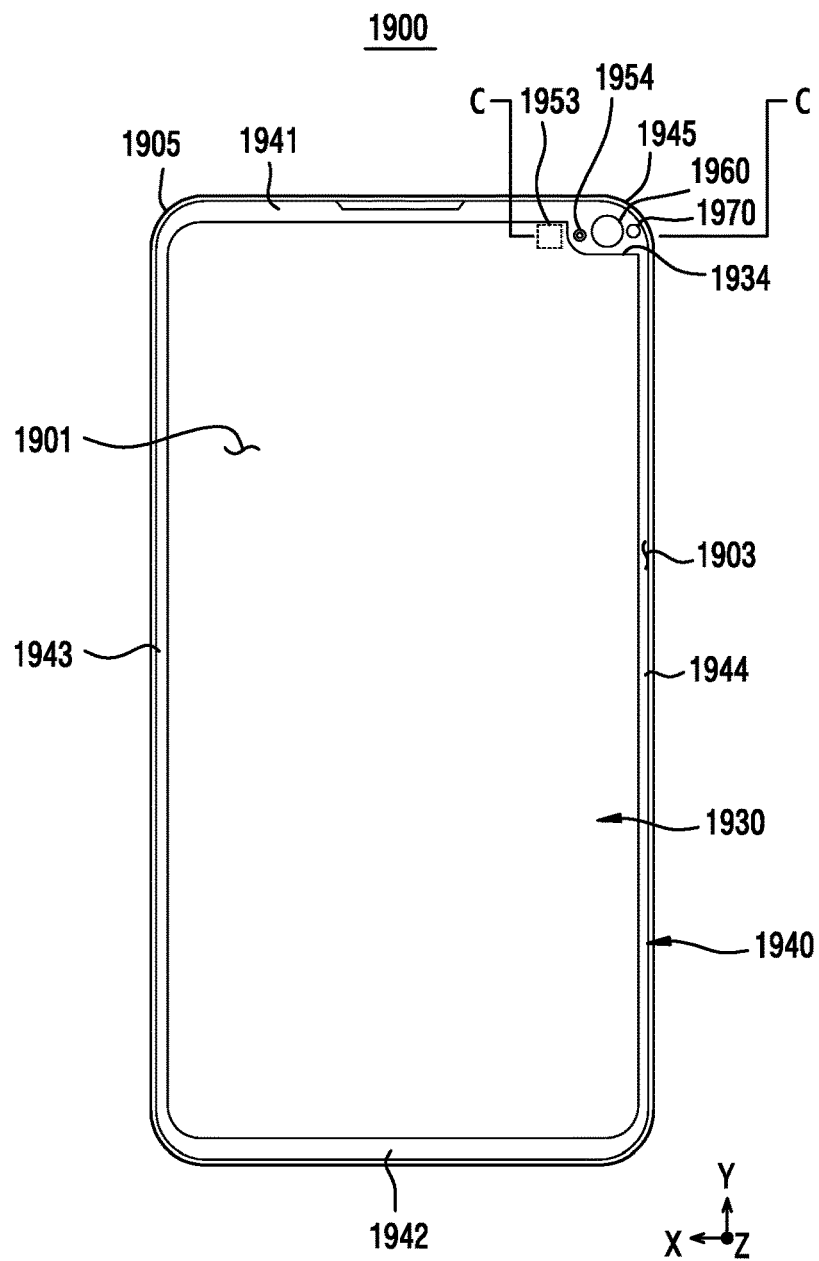
FIG. 19A is a view of an electronic device including at least one light emitter and at least one light receiver disposed adjacent to a display, as viewed from the front, according to an embodiment of the disclosure.
Figure 19B:
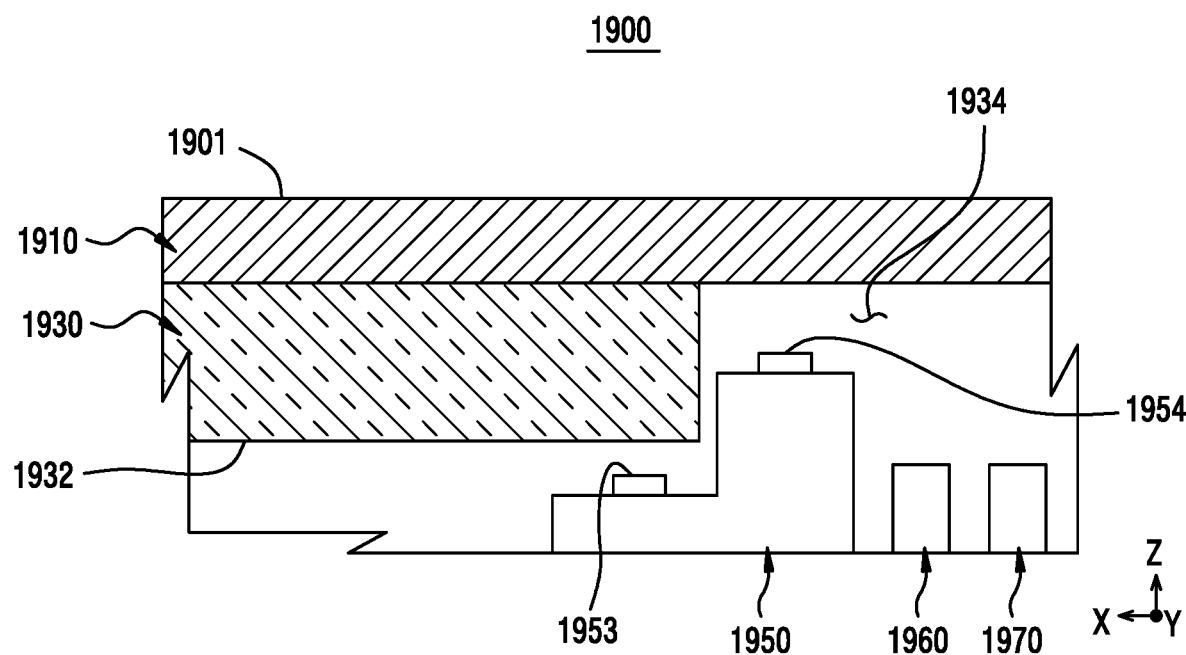
FIG. 19B is a cross-sectional view of an electronic device corresponding to C-C of FIG. 19A according to an embodiment of the disclosure.

FIG. 19A is a view of an electronic device including at least one light emitter and at least one light receiver disposed adjacent to a display, as viewed from the front, according to an embodiment of the disclosure. FIG. 19B is a cross-sectional view of an electronic device corresponding to C-C of FIG. 19A according to an embodiment of the disclosure.

Referring to FIG. 19A, an electronic device 1900 may include a housing 1905 (for example, the housing 410 of FIG. 4A or 4B) including a front surface 1901 (for example, the first surface 4001 of FIG. 4), a rear surface (for example, the second surface 4002 of FIG. 4B), and a side surface 1903 (for example, the third surface 4003 of FIG. 4A or 4B) surrounding a space between the front surface 1901 and the rear surface. The housing 1905 may include a side surface bezel structure 1940 forming the side surface 1903, and the side surface bezel structure 1940 may include a first side surface member 1941 (for example, the first side surface member 1741 of FIG. 17A), a second side surface member 1942 (for example, the first side surface member 1742 of FIG. 17A), a third side surface member 1943 (for example, the third side surface member 1743 of FIG. 17A), and a fourth side surface member 1944 (for example, the fourth side surface member 1744 of FIG. 17A).

In an embodiment of the disclosure, referring to FIGS. 19A and 19B, a display 1930 may be exposed through a front surface plate 1910 forming the front surface 1901, and may include a notch 1934 recessed adjacent to a coupling portion 1945 coupling the first side surface member 1941 and the fourth side surface member 1944 to each other. For example, the notch 1934 may have an edge formed in the shape of "L", and may be defined as "L-cut." According to an embodiment of the disclosure, a light sensor 1950 may include a light receiver 1953 disposed adjacent to a rear surface 1932 of the display 1930, and a light emitter 1954 disposed in the notch 1934 of the display 1930. For example, the light sensor 1950 may be similar to or the same as one of the light sensor 1050 of FIG. 10, the light sensor utilizing the printed circuit board of FIG. 12F, the light sensor 1300 of FIG. 13, the light sensor 1450 of FIG. 14, or the light sensor 1550 of FIG. 15. A portion on which the light emitter 1954 is mounted may be inserted into the notch 1934, and this structure may reduce a gap between the light emitter 1954 and the front surface plate 1910.

According to an embodiment of the disclosure, the light sensor 1950 may be substituted with one of the light sensor 550, 560 of FIG. 5, the light sensor 600 of FIG. 6A or 6B, the light sensor 750 of FIG. 7, the light sensor 850 of FIG. 8, the light sensor 990 of FIG. 9, the light sensor 1550 of FIG. 15, or the light sensor 1650 of FIG. 16, and an installation structure of the substituted light sensor may also be changed.

According to an embodiment of the disclosure, a plurality of optical devices 1960, 1970, such as a camera module (or an image sensor) and an LED may be aligned with the notch 1934. According to an embodiment of the disclosure, the plurality of optical devices 1960, 1970 may be inserted into the notch 1934.

According to various embodiments of the disclosure, although not shown, a partition dividing the light sensor 1950 and the plurality of optical devices 1960, 1970 may be extended to the notch 1934. This partition may be a portion of a support member (for example, a mid-plate or bracket) extended from the side surface bezel structure 1940 or coupled to the side surface bezel structure 1940.

Figure 20:
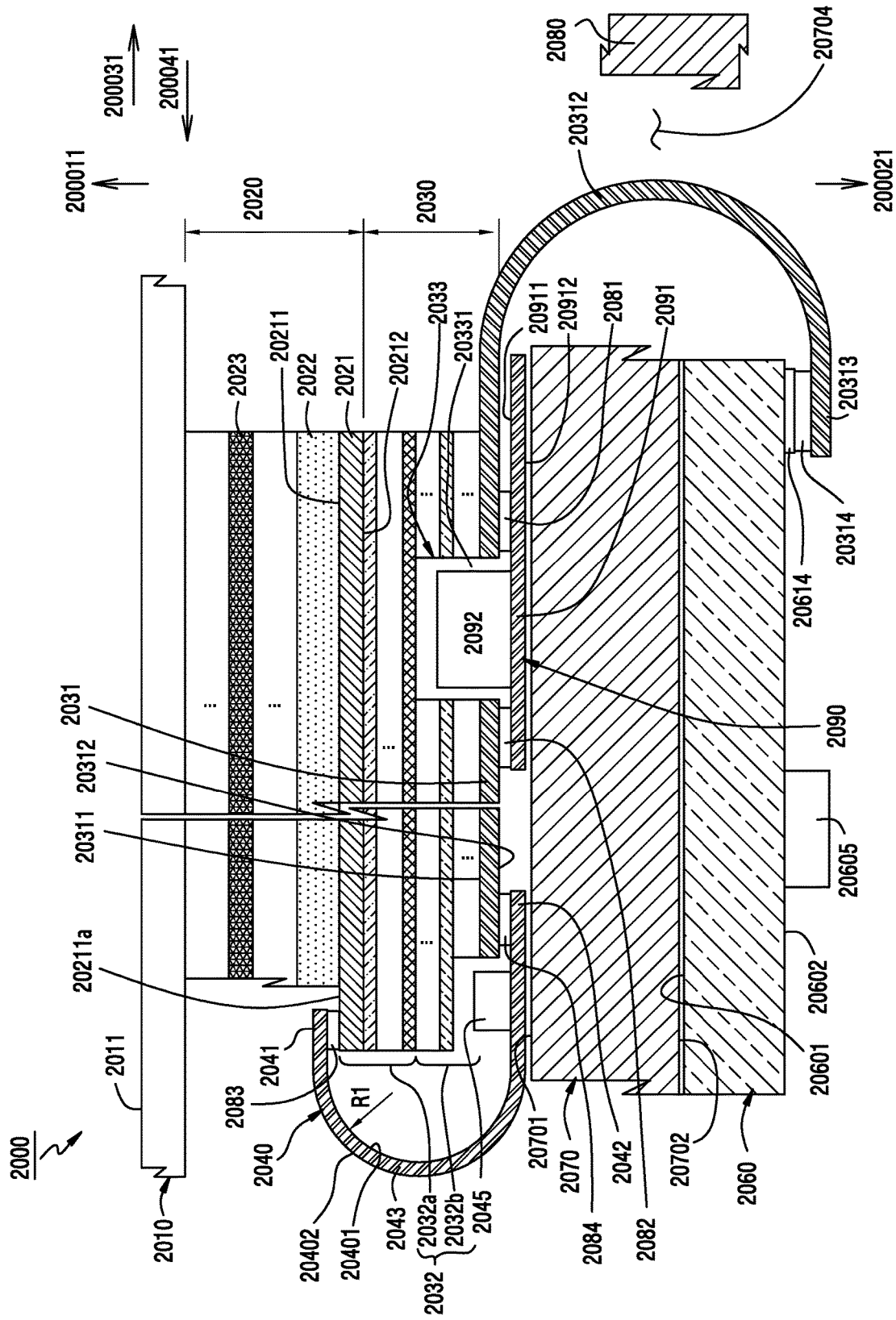
FIG. 20 is a cross-sectional view illustrating a portion of an electronic device including a light receiving unit of at least one light sensor disposed adjacent to a display according to an embodiment of the disclosure.

FIG. 20 is a cross-sectional view illustrating a portion of an electronic device including a light receiving unit of at least one light sensor disposed adjacent to a display according to an embodiment of the disclosure.

FIGS. 21A, 21B, 21C, and 21D are cross-sectional views illustrating an electric connection structure among layers according to various embodiments of the disclosure.

According to various embodiments of the disclosure, the electronic device 1000 may be one of the electronic device 101 of FIG. 1, the electronic device 201 of FIG. 2, the electronic device 400 of FIG. 4A, the electronic device 500 of FIG. 5, the electronic device 700 of FIG. 7, the electronic device 800 of FIG. 8, the electronic device 1000 of FIG. 10, the electronic device 1300 of FIG. 13, the electronic device 1400 of FIG. 14, the electronic device 1500 of FIG. 15, the electronic device 1600 of FIG. 16, the electronic device 1700 of FIG. 17A or 17B, the electronic device 1800 of FIG. 18A or 18B, or the electronic device of FIG. 19A or 19B.

Referring to FIG. 20, according to an embodiment of the disclosure, the electronic device 2000 may include a light transmission substrate 2010, a first panel 2020, a second panel 2030, a light sensor 2090, and a PCB 2060.

According to an embodiment of the disclosure, the light transmission substrate 2010 may be similar to or the same as the first cover 510-1 of FIG. 5, and thus a detailed description thereof is omitted.

According to an embodiment of the disclosure, the first panel 2020 may be disposed under or below the light transmission substrate 2010. The first panel 2020 may be designed to have a display function. According to an embodiment of the disclosure, the first panel 2020 may include a first backplane 2021 and a pixel layer 2022 disposed on the first backplane 2021. For example, the first backplane 2021 may include a substrate (not shown) formed of various materials, such as polyimide (PI), polymer, or the like, a plurality of gate lines and a plurality of data lines which are installed on the substrate, and a plurality of switches.

According to various embodiments of the disclosure, the first panel 2020 may include a conductive pattern 2023 disposed between the light transmission substrate 2010 and the pixel layer 2022. The conductive pattern 2023 may be used to detect a touch input or a hovering input. According to various embodiments of the disclosure, the conductive pattern 2020 may include aluminum (Al), copper (Cu), silver (Ag), graphene, indium-tin-oxide (ITO), or indium-zinc-oxide (IZO), or the like. The electronic device 2000 may include a touch/hovering input detection circuit (not shown) electrically connected to the conductive pattern 2023. The touch/hovering input detection circuit may activate at least a portion of the conductive pattern 2023 based on a signal from a control circuit (for example, the processor 120 of FIG. 1 or the processor 210 of FIG. 2). The touch/hovering input detection circuit may detect a signal related to a touch input or a hovering input through the conductive pattern 2023, and may provide the signal to the control circuit. The control circuit may detect the touch input or the hovering input based on the signal obtained from the touch/hovering input detection circuit. The touch input may be defined as an input generated when an object (for example, a finger or a stylus) substantially touches a surface 2011 (for example, the first surface 5001 of FIG. 5) of the light transmission substrate 2010. The hovering input may be defined as an input generated when an object (for example, a finger or stylus) is spaced apart from the surface 2011 of the light transmission substrate 2010 by a threshold distance (for example, about 10 cm) or less. According to various embodiments of the disclosure, the conductive pattern 2023 may be a layer that is formed along the light transmission substrate 2010, and this layer may be defined as a touch panel.

According to various embodiments of the disclosure, the first panel 2020 may further include one or more layers (not shown) disposed between the light transmission substrate 2010 and the conductive pattern 2023, or between the conductive pattern 2023 and the pixel layer 2022. For example, one or more layers may include an adhesive material (for example, an OCA) for coupling between layers. For example, one or more layers may include at least one of a polarizing layer, a phase difference layer, a birefringence compensation layer, an anti-glare layer, a brightness enhancement layer, a visual compensation layer, or an anti-reflection layer, which is related to image quality.

According to various embodiments of the disclosure, at least a portion of the first panel 2020 may be designed to have flexibility. According to an embodiment of the disclosure, the first panel 2020 may be disposed along at least a portion of the light transmission substrate 2010.

According to an embodiment of the disclosure, the second panel 2030 may be disposed under or below the first panel 2020. According to an embodiment of the disclosure, the second panel 2030 may include a second backplane 2031. The second backplane 2031 may include a substrate (not shown) formed of various materials, such as polyimide (PI) or polymer, and a plurality of wires installed on the substrate. According to an embodiment of the disclosure, the second panel 2030 may include one or more layers 2032 disposed between the first panel 2020 and the second backplane 2031.

According to an embodiment of the disclosure, the second panel 2030 may include a recess 2033 which is dented toward a first direction 200011 (for example, the first direction 50011 of FIG. 5). The one or more layers 2032 of the second panel 2030 may include at least one first layer 2032a disposed over a space 20331 (for example, 742 of FIG. 7) of the recess 2033, and at least one second layer 2032b disposed under or below the at least one first layer 2032a and forming the space 20331 of the recess 2033. According to various embodiments of the disclosure, the at last one first layer 2032a or the second layer 2032b may be designed to have flexibility. For example, the first layer 2032a or the second layer 2032b may include an embo layer or a sponge layer. According to various embodiments of the disclosure, the first layer 2032a or the second layer 2032b may include a layer including various materials, such as polymer, or the like.

According to various embodiments of the disclosure, the display (for example, 530 of FIG. 5) may be designed to include at least a portion of the first panel 2020 and the second panel 2030.

According to various embodiments of the disclosure, the light sensor 2090 may include one of the light sensor 600 of FIG. 6A, the light sensor 750 of FIG. 7, the light sensor 850 of FIG. 8, the light sensor 990 of FIG. 9, the light sensor 1050 of FIG. 10, a light sensor utilizing the printed circuit board 1205 of FIG. 12F, the light sensor 1300 of FIG. 13, the light sensor 1450 of FIG. 14, the light sensor 1550 of FIG. 15, the light sensor 1650 of FIG. 16, the light sensor 1750 of FIG. 17B, the light sensor 1850 of FIG. 18B, or the light sensor 1950 of FIG. 19B. The light sensor 2090 may include, for example, a light sensor substrate 2091 (for example, 601 of FIG. 6A) and a light receiving unit (or a light receiving module) 2092 (for example, 603 of FIG. 6A). The light sensor substrate 2091 may include a substrate first surface 20911 facing toward the first direction 200011 and a substrate second surface 20912 facing toward a second direction 200021. The light receiving unit 2092 may be disposed on the substrate first surface 20911. According to an embodiment of the disclosure, the light sensor substrate 2091 may be disposed under or below the second backplane 2031 of the second panel 2030. The light receiving unit 2092 may be inserted into the recess 2033 of the second panel 2030.

According to various embodiments of the disclosure, at least a portion of the first panel 2020 and the second panel 2030 may be designed to have a light transmission property (for example, a light transmission ratio of about 30% or more). External light may pass through the light transmission substrate 2010, the first panel 2020, and a portion of the second panel 2030 (for example, the first layer 2032a), and may enter the light receiving unit 2092.

According to an embodiment of the disclosure, the electronic device 2000 may include a connection portion 2081, 2082 disposed between the second backplane 2031 of the second panel 2030 and the light sensor substrate 2091 of the light sensor 2090. The connection portion 2081, 2082 may electrically connect between the second backplane 2031 of the second panel 2030 and the light sensor substrate 2091 of the light sensor 2090.

According to an embodiment of the disclosure, the connection portion 2081, 2082 may include one or more first contacts (not shown) disposed on the second backplane 2031, and one or more second contacts disposed on the light sensor substrate 2091. According to an embodiment of the disclosure, the first contact of the second backplane 2031 and the second contact of the light sensor substrate 2091 may be coupled to each other by thermal bonding. According to various embodiments of the disclosure, when the light sensor substrate 2091 of the light sensor 2090 is disposed between the second backplane 2031 and a mid-plate 2070 and is designed to be supported by the mid-plate 2070, the first contact or the second contact may include a flexible conductive member. For example, the flexible conductive member may include a C clip 2110, a pogo-pine, a spring, conductive phorone and rubber, a conductive tape or copper connector.

The PCB 2060 may be disposed under or below the mid-plate 2070. The PCB 2060 may include a PCB first surface 20601 facing toward the first direction 200011, and a PCB second surface 20602 facing toward the second direction 200021 (for example, the second direction 50021 of FIG. 5). The PCB 2060 may include a substrate including a plurality of components related to various operations of the electronic device 2000, and signal lines (for example, conductive tracks) or pads for electrically connecting the components. According to various embodiments of the disclosure, at least a portion of the various elements of FIG. 2 (for example, one or more processors 210 (for example, AP), the communication module 220, the subscriber identification module 224, the memory 230, the sensor module 240, the input device 250, the display 260, the interface 270, the audio module 280, the camera module 291, the power management module 295, the battery 296, the indicator 297, or the motor 298) may be mounted on the PCB 2060 or may be electrically connected with the PCB 2060.

The second backplane 2031 of the second panel 2030 may be electrically connected with the PCB 2060. According to an embodiment of the disclosure, the second backplane 2031 of the second panel 2030 may include an extension portion 20312 extending from one side thereof. The extension portion 20312 may include a connector 20314 disposed at one end 20313 thereof. The connector 20314 of the extension portion 20312 may be coupled to a connector 10614 formed on the PCB 1060. The connector 20614 of the PCB 2060 may be disposed on the PCB second surface 20602.

According to an embodiment of the disclosure, the extension portion 20312 of the second backplane 2031 may have flexibility. According to an embodiment of the disclosure, the extension portion 20312 of the second backplane 2031 may be mounted in the electronic device 2000 in the form of bending toward the PCB second surface 20602 of the PCB 2060. According to various embodiments of the disclosure, the extension portion 20312 may be designed to pass through a space 20704 (or a penetration portion) between the mid-plate 2070 and the side member 2080 (for example, 510-3 of FIG. 5), and to be coupled to the PCB 2060.

According to various embodiments of the disclosure, instead of the extension portion 20312 of the second backplane 2031, a flexible conductive member (for example, an FPCB) may be provided although it is not illustrated, and the second backplane 2031 and the PCB 2060 may be connected to each other by using the FPCB.

The first backplane 2021 of the first panel 2020 may be electrically connected to the second backplane 2031 of the second panel 2030. According to an embodiment of the disclosure, the electronic device 2000 may include a flexible conductive member 2040 (for example, an FPCB) electrically connecting the first backplane 2021 and the second backplane 2031. The flexible conductive member 2040 may be disposed in a bending form, and one end 2041 of the flexible conductive member 2040 may be connected to the first backplane 2021, and the other end 2042 of the flexible conductive member 2040 may be connected to the second backplane 2031.

According to an embodiment of the disclosure, the first backplane 2021 may include a backplane first surface 20211 facing toward the first direction 200011, and a backplane second surface 20212 facing toward the second direction 200021. According to an embodiment of the disclosure, a portion 20211a of the backplane first surface 20211 of the first backplane 2021 may be designed to be exposed. According to an embodiment of the disclosure, one end 2041 of the flexible conductive member 2040 may be connected to the portion 20211a of the backplane first surface 20211. For example, for a connection portion 2083 between one end 2041 of the flexible conductive member 2040 and the portion 20211a of the backplane first surface 20211, various connection structures, such as thermal bonding between contacts, coupling between connectors, or the like, may be applied although they are not illustrated.

According to various embodiments of the disclosure, although not shown, a portion of the backplane second surface 20212 may be designed to be exposed, and may be used as a portion to be connected to one end 2041 of the flexible conductive member 2040.

Figure 21A:
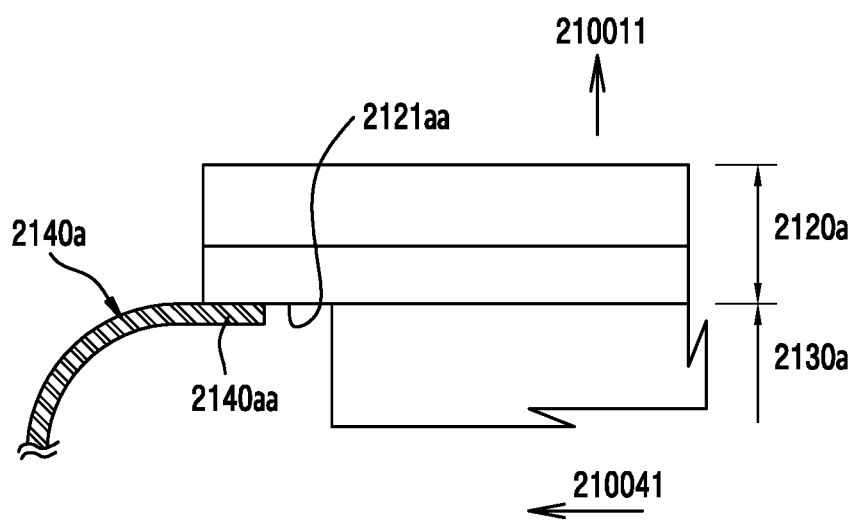
FIGS. 21A, 21B, 21C, and 21D are cross-sectional views illustrating an electric connection structure between layers according to various embodiments of the disclosure.
Figure 21B:
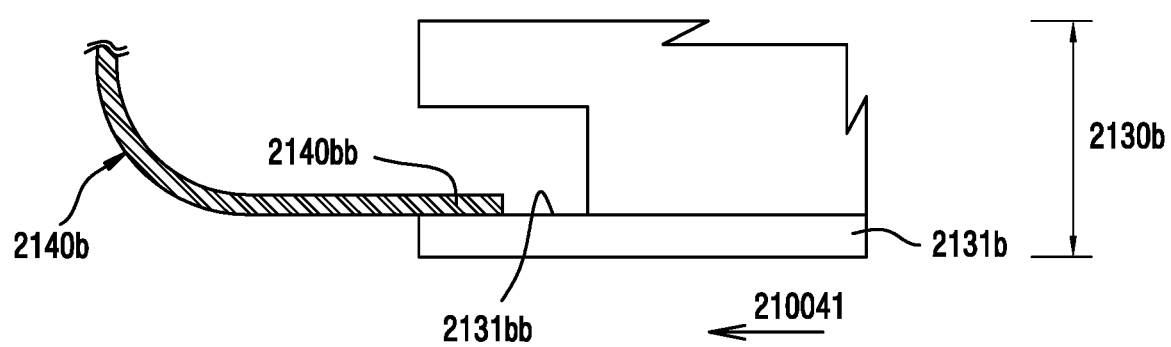
Figure 21C:
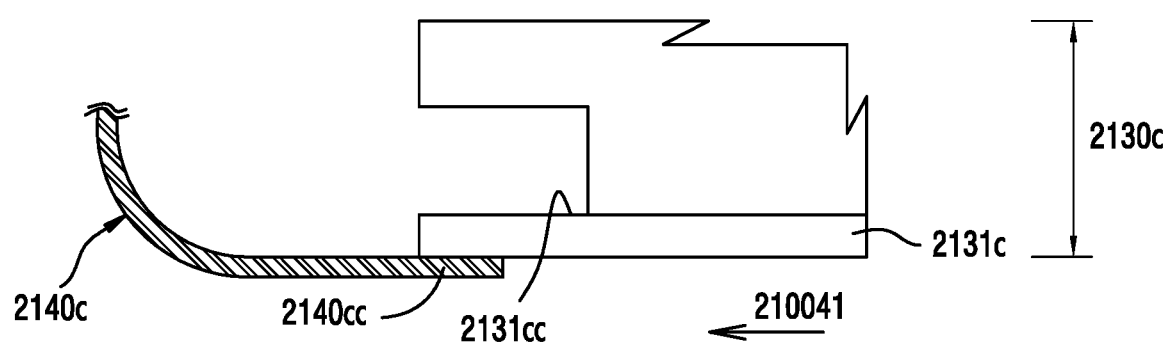

Referring to FIG. 21A, according to various embodiments of the disclosure, a first panel 2120a may be designed to protrude from an adjacent portion of a second panel 2130a in a fourth direction 210041 (for example, 200041 of FIG. 20), and an exposed portion 2121aa of a backplane second surface may be connected with one end 2140aa of a flexible conductive member 2140a.

Referring to FIG. 20, according to an embodiment of the disclosure, the second backplane 2031 may include a backplane third surface 20311 facing toward the first direction 210011 (for example, the first direction 200011 of FIG. 20), and a backplane fourth surface 20312 facing toward the second direction 200021. According to an embodiment of the disclosure, the other end 2042 of the flexible conductive member 2040 may be connected to the backplane fourth surface 20312 of the second backplane 2031. For example, for a connection portion 2084 between the other end 2042 of the flexible conductive member 2040 and the backplane fourth surface 20312, various connection structures, such as thermal bonding between contacts, coupling between connectors, or the like, may be applied although they are not illustrated.

According to various embodiments of the disclosure, a portion of the backplane third surface 20311 may be designed to be exposed, and the portion of the backplane third surface 20311 may be used as a portion to be connected to the other end 2042 of the flexible conductive member 2040. In various embodiments of the disclosure, referring to FIG. 21B, a second backplane 2131b of a second panel 2130b may be designed to protrude toward a fourth direction 210041 (for example, 200041 of FIG. 20), and an exposed portion 2131bb of a backplane third surface may be connected with one end 2140bb of a flexible conductive member 2140b. In various embodiments of the disclosure, referring to FIG. 21C, a second backplane 2131c of a second panel 2130c may be designed to protrude toward a fourth direction 210041 (for example, 200041 of FIG. 20), and an exposed portion 2131cc of a backplane fourth surface may be connected with one end 2140cc of a flexible conductive member 2140c.

According to various embodiments of the disclosure, the first backplane 2021 may be designed to include an extension substituting for the flexible conductive member 2040 although it is not illustrated.

Figure 21D:
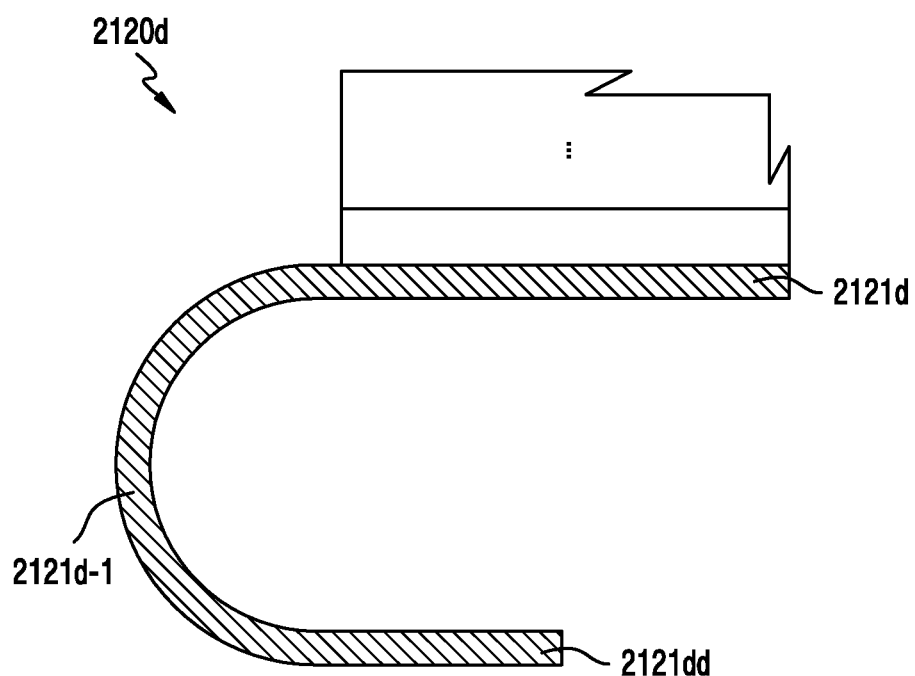

Referring to FIG. 21D, a first backplane 2121d of a first panel 2120d may include an extension portion 2121d-1 extending from one side thereof. An end 2121dd of the extension portion 2121d-1 may apply the connection structure between the flexible conductive member 2040 and the second backplane 2031 shown in FIG. 20, the connection structure between the flexible conductive member 2140b and the second backplane 2031b shown in FIG. 21B, or the connection structure between the flexible conductive member 2140c and the second backplane 2031c shown in FIG. 21C.

Referring to FIG. 20, according to an embodiment of the disclosure, the flexible conductive member 2040 may be mounted in the electronic device 2000 in a bending form. A bending portion 2043 of the flexible conductive member 2040 may be designed to have various radiuses of curvature R1 (for example, about 10 mm or less). According to various embodiments of the disclosure, the electronic device 2000 may include a support member (not shown) to maintain the bending form of the bending portion 2043 of the flexible conductive member 2040. According to various embodiments of the disclosure, an inside surface of the housing (for example, the bezel) may be designed to include a curved surface, and the bending portion 2043 of the flexible conductive member 2040 may maintain the bending form due to the inside surface of the housing.

According to various embodiments of the disclosure, the first panel 2020 may be electrically connected with the PCB 2060 through the flexible conductive member 2040, and the second backplane 2031 of the second panel 2030. A control circuit 20605 mounted on the PCB 2060 (for example, the processor 120 of FIG. 1 or the processor 210 of FIG. 2) may control displaying through the display panel (for example, the backplane 2021 and the pixel layer 2022) of the first panel 2020. The control circuit 20605 mounted on the PCB 2060 may detect a touch input or a hovering input by using the conductive pattern 2023 of the first panel 2020.

The electronic device 2000 may include, for example, at least one electronic component 2045 mounted on the flexible conductive member 2040. According to an embodiment of the disclosure, the flexible conductive member 2040 may be formed in a film shape and may include both side surfaces 20401, 20402. The at least one electronic component 2045 may be mounted on one surface 20401 of the flexible conductive member 2040 so as to be disposed inside the space formed in a bending form.

According to an embodiment of the disclosure, the at least one electronic component 2045 may include a display driving driver (for example, a display driver IC (DDI)). The DDI may be a component in the form of a chip which is used to drive a plurality of pixels included in the first panel 2020. For example, the DDI may control a switch (for example, a transistor) connected to the pixels under control of the control circuit 20605 (for example, the processor 120 of FIG. 1 or the processor 210 of FIG. 2) mounted on the PCB 2060. According to an embodiment of the disclosure, the DDI may include a gate integrated circuit (IC) or a source IC (not shown). The gate IC may have a function of turning on or off the pixels. The source IC may have a function of making a difference of color by adjusting a size of an image signal of a pixel.

According to an embodiment of the disclosure, a structure for connecting the at least one electronic component 2045 (for example, the DDI) to the first panel 2020 may be a chip-on-film (COF) structure for connecting the flexible conductive member (for example, the FPCB) where the at least one electronic component 2045 is mounted to the first backplane 2021 of the first panel 2020, as shown in FIG. 20.

According to an embodiment of the disclosure, the structure for connecting the at least one electronic component 2045 (for example, the DDI) to the first panel 2020 may be a chip-on-panel (COP) structure for directly mounting the at least one component 2045 on the extension portion 2121d-1 of the first backplane 2121d of FIG. 21D although it is not illustrated.

Referring to FIG. 20, according to various embodiments of the disclosure, the at least one electronic component 2045 may be disposed on a portion of the flexible conductive member 2040 except for the bending portion 2043. According to an embodiment of the disclosure, the at least one electronic component 2045 may be disposed between the first backplane 2021 and the mid-plate 2070. According to an embodiment of the disclosure, the second panel 2030 may include a space 2034 for accommodating the at least one electronic component 2045 to have the flexible conductive member 2040 installed in the bending form and to have the at least one electronic component 2045 disposed between the first backplane 2021 and the mid-plate 2070. For example, the space 2034 may be a recess that is dented in the first direction 200011 or the fourth direction 200041.

According to an embodiment of the disclosure, the electronic device 2000 may include the mid-plate 2070 disposed between the second panel 2030 and the PCB 2060. The mid-plate 2070 may include a first installation surface 20701 facing toward the first direction 200011, and a second installation surface 20702 facing toward the second direction 200021. A space in which components, such as the first panel 2020, the second panel 2030, the light sensor 2090, and the flexible conductive member 2040 are coupled to one another may be formed between the first installation surface 20701 and the light transmission substrate 2010. The PCB 2060 may be coupled to the second installation surface 20702.

According to various embodiments of the disclosure, the electronic device 2000 may include one or more light sources (or light emitting units) disposed on a region avoiding overlapping the display (for example, the first panel 2020). According to various embodiments of the disclosure, one or more light emitting units may be included in the light sensor 2090 (for example, a proximity sensor), or may be included in other light sensor (for example, a biometric sensor) (for example, an iris recognition sensor) than the light sensor 2090.

Figure 22:
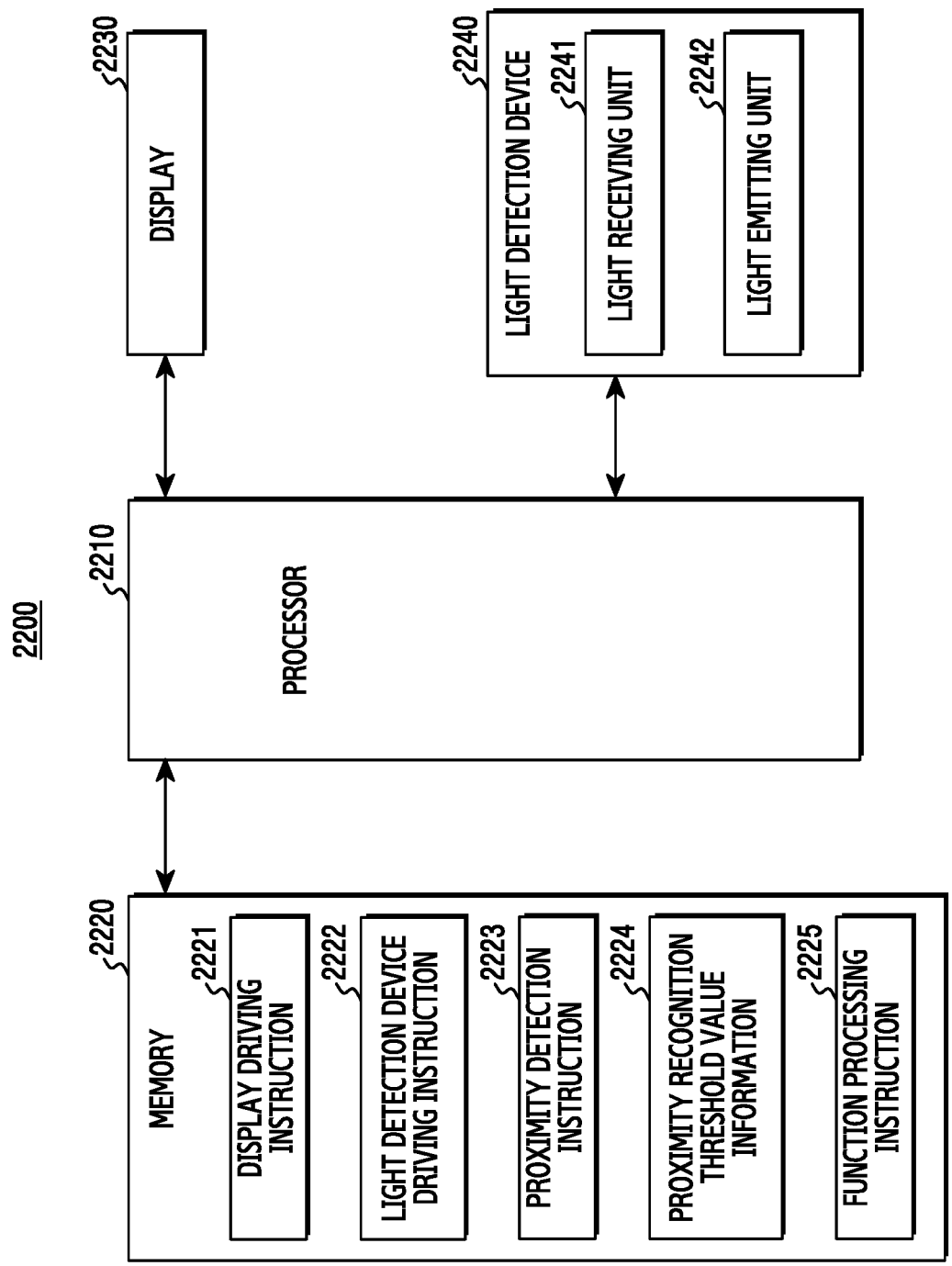
FIG. 22 is a block diagram illustrating an electronic device including a light emitting unit and a light receiving unit of at least one light sensor disposed adjacent to a display according to an embodiment of the disclosure.

FIG. 22 is a block diagram illustrating an electronic device including a light emitting unit and a light receiving unit of at least one light sensor disposed adjacent to a display according to an embodiment of the disclosure.

Referring to FIG. 12, according to various embodiments of the disclosure, an electronic device 2200 may include one of the electronic device 101 of FIG. 1, the electronic device 201 of FIG. 2, the electronic device 400 of FIG. 4A, the electronic device 500 of FIG. 5, the electronic device 700 of FIG. 7, the electronic device 800 of FIG. 8, the electronic device 900 of FIG. 9, the electronic device 1000 of FIG. 10, the electronic device 1400 of FIG. 14, the electronic device 1500 of FIG. 15, the electronic device 1600 of FIG. 16, the electronic device 1700 of FIG. 17A or 17B, the electronic device 1800 of FIG. 18A or 18B, or the electronic device 1900 of FIG. 19A or 19B.

According to an embodiment of the disclosure, the electronic device 2200 may include a light detection device 2240, a display 2230, and a processor 2210. The light detection device 2240 (or light sensor module) may include at least one light receiving unit (or light receiving module) 2241, and at least one light emitting unit (or light emitting module) 2242. According to various embodiments of the disclosure, the light detection device 2240 may be installed as a mutual structure with the display 2230 as shown in FIG. 4A, 4B, 5, 7, 8, 9, 10, 14, 15, 16, 17A, 17B, 18A, 18B, 19A or 19B. According to an embodiment of the disclosure, the at least one light receiving unit 2241 may be disposed on at least a portion of a rear surface of the display 2230, and the at least one light emitting unit 2242 may be disposed in a side space of the display 2230 or under or below the side space.

According to an embodiment of the disclosure, the display 2230 may include a light transmission material, and external light may pass through the display 2230 and enter the light receiving unit 2241. The light receiving unit 2241 may receive light (or a light signal) scattered or reflected from an object, and may generate an electric signal (or a digital value) based on the received light.

According to an embodiment of the disclosure, light outputted from the light emitting unit 2242 may pass through a portion vertically aligned with the light emitting unit 2242 (for example, a light transmission substrate (for example, the first cover 510-1 of FIG. 1) having a higher light transmission ratio than that of the display 2230), and may be discharged to the outside.

According to an embodiment of the disclosure, the light receiving unit 2241 may include one or more light detectors (or sensors) (for example, photo diodes) (not shown) to detect light of one or more wavelength bands. According to various embodiment of the disclosure, the light receiving unit 2241 may further include the first cover 1555 of FIG. 15.

According to various embodiments of the disclosure, the light receiving unit 2241 may include a plurality of light detectors, and the plurality of light detectors may detect light of at least one different wavelength band. For example, one light detector may detect light of a first wavelength band, and another light detector may detect light of a second wavelength band which is different from the first wavelength band.

According to various embodiments of the disclosure, the light receiving unit 2241 may include a plurality of light detectors, and the plurality of light detectors may detect light of similar or same at least one wavelength band. For example, one light detector may detect light of a first wavelength band. Another light detector may detect not only light of a second wavelength band different form the first wavelength band, but also the light of the first wavelength band. Still another light detector may detect not only light of a third wavelength band different from the first and second wavelength bands, but also the light of the first wavelength band. Yet another light detector may detect not only light of a fourth wavelength band different from the first, second, and third wavelength bands, but also the light of the first wavelength band.

According to an embodiment of the disclosure, the light receiving unit 2241 may detect light of a proximity detection wavelength band (for example, a maximum sensitivity wavelength of about 940 nm or about 950 nm). For example, in a proximity detection mode, when an object (for example, a user face) moves close to (for example, about 10 cm or less) the light detection device 2240 toward the first surface (for example, the first surface 5001 of FIG. 5) of the electronic device 2200, light of a proximity detection wavelength band outputted from the light emitting unit 2242 may be scattered or reflected by the object. The scattered or reflected light of the proximity detection wavelength band may enter the light receiving unit 2241, and the light receiving unit 2241 may generate an electric signal related to proximity of the object or a proximity distance of the object based on the entering scattered or reflected light. For example, as a distance between the light detection device 2240 and the object decreases, an amount of light scattered or reflected from the object and entering the light receiving unit 2241 may increase and an ADC value may increase. As the distance between the light detection device 2240 and the object increases, the amount of light entering the light receiving unit 2241 may be reduced and the ADC value may be reduced.

According to an embodiment of the disclosure, the light receiving unit 2241 may detect light of a gesture detection wavelength band (for example, a maximum sensitivity wavelength of about 940 nm). For example, in a gesture detection mode, when a user's hand moves close to (for example, within about 10 cm) the first surface (for example, the first surface 5001 of FIG. 5) of the electronic device 2200, light of a gesture detection wavelength band outputted from the light emitting unit 2242 may be scattered or reflected by the user's hand. The scattered or reflected light of the gesture detection wavelength band may enter the light receiving unit 2241, and the light receiving unit 2241 may generate an electric signal related to a gesture of the user's hand based on the entering scattered or reflected light.

According to various embodiments of the disclosure, the light receiving unit 2241 may detect light of an object analysis wavelength band. For example, in a biometric detection mode, when a user body moves close to the light detection device 2240 (for example, about 10 cm or less) toward the first surface (for example, the first surface 5001 of FIG. 5) of the electronic device 2200, light of a biometric detection wavelength band outputted from the light emitting unit 2242 may be reflected by the user body. The scattered or reflected light of the biometric detection wavelength band may enter the light receiving unit 2241, and the light receiving unit 2241 may generate an electric signal related to biometric information (for example, skin moisture, skin melanin, skin temperature, a heart rate, a blood flow rate, an iris, or the like) of the user body, based on the entering scattered or reflected light. For example, in a skin moisture detection mode, the light receiving unit 2241 may be designed to detect light in a wavelength band including a maximum sensitivity wavelength of about 880 nm, and/or a wavelength band including a maximum sensitivity wavelength of about 970 nm. For example, in a skin melanin detection mode, the light receiving unit 2241 may be designed to detect light in a wavelength band including a maximum sensitivity wavelength of about 660 nm, and/or a maximum sensitivity wavelength of about 880 nm. For example, in an erythema detection mode, the light receiving unit 2241 may be designed to detect light in a wavelength band including a maximum sensitivity wavelength of about 568 nm, and/or in a wavelength band including a maximum sensitivity wavelength of about 880 nm. According to various embodiments of the disclosure, in an iris recognition mode, the light receiving unit 2241 may be designed to detect light in a corresponding wavelength band. According to various embodiments of the disclosure, in a fingerprint recognition mode, the light receiving unit 2241 may be designed to detect light in a corresponding wavelength band.

According to various embodiments of the disclosure, the light receiving unit 2241 may detect light of an external environment measurement wavelength band. For example, in an illuminance detection mode, the light receiving unit 2241 may receive external light, and may generate an electric signal related to illuminance based on the received external light.

According to various embodiments of the disclosure, the electronic device 2200 may provide various detection modes. For example, the detection modes may include various detection modes, such as a proximity detection mode, a gesture detection mode, a biometric detection mode, an illuminance detection mode, or the like. The detection modes may include various subordinate detection modes. For example, the biometric detection mode may include a skin moisture detection mode, a skin melanin detection mode, a skin temperature detection mode, or the like.

According to various embodiments of the disclosure, the electronic device 2200 may provide various multi-detection modes. The multi-detection mode may be defined by selecting a plurality of detection modes. For example, the multi-detection mode may include selection of the proximity detection mode and the biometric detection mode. The multi-detection mode may include selection of the illuminance detection mode and the biometric detection mode. The multi-detection mode may include selection of a plurality of subordinate detection modes in a detection mode.

According to an embodiment of the disclosure, the electronic device 2200 may selectively activate at least a portion of the light receiving unit 2241 according to a selected detection mode. For example, in the proximity detection mode, the processor 2210 (for example, the processor 120 of FIG. 1 or the processor 210 of FIG. 2) may select and activate at least one light detector for detecting proximity from among the plurality of light detectors. For example, in the biometric detection mode, a control circuit may select and activate at least one light detector for detecting biometric information from among the plurality of light detectors of the light receiving unit 2241.

According to an embodiment of the disclosure, the light emitting unit 2242 may include at least one light emitter (or light source) capable of generating light of one or more wavelength bands. According to various embodiments of the disclosure, the light emitting unit 2242 may further include the second cover 1556 of FIG. 15.

According to an embodiment of the disclosure, the light emitting unit 2242 may include a light emitter capable of generating light of all wavelength bands which can be detected by the light receiving unit 2241. For example, the light emitting unit 2242 may be designed with a single light emitter. The single light emitter may be a light emitting element which can generate light of a broad wavelength band.

According to various embodiments of the disclosure, the light emitting unit 2242 may be designed to selectively generate light of a corresponding wavelength band under control of the processor 2210. For example, in the proximity detection mode, the processor 2210 may control the light emitting unit 2242 to generate light of a proximity detection wavelength band. For example, in the biometric detection mode, the control circuit may control the light emitting unit 2242 to generate light of a biometric detection wavelength band.

According to an embodiment of the disclosure, the light emitting unit 2242 may include a plurality of light emitters, and the plurality of light emitters may generate light of at least one different wavelength band. For example, one light emitter may generate light of a first wavelength band, and another emitter may generate light of a second wavelength band different from the first wavelength band. For example, in the proximity detection mode, the processor 2210 may select and activate at least one light emitter that generates light of a proximity detection wavelength band from among the plurality of light emitters of the light emitting unit 2242. For example, in the biometric detection mode, the processor 2210 may select and activate at least one light emitter that generates light of a biometric detection wavelength band from among the plurality of light emitters of the light emitting unit 2242.

According to various embodiments of the disclosure, the light emitting unit 2242 may include various types of light emitting elements. For example, the light emitting unit 2242 may include a LED.

According to various embodiments of the disclosure, the light detection device 2240 may be provided as a single module in the form of a package (for example, the light sensor 600 of FIG. 6A, the light sensor 750 of FIG. 7, the light sensor 850 of FIG. 8, the light sensor 990 of FIG. 9, the light sensor 1050 of FIG. 10, the light sensor 1300 of FIG. 13, the light sensor 1450 of FIG. 14, the light sensor 1550 of FIG. 15, the light sensor 1650 of FIG. 16, the light sensor 1750 of FIG. 17B, the light sensor 1850 of FIG. 18B, or the light sensor 1950 of FIG. 19B).

According to various embodiments of the disclosure, the light receiving unit 2241 and/or light emitting unit 2242 may be mounted on a PCB (for example, 2060 of FIG. 20) of the electronic device 2200. One end of the light receiving unit 2241 may be electrically connected to a ground member (for example, a ground of the PCB) of the electronic device 2200, and the other end of the light receiving unit 2241 may be electrically connected to the processor 2210. The light receiving unit 2241 may detect light, may generate (or convert) an electric signal based on the detected light, and may transmit the generated electric signal to the control circuit.

According to various embodiments of the disclosure, the electronic device 2200 may include a memory 2220. The memory 2220 (for example, the memory 130 of FIG. 1 or the memory 230 of FIG. 2) may store various basic OSs necessary for operating the electronic device 2200, and data or application programs, and algorithms corresponding to various user functions. According to an embodiment of the disclosure, the processor 2210 may be electrically connected to the memory 2220, and may perform various operations of the electronic device 2200 by using instructions, information, or the like, included in the memory 2220.

According to an embodiment of the disclosure, the memory 2220 may store a display driving instruction 2221. The display driving instruction 2221 may include instructions that cause the processor 2210 to control the display 2230 when displaying a screen.

According to various embodiments of the disclosure, the display driving instruction 2221 may include an activation routine for selectively activating at least one of the plurality of pixels of the display 2230. For example, the display 2230 may be an AMOLED display having one switch (for example, a transistor) installed for each pixel. According to the display driving instruction 2221, the processor 2210 may control the switch (for example, TFT) to adjust whether to activate a pixel. When the switch is in an on-state, the pixel may emit light. This may be defined as "pixel on." When the switch is in an off-state, the pixel does not emit light. This may be defined as "pixel off."

According to various embodiments of the disclosure, the display driving instruction 2221 may include a pixel activation/inactivation routine that causes the pixel to be turned off (or inactivated) for a portion of time of a frame (or an image frame). For example, the display driving instruction 2221 may include a pixel driving routine that causes the pixel to be turned off at a defined time ratio within the frame. According to an embodiment of the disclosure, the display 2230 may be an AMOLED display having one switch installed for each pixel. The display driving instruction 2221 may include a pixel driving routine that turns on (activates) the pixel only for a predetermined time within the frame, and turns off (inactivates) the pixel for the other time. For example, when the pixels included in the display 2230 are turned off for a portion of the time within the frame, an image may be displayed in black as if a black image is inserted into the frame. According to various embodiments of the disclosure, although the light emitting unit 2242 is disposed in the side space of the display 2230 or under or below the side space and at least one light blocking element (for example, the light blocking material 881 or 882 of FIG. 8) is provided, light outputted from the light emitting unit 2242 may be guided by a material in the display 2230 and may flow into a semiconductor layer of at least one pixel, and as a result, malfunction (for example, spot) that at least one pixel emits light may be caused. Even if at least one pixel included in the display 2230 emits light due to the light outputted from the light emitting unit 2242, visibility of this pixel may be reduced. According to various embodiments of the disclosure, the pixel driving routine may be an AMOLED impulsive drive (AID). A ratio of turning on the pixels within the frame may be defined as an "AID ratio." For example, as the AID ratio increases, brightness of the screen may increase. According to various embodiments of the disclosure, the display driving instruction 2221 may further include a pixel output adjustment routine for adjusting an intensity of emitted light of the pixel to maintain brightness of the screen when the AID ratio is changed.

According to various embodiments of the disclosure, the display driving instruction 2221 may include a frame per second (FPS) setting routine for setting a speed (for example, FPS) for displaying data of one screen. For example, the display driving instruction 2221 may include an FPS setting routine that adjusts the FPS according to various elements, such as hardware performance, complexity of displayed graphics, user environment setting (for example, a reaction time felt by a user), or the like.

According to an embodiment of the disclosure, the memory 2220 may store a light detection device driving instruction 2222. The light detection device driving instruction 2222 may include instructions that cause the processor 2210 to adjust at least one element of the light detection device 2240.

According to an embodiment of the disclosure, the light detection device driving instruction 2222 may include an activation routine that selects and activates at least a portion of the light receiving unit 2241 of the light detection device 2240. For example, the light detection device driving instruction 2222 may include an activation routine that selects and activates at least a portion of the light receiving unit 2241 of the light detection device 2240, based on a selected (or executed) detection mode. According to an embodiment of the disclosure, the light receiving unit 2241 may include a plurality of light detectors for detecting light of one or more wavelength bands. According to the light detection device driving instruction 2222, the processor 2210 may select and activate at least one light detector corresponding to a detection mode from among the plurality of light detectors. According to various embodiments of the disclosure, the processor 2210 may select at least one of the plurality of detection modes based at least in part on execution of an application and/or a user input.

According to an embodiment of the disclosure, the light detection device driving instruction 2222 may include an activation routine that selects and activates at least a portion of the light emitting unit 2242 of the light detection device 2240. For example, the light detection device driving instruction 2222 may include an activation routine that selects and activates at least a portion of the light emitting unit 2242 of the light detection device 2240, based on a selected (or executed) detection mode. According to an embodiment of the disclosure, the light emitting unit 2242 may include a plurality of light emitters to output light of one or more wavelength bands. According to the light detection device driving instruction 2222, the processor 2210 may select and activate at least one light emitter corresponding to a detection mode from among the plurality of light emitters.

According to the display driving instruction 2221, the processor 2210 may set a section outputting light through the pixels and a section not outputting light through the pixels in the frame. According to an embodiment of the disclosure, the light detection device driving instruction 2222 may include an activation routine that adjusts to activate the light emitting unit 2242 of the light detection device 2240 in a pixel off section in the frame. For example, when the pixels included in the display 2230 are tuned off for a portion of the time within the frame, an image may be displayed substantially in black color as if a black image is inserted into the frame. Since an emitted light penetration region is displayed in black color due to the pixels tuned off for a portion of the time within the frame, visibility of the pixels may be reduced even when the pixels emit light due to the light outputted from the light emitting unit 2242.

According to various embodiments of the disclosure, the memory 2220 may store instructions related to various detection modes using the light detection device 2240. For example, the memory 2220 may include an instruction that causes the processor 2210 to select a detection mode based on execution of an application and/or a user input. The memory 2220 may include an instruction that causes the processor 2210 to determine an output wavelength band of the light emitting unit 2242 based on the selected detection mode. The memory 2220 may store an instruction that causes the processor 2210 to output the determined light of the output wavelength band through the light emitting unit 2242. The memory 2220 may store instructions that cause the processor 2210 to perform a series of operations of detecting at least a portion of light scattered or reflected from an object through the light receiving unit 2241, and of obtaining information related to the detection mode based on a detection value.

For example, the electronic device 2200 may display a plurality of icons through the display 2230. The plurality of icons may represent applications stored in the electronic device 2200. When it is detected that an icon representing an object analysis application is selected from the plurality of icons by a user input (for example, a touch input), the processor 2210 may execute the object analysis application. According to the executed object analysis application, the processor 2210 may display a screen providing a list (hereinafter, a "detection function list") related to various detection functions (detection applications or detection application programs). The detection function list may be displayed with various types of GUI elements. When it is detected that at least one list entry is selected from the detection function list by a user input, the processor 2210 may execute a detection function (or a detection mode) corresponding to the selected at least one list entry.

For example, while an application is being executed, the processor 2210 may select at least one detection mode corresponding to the executed application. According to an embodiment of the disclosure, the processor 2210 may select a proximity detection mode, or the like, while a call application is being executed. For example, while the call application is being executed, the electronic device 2200 may be used in the proximity of a user's head for a call. When a call for a phone number of an external electronic device (for example, 102 or 104 of FIG. 1) is requested by a user input, the processor 2210 may execute an application related to a sent call (hereinafter, a sent call application). The electronic device 2200 may receive a call from an external electronic device (for example, 102 or 104 of FIG. 1), and the processor 2210 may execute an application related to a received call (hereinafter, a received call application).

For example, the processor 2210 may determine an output wavelength band of the light emitting unit (or light source) 2242 based on the selected detection mode. According to an embodiment of the disclosure, when the proximity detection mode is selected, the processor 2210 may determine a wavelength band including a maximum sensitivity wavelength of about 950 nm as the output wavelength band of the light emitting unit 2242 according to the proximity detection mode.

For example, the processor 2210 may control the light emitting unit 2242 to output light of the determined output wavelength band. The light emitting unit 2242 may be designed to selectively generate light of a corresponding wavelength band under control of the processor 2210.

For example, the processor 2210 may detect at least a portion of light scattered or reflected from an object through the light receiving unit 2241. According to an embodiment of the disclosure, in the object analysis mode (for example, an iris recognition mode or a fingerprint recognition mode, or the like), light of a corresponding wavelength band emitted from the light emitting unit 2242 may be transmitted to a user body existing in the proximity of the electronic device 2200 (for example, within about 10 cm), and light may be absorbed into, scattered or reflected by the user body. Light (or light energy or light signal) scattered or reflected from the user body may enter the light receiving unit 2241, and the light receiving unit 2241 may generate an electric signal (or a detection value) related to biometric information (for example, skin moisture, skin melanin, or skin erythema) based on the entering scattered or reflected light, and may transmit the electric signal to the processor 2210.

For example, the processor 2210 may obtain information related to the detection mode based on the value detected through the light receiving unit 2241. According to an embodiment of the disclosure, in the proximity detection mode, the processor 2210 may receive an electric signal (or detection value) from the light receiving unit 2241, and may analyze the electric signal by using various programs and may obtain information regarding the proximity of the object. According to an embodiment of the disclosure, in the object analysis mode, the processor 2210 may receive a detection value from the light receiving unit 2210, and may analyze the detection value by using various programs and may obtain information regarding an object.

For example, the processor 2210 may obtain information related to the detection mode, and may output the information through the display 2230. For example, the processor 2230 may obtain information related to the detection mode and may transmit the information to another electronic device (for example, the external electronic device 102 or 104, or the server 106 of FIG. 1).

According to an embodiment of the disclosure, the memory 2220 may store a proximity detection instruction 2223 and proximity recognition threshold value information 2224.

According to an embodiment of the disclosure, the proximity detection instruction 2223 may include instructions that cause the processor 2210 to determine the proximity of an object by using and adjusting at least a portion of the light detection device 2240. According to various embodiments of the disclosure, the proximity detection instruction 2223 may include an activation routine that selects and activates at least a portion of the light detection device used to obtain a value related to the proximity of the object.

According to an embodiment of the disclosure, the proximity detection instruction 2223 may include an obtaining routine that obtains a detection value generated from the light detection device 2240 activated according to the light detection device driving instruction 2222. For example, the processor 2210 may detect at least a portion of light scattered or reflected from an object through the light receiving unit 2241.

According to an embodiment of the disclosure, the proximity detection instruction 2223 may include a proximity determination routine that compares a detection value detected by the light receiving unit 2241 and a selected proximity recognition threshold value, and determines whether the object is within a proximity recognition distance or out of the proximity recognition distance from the electronic device 2200 according to a result of comparing.

For example, the light emitting unit 2242 may include a first light emitting unit to output light of a first intensity, and a second light emitting unit to output light of a second intensity greater than the first intensity. According to an embodiment of the disclosure, when the proximity detection mode starts, the processor 2210 may select the first light emitting unit, first, and may activate the first light emitting unit. The processor 2210 may select a first proximity recognition threshold value corresponding to the selected first light emitting unit from the proximity recognition threshold value information 2224. When the first light emitting unit is activated, the processor 2210 may compare a detection value detected by the light receiving unit 2241 and the first proximity recognition threshold value. When the detection value detected by the light receiving unit 2241 is greater than or equal to the first proximity recognition threshold value, the processor 2210 may determine that the object is within the proximity recognition distance (for example, about 10 cm) from the electronic device 2200. When the detection value detected by the light receiving unit 2241 is smaller than the first proximity recognition threshold value, the processor 2210 may cancel the selection of the first light emitting unit, may select the second light emitting unit, and may activate the second light emitting unit. The processor 2210 may select a second proximity recognition threshold value corresponding to the selected second light emitting unit from the proximity recognition threshold value information 2224. When the second light emitting unit is activated, the processor 2210 may compare a detection value detected by the light receiving unit 2241 and the second proximity recognition threshold value. When the detection value detected by the light receiving unit 2241 is greater than or equal to the second proximity recognition threshold value, the processor 2210 may determine that the object is within the proximity recognition distance (for example, about 10 cm) from the electronic device 2200.

According to various embodiments of the disclosure, the memory 2220 may store a function processing instruction 2225. The function processing instruction 2225 may include a proximity recognition processing routine for processing various functions of the electronic device 2200 based on the recognized proximity of the object. For example, the function processing instruction 2225 may inactivate the display 2230 based on the recognized proximity of the object.

According to various embodiments of the disclosure, the electronic device 2200 may include an input unit although it is not illustrated. The input unit (for example, the input device 250 of FIG. 2) may be configured to generate various input signal necessary for operating the electronic device 2200. The input unit may include various input means, such as a keyboard, a keypad, a key button, a touch button, or the like, according to whether the electronic device 2200 is compatible. According to an embodiment of the disclosure, the input unit may cause various types of user inputs for executing the instructions of the memory 2220.

According to various embodiments of the disclosure, the electronic device 2200 may include a communication unit (for example, the communication module 220 of FIG. 2) although it is not illustrated. The communication unit may be configured to support a communication function of the electronic device 2200. The communication unit may be provided in the form of a mobile communication module to support the communication function (for example, a mobile communication function) of the electronic device 2200. The communication unit may establish a communication channel with a mobile communication system, and may support signal exchange for performing the mobile communication function of the electronic device 2200. For example, the communication unit may establish at least one of a voice service channel, an image service channel, or a data service channel with the mobile communication system, and may support exchange of a specific signal according to a corresponding service channel. According to an embodiment of the disclosure, the communication unit may operate in relation to a detection function under control of the processor 2210 based on the function processing instruction 2225. For example, information obtained through the light detection device 2240 may be designed to be transmitted to an external device (for example, the server 106 of FIG. 1) through the communication unit.

According to various embodiments of the disclosure, the electronic device 2200 may further include various elements (or modules) according to a providing form thereof. Such elements may have their forms changed in various ways according to the trend toward convergence of digital devices, and the device may further include elements (for example, various elements of FIG. 2) having equal levels to those of the above-mentioned elements although all of them are not listed herein. According to various embodiments of the disclosure, the electronic device 2200 may omit specific elements of the above-described elements or substitute them with other elements according to a providing form thereof. This could be easily understood by those skilled in the art.

Figure 23:
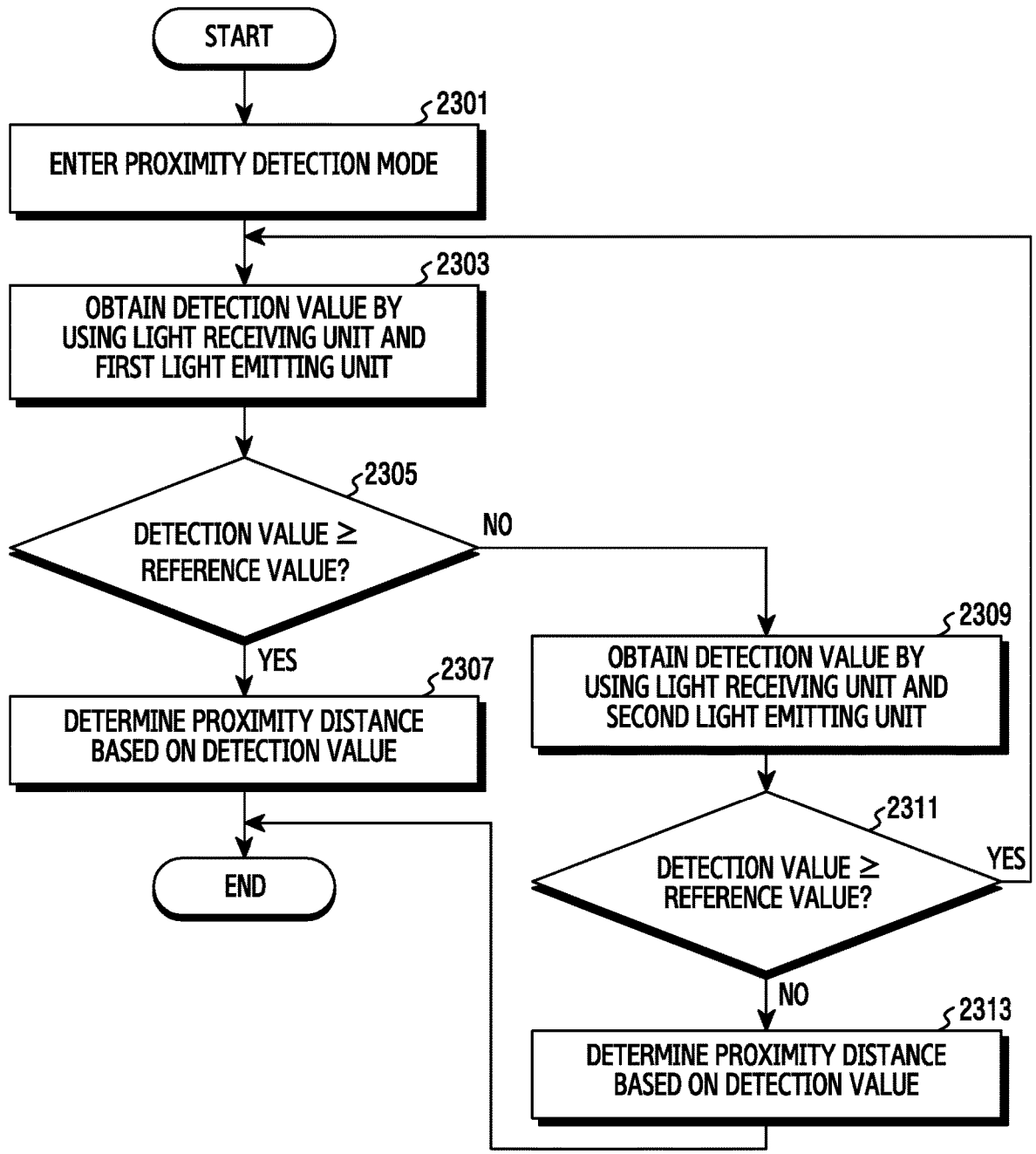
FIG. 23 is a view illustrating an operation flow of an electronic device including a display providing a proximity recognition function according to an embodiment of the disclosure.

FIG. 23 is a view illustrating an operation flow of an electronic device including a display providing a proximity recognition function according to an embodiment of the disclosure.

Figure 24:
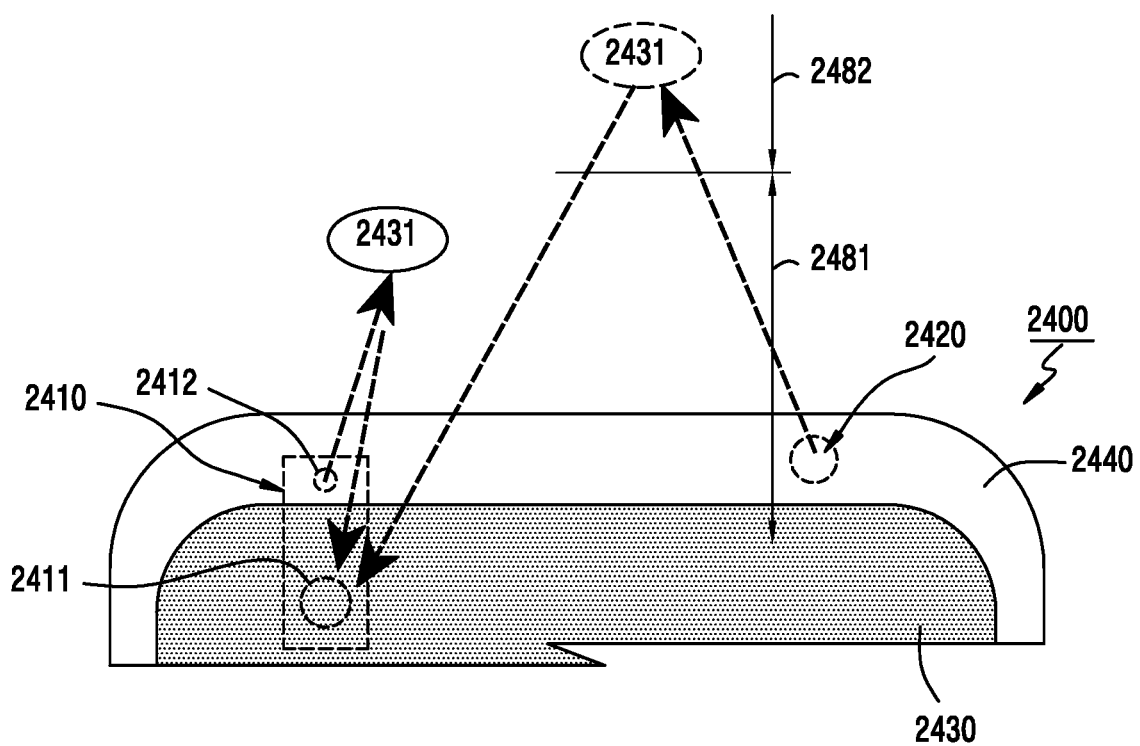
FIGS. 24 and 25 are views to illustrate an operation flow of FIG. 23 according to various embodiments of the disclosure.
Figure 25:
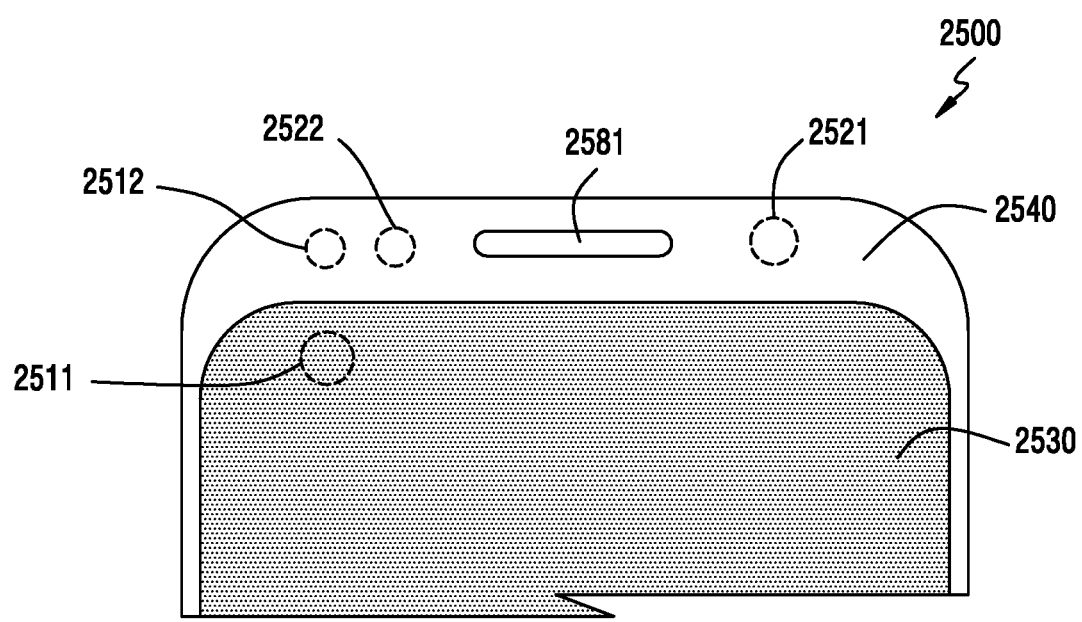

FIGS. 24 and 25 are views to illustrate an operation flow of FIG. 13 according to various embodiments of the disclosure.

According to various embodiments of the disclosure, the electronic device may include the electronic device 101 of FIG. 1, the electronic device 201 of FIG. 2, the electronic device 400 of FIG. 4A, the electronic device 500 of FIG. 5, the electronic device 700 of FIG. 7, the electronic device 800 of FIG. 8, the electronic device 900 of FIG. 9, the electronic device 1000 of FIG. 10, the electronic device 1300 of FIG. 13, the electronic device 1400 of FIG. 14, the electronic device 1500 of FIG. 15, the electronic device 1700 of FIG. 17A or 17B, the electronic device 1800 of FIG. 18A or 18B, or the electronic device 1900 of FIG. 19A or 19B.

Referring to FIG. 23, in operation 2301, the processor (for example, 2210 of FIG. 22) may enter a mode (hereinafter, a proximity detection mode) for detecting proximity of an external object. According to an embodiment of the disclosure, the processor 2210 may perform the proximity detection mode based at least in part on execution of an application or a user input. For example, when a call application is executed, the processor 2210 may perform the proximity detection mode.

In operation 2303, the processor 2210 may obtain a detection value by using the light receiving unit and the first light emitting unit. In an embodiment of the disclosure, referring to FIG. 24, an electronic device 2400 may include a display region 2430 and a bezel region 2440. The display region 2430 (or an active region) may include a display (for example, 260 of FIG. 2) and a region covering the display (hereinafter, a first region) (for example, the first region 510-11 of FIG. 5). The bezel region (or non-active region) 2440 may not cover the display and may include a region (hereinafter, a second region) (for example, the second region 510-12 of FIG. 5) surrounding the first region. According to an embodiment of the disclosure, the first region and the second region may be regions which are distinguished from each other by a cover (for example, the first cover 510-1 of FIG. 5) disposed over the display. In an embodiment of the disclosure, the light receiving unit and the first light emitting unit may be elements which are included in a proximity sensor (2410 of FIG. 24). For example, the proximity sensor 2410 may include a light receiving unit 2411 disposed below or beneath the display region 2430 or inside the display region 2430 or on a layer forming the display region 2430. According to an embodiment of the disclosure, the proximity sensor 2410 may include a light emitting unit (or the first light emitting unit) 2412 disposed below or beneath the bezel region 2440 or in a side space (for example, 5009 of FIG. 5) of the display region 2430. According to various embodiments of the disclosure, the proximity sensor 2410 may be the light sensor 600 of FIGS. 6A and 6B, the light sensor 750 of FIG. 7, the light sensor 850 of FIG. 8, the light sensor 950 of FIG. 9, the light sensor 1050 of FIG. 10, the light sensor 1300 of FIG. 13, the light sensor 1450 of FIG. 14, the light sensor 1550 of FIG. 15, the light sensor 1650 of FIG. 16, the light sensor 1750 of FIG. 17B, the light sensor 1850 of FIG. 18B, or the light sensor 1950 of FIG. 19B. At least a portion of the light outputted from the first light emitting unit 2412 of the proximity sensor 2410 may collide with an external object (thing) and may be reflected therefrom At least a portion of the reflected light may pass through the display region 2430, and may enter the light receiving unit 2411 of the proximity sensor 2410. The light receiving unit 2411 of the proximity sensor 2410 may provide an electric signal (for example, a detection value) regarding the entering light to the processor 2210. The detection value may be in proportion to the amount of light entering the light receiving unit 2411 of the proximity sensor 2410.

In operation 2305, the processor 2210 may compare the detection value obtained through the light receiving unit (for example, the light receiving unit 2411 of the proximity sensor 2410 of FIG. 24), and a reference value. In an embodiment of the disclosure, referring to FIG. 24, the reference value may be a criterion for determining, by using the light receiving unit 2411 and the first light emitting unit 2412, a state in which an external object 2431 moves from a space 2481 (hereinafter, a close space) close to the electronic device 2400 or the light receiving unit (for example, the light receiving unit 2411 of the proximity sensor 2410) to another position (hereinafter, a first state), or a state in which the external object 2431 moves from a distant space 2482 to another position (hereinafter, a second state). When the detection value is greater than or equal to the reference value, the processor 2210 may determine that the external object 2431 is in the first state. When it is determined that the external object 2431 is in the first state, the processor 2210 may determine a proximity distance based on the detection value from the light receiving unit (for example, 2411 of FIG. 24) in operation 2307. In an embodiment of the disclosure, when the detection value from the light receiving unit (for example, 2411 of FIG. 24) is greater than or equal to a first threshold value (for example, the proximity recognition threshold value information 2224 of FIG. 12), the processor 2210 may recognize that the external object is within a distance (hereinafter, a proximity recognition distance) (for example, about 10 cm), which is a criterion for determining proximity, from the electronic device (for example, 2400 of FIG. 24) (proximity recognized).

According to various embodiments of the disclosure, the processor 2210 may perform various functions corresponding to the recognized proximity although it is not illustrated.

According to an embodiment of the disclosure, the processor 2210 may inactivate the display (for example, 2230 of FIG. 22) according to the recognized proximity. According to various embodiments of the disclosure, the processor 2210 may enter a biometric detection mode (for example, a detection mode regarding skin moisture, skin melanin, or skin erythema) according to the recognized proximity.

When the detection value obtained through the light receiving unit (for example, 2411 of FIG. 24) is smaller than the first reference value in operation 2305, the processor 2210 may determine that the external object 2431 is in the second state, and may perform operation 2309. In operation 2309, the processor 2210 may obtain a detection value by using the light receiving unit (for example, 2411 of FIG. 24) and the second light emitting unit. In an embodiment of the disclosure, referring to FIG. 24, the second light emitting unit 2420 may be disposed under or below the bezel region 2440 or in the side space (for example, 5009) of the display region 2430. According to an embodiment of the disclosure, the first light emitting unit 2412 may be positioned at a first distance from the light receiving unit 2411, and the second light emitting unit 2420 may be positioned at a second distance from the light receiving unit 2411. According to an embodiment of the disclosure, the second distance may be longer than the first distance. According to an embodiment of the disclosure, the second light emitting unit 2420 may output light of at least one same wavelength band as that of the first light emitting unit 2412. According to an embodiment of the disclosure, the second light emitting unit 2420 may have a light output intensity which is the same as or greater than that of the first light emitting unit 2412.

In various embodiments of the disclosure, referring to FIG. 25, an electronic device 2500 may include a light receiving unit 2511 of a proximity sensor (for example, 600 of FIG. 6A) disposed under or below a display region 2530 or inside the display region 2530 or on a layer forming the display region 2530. The electronic device 2500 may include a first light emitting unit 2512 (for example, a light emitting unit aligned with the penetration hole 493 of FIG. 4A) and a third light emitting unit 2522 which are disposed under or below a bezel region 2540 or in a side space (for example, 5009 of FIG. 5) of the display region 2530. According to an embodiment of the disclosure, the third light emitting unit 2522 may be a light source for recognizing an iris (for example, a light source of an iris sensor). In an embodiment of the disclosure, the electronic device 2500 may include a camera 2521 (for example, 495 of FIG. 4A) for recognizing an iris. In an embodiment of the disclosure, the light emitting units 2512, 2522 and the camera 2521 for recognizing an iris may be disposed at both sides of a receiver 2581 (for example, 481 of FIG. 4A). According to an embodiment of the disclosure, in operation 2309 of FIG. 23, the processor 2210 may use the third light emitting unit 2521 as the second light emitting unit.

In an embodiment of the disclosure, the processor 2210 may cause the first light emitting unit (for example, the light emitting unit 2412 of the proximity sensor 2410 of FIG. 24) to be in an inactive state in operation 2309.

In operation 2311, the processor 2210 may compare the detection value obtained through the light receiving unit (for example, the light receiving unit 2411 of the proximity sensor 2410 of FIG. 24) and a reference value. When the detection value is greater than or equal to the reference value, the processor 2210 may determine that the external object is in the first state. When it is determined that the external object is in the first state, the processor 2210 may resume operation 2303 to determine a proximity distance based on the detection value obtained by using the light receiving unit (for example, the light receiving unit 2411 of the proximity sensor 2410 of FIG. 24) and the first light emitting unit (for example, the light emitting unit 2412 of the proximity sensor 2410). According to various embodiments of the disclosure, the processor 2210 may cause the second light emitting unit (for example, 2420 of FIG. 24 or the third light emitting unit 2521 of FIG. 25) to be in the inactive state in operation 2303.

According to an embodiment of the disclosure, the reference value in operation 2311 may be the same as or different from the reference value in operation 2305. According to an embodiment of the disclosure, the reference value in operation 2311 may be set variously according to a light output intensity, an amount of light, or the like, of the second light emitting unit (for example, 2420 of FIG. 24 or the third light emitting unit 2522 of FIG. 25). According to an embodiment of the disclosure, when the second light emitting unit is used, and light received by the light receiving unit (for example, the light receiving unit 2411 of the proximity sensor 2410 of FIG. 24) is converted into a digital value by using an ADC, the reference value in operation 2311 may be calibrated according to intensity information of the second light emitting unit.

According to various embodiment of the disclosure, although not shown, the reference value may be stored in the memory 2220 of FIG. 22, and the processor 2210 may selectively use the reference value according to a light emitting unit to be used to determine a proximity distance.

In operation 2311, when it is determined that the detection value obtained through the first light receiving unit (for example, the light receiving unit 2411 of the proximity sensor 2410 of FIG. 24) is smaller than the reference value, the processor 2210 may determine that the external object 2431 is in the second state, and may perform operation 2313.

In operation 2313, the processor 2210 may determine a proximity distance based on the detection value obtained by using the light receiving unit (for example, the light receiving unit 2411 of the proximity sensor 2410 of FIG. 24) and the second light emitting unit (for example, 2420 of FIG. 24 or the third light emitting unit 2522 of FIG. 25). According to an embodiment of the disclosure, the processor 2210 may compare the detection value obtained in operation 2313 and a second threshold value (for example, the proximity recognition threshold value information 2224 of FIG. 22). When the detection value is greater than or equal to the second threshold value, the processor 2210 may recognize that the external object 2431 is within a proximity recognition distance from the electronic device (proximity recognized). Determining that the external object 2431 is within the proximity recognition distance in operation 2313 may mean that the external object 2431 moves from the distant space 2482 to the close space 2481 and reaches the proximity recognition distance.

According to an embodiment of the disclosure, the second threshold value may be equal to or different from the first threshold value. According to an embodiment of the disclosure, the second threshold value may be greater than the first threshold value.

According to an embodiment of the disclosure, an electronic device may include a display panel, a light emitting module disposed adjacent to the display panel, and configured to output light, and a light receiving module disposed in a portion of the display panel or below or beneath the display panel, and configured to detect light of the outputted light that is reflected by an external object.

According to an embodiment of the disclosure, the electronic device may further include a light transmission support member disposed on a rear surface of the display panel. The light receiving module may be disposed in a recess or an opening formed on a portion of the support member.

According to an embodiment of the disclosure, the light receiving module may be disposed below or beneath the display panel, and the light receiving module and the light emitting module may form at least a portion of a sensor module which is formed as a same package.

According to an embodiment of the disclosure, the electronic device may further include a light shielding member disposed between the light receiving module and the light emitting module.

According to an embodiment of the disclosure, the electronic device may further include a light shielding member disposed between the display panel and the light emitting module.

According to an embodiment of the disclosure, a lens module may be disposed above the light emitting module to change a direction of the outputted light.

According to an embodiment of the disclosure, the electronic device may further include another light emitting module disposed adjacent to the display panel. The light emitting module may be spaced apart from the light receiving module by a first distance, and the other light emitting module may be spaced apart from the light receiving module by a second distance.

According to an embodiment of the disclosure, the other light emitting module may be configured to output another light when the detected reflected light satisfies a designated condition. The light receiving module may be configured to detect another reflected light of the outputted another light that is reflected by the external object.

According to an embodiment of the disclosure, the electronic device may further include a processor. The processor may be configured to identify proximity of the external object based on at least the reflected light.

According to an embodiment of the disclosure, the electronic device may further include a processor. The processor may be configured to obtain biometric information corresponding to the external object based on at least the reflected light.

According to various embodiments of the disclosure, an electronic device may include a housing, a cover at least in part accommodated in the housing and having one surface exposed, a display panel disposed below or beneath a first region of the cover, a light emitting module disposed below or beneath a second region of the cover, and configured to output light, and a light receiving module disposed in at least a portion of the display panel or below or beneath the display panel, and configured to detect light of the outputted light that is reflected by an external object.

According to various embodiments of the disclosure, the light receiving module may be disposed below or beneath the display panel, and the light receiving module and the light emitting module may form at least a portion of a sensor module formed as a same packet.

According to various embodiments of the disclosure, the electronic device may further include a light shielding member disposed between the light receiving module and the light emitting module.

According to various embodiments of the disclosure, the electronic device may further include a light shielding member disposed between the display panel and the light emitting module.

According to various embodiments of the disclosure, a lens module may be formed above the light emitting module to change a direction of the outputted light.

According to various embodiments of the disclosure, the electronic device may further include another light emitting module disposed adjacent to the display panel. The light emitting module may be spaced apart from the light receiving module by a first distance, and the other light emitting module may be spaced apart from the light receiving module by a second distance.

According to various embodiments of the disclosure, the other light emitting module may be configured to output another light when the detected reflected light satisfies a designated condition. The light receiving module may be configured to detect another reflected light of the outputted another light that is reflected by the external object.

According to various embodiments of the disclosure, the electronic device may further include a processor. The processor may be configured to identify proximity of the external object based on at least the reflected light.

According to various embodiments of the disclosure, an electronic device may include a display panel, a light emitting module disposed adjacent to the display panel, a light receiving module disposed in a portion of the display panel or below or beneath the display panel, and a processor. The processor may be configured to output light by using the light emitting module, to detect at least a portion of light of at least a portion of the light that collides with an external object and is reflected therefrom by using the light receiving unit, and to determine a distance between the external object and the electronic device based on at least the detection.

According to various embodiments of the disclosure, the light emitting module may include a first light emitting module spaced apart from the light receiving module by a first distance, and a second light emitting module disposed adjacent to the display panel and spaced apart from the light receiving module by a second distance. As at least a portion of the operation of outputting the light, the processor may be configured to output another light by using the second light emitting module when light outputted by using the first light emitting module and reflected by the external object satisfies a designated condition. The processor may be configured to determine the proximity based on at least light of the other light that collides with the external object and is reflected therefrom.

According to an embodiment of the disclosure, the light detection device includes a light receiving unit which is disposed below or beneath a display region, or inside the display region or on a layer forming the display region, and at least one light emitting unit disposed in a space except for the display region (for example, a side space of the display region). Therefore, the size of the display can be easily extended while maintaining the size of the electronic device. According to various embodiments of the disclosure, since the light emitting unit is disposed inside the side space, an electric influence of light (or light energy) outputted from the light emitting unit on the display (or malfunction of the display) (for example, spot occurring on the display due to the light from the light emitting unit) can be enhanced. According to various embodiments of the disclosure, since the light emitting unit is disposed inside the side space, light outputted from the light emitting unit may pass through a light transmission member (for example, a light transmission substrate forming one surface of the housing) having a relatively higher light transmission ratio than that of the display, and may be discharged to the outside, and accordingly, light detection performance of the light detection device can be enhanced. According to various embodiments of the disclosure, since the light receiving unit is disposed under or below the display, a hole or a light penetration region for the light receiving unit is not required to be designed on one surface of the housing, and this may make the exterior of the electronic device look better. According to various embodiments of the disclosure, the light detection device may selectively use a light emitting unit of another light detection device disposed in the side space, and may detect light associated with a corresponding function (for example, a function of determining proximity of an object). This can enhance light detection performance.

The above-described embodiments of the disclosure may be prepared by a program which can be executed in a computer, and may be implemented in a generic digital computer which operates the program using a computer readable recording medium. In addition, the structure of the data used in the above-described embodiments of the disclosure may be recorded on a computer readable recording medium through various means. The computer readable recording medium may include a storage medium, such as a magnetic storage medium (for example, a ROM, a floppy disk, a hard disk, or the like) and an optical reading medium (for example, a CD-ROM, a DVD, or the like).

Certain aspects of the present disclosure can also be embodied as computer readable code on a non-transitory computer readable recording medium. A non-transitory computer readable recording medium is any data storage device that can store data which can be thereafter read by a computer system. Examples of the non-transitory computer readable recording medium include a Read-Only Memory (ROM), a Random-Access Memory (RAM), Compact Disc-ROMs (CD-ROMs), magnetic tapes, floppy disks, and optical data storage devices. The non-transitory computer readable recording medium can also be distributed over network coupled computer systems so that the computer readable code is stored and executed in a distributed fashion. In addition, functional programs, code, and code segments for accomplishing the present disclosure can be easily construed by programmers skilled in the art to which the present disclosure pertains.

At this point it should be noted that the various embodiments of the present disclosure as described above typically involve the processing of input data and the generation of output data to some extent. This input data processing and output data generation may be implemented in hardware or software in combination with hardware. For example, specific electronic components may be employed in a mobile device or similar or related circuitry for implementing the functions associated with the various embodiments of the present disclosure as described above. Alternatively, one or more processors operating in accordance with stored instructions may implement the functions associated with the various embodiments of the present disclosure as described above. If such is the case, it is within the scope of the present disclosure that such instructions may be stored on one or more non-transitory processor readable mediums. Examples of the processor readable mediums include a ROM, a RAM, CD-ROMs, magnetic tapes, floppy disks, and optical data storage devices. The processor readable mediums can also be distributed over network coupled computer systems so that the instructions are stored and executed in a distributed fashion. In addition, functional computer programs, instructions, and instruction segments for accomplishing the present disclosure can be easily construed by programmers skilled in the art to which the present disclosure pertains.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing including a side member;
   a processor;
   a display panel including a light blocking layer having an opening to allow light to pass through;
   a cover forming a first surface of an exterior of the electronic device, wherein the cover includes a first region covering the display panel and a second region not covering the display panel, the cover being disposed over the display panel, and wherein the second region is disposed between the first region and the side member and comprises a color region configured to block light and a transparent region configured to allow light to pass through; and
   a proximity sensor comprising a printed circuit board, a first light emitter mounted on the printed circuit board, and a light receiver mounted on the printed circuit board,
   wherein the first light emitter is disposed in a position and an orientation to output a first light in a direction of the second region not covering the display panel, and configured to output the first light through the transparent region of the second region not covering the display panel,
   wherein the light receiver is disposed below the display panel, and configured to detect a first reflected light passing through the first region covering the display panel, a face of the display panel, and the opening of the light blocking layer included in the display panel, the first reflected light comprising the first light reflected by an external object, and
   wherein the processor is configured to control the proximity sensor to identify proximity of the external object based on at least the first reflected light.

2. The electronic device of claim 1, further comprising a light transmission support member disposed on a rear surface of the display panel,
   wherein the light receiver is disposed in a recess or an opening formed on a portion of the light transmission support member.

3. The electronic device of claim 1,
   wherein the light receiver and the first light emitter form at least a portion of the proximity sensor which is formed as a same package.

4. The electronic device of claim 1, further comprising a light shielding member disposed between the light receiver and the first light emitter.

5. The electronic device of claim 1, further comprising a light shielding member disposed between the display panel and the first light emitter.

6. The electronic device of claim 1,
   wherein a lens is disposed above the first light emitter to control a direction of the first light.

7. The electronic device of claim 1, further comprising a second light emitter disposed below the second region not covering the display panel, and configured to output a second light, wherein the first light emitter is spaced apart from the light receiver by a first distance, and the second light emitter is spaced apart from the light receiver by a second distance.

8. The electronic device of claim 7,
wherein the second light emitter is further configured to output the second light when the detected first reflected light satisfies a designated condition, and
wherein the light receiver is further configured to detect a second reflected light, the second reflected light comprising the second light reflected by the external object.

9. The electronic device of claim 1, wherein the processor is further configured to obtain biometric information corresponding to the external object based on at least the first reflected light.

10. The electronic device of claim 1, wherein the first light emitter is disposed in a side space of the display panel or below the side space.

11. The electronic device of claim 1, wherein the electronic device is configured to prevent the light receiver from receiving the first light other than reflected by the external object.

12. An electronic device comprising:
a housing including a side member;
a processor;
a cover forming a first surface of an exterior of the electronic device;
a display panel disposed below a first region of the cover and including a light blocking layer having an opening to allow light to pass through, wherein the cover includes the first region covering the display panel and a second region not covering the display panel, the cover being disposed over the display panel, and wherein the second region is disposed between the first region and the side member and comprises a color region configured to block light and a transparent region configured to allow light to pass through; and
a proximity sensor comprising a printed circuit board, a first light emitter mounted on the printed circuit board, and a light receiver mounted on the printed circuit board,
wherein the first light emitter is disposed in a position and an orientation to output a first light in a direction of the second region not covering the display panel, and configured to output the first light through the transparent region of the second region not covering the display panel,
wherein the light receiver is disposed below the display panel, and configured to detect a first reflected light passing through the first region covering the display panel, a face of the display panel, and the opening of the light blocking layer included in the display panel, the first reflected light comprising the first light reflected by an external object, and
wherein the processor is configured to control the proximity sensor to identify proximity of the external object based on at least the first reflected light.

13. The electronic device of claim 12, wherein the first light emitter forms at least a portion of the proximity sensor formed as a same package.

14. The electronic device of claim 12, further comprising a light shielding member disposed between the display panel and the first light emitter.

15. The electronic device of claim 12, wherein a lens is formed above the first light emitter to control a direction of the first light.

16. The electronic device of claim 12, further comprising a second light emitter disposed below the second region not covering the display panel, and configured to output a second light,
wherein the first light emitter is spaced apart from the light receiver by a first distance, and the second light emitter is spaced apart from the light receiver by a second distance.

17. The electronic device of claim 16,
wherein the second light emitter is further configured to output the second light when the detected first reflected light satisfies a designated condition, and
wherein the light receiver is further configured to detect second reflected light, the second reflected light comprising the second light reflected by the external object.

18. An electronic device comprising:
a housing including a side member;
a display panel including a light blocking layer having an opening to allow light to pass through;
a cover forming a first surface of an exterior of the electronic device, wherein the cover includes a first region covering the display panel and a second region not covering the display panel, the cover being disposed over the display panel, and wherein the second region is disposed between the first region and the side member and comprises a color region configured to block light and a transparent region configured to allow light to pass through;
a proximity sensor comprising a printed circuit board, a first light emitter mounted on the printed circuit board, and a light receiver mounted on the printed circuit board, the first light emitter being disposed in a position and an orientation to output a first light in a direction of the second region not covering the display panel, and the light receiver being disposed below the display panel; and
a processor configured to:
output the first light through the transparent region of the second region not covering the display panel by using the first light emitter,
detect a first reflected light passing through the first region covering the display panel, a face of the display panel, and the opening of the light blocking layer included in the display panel, the first reflected light comprising the first light reflected by an external object, by using the light receiver, and
determine a distance between the external object and the electronic device based on at least the detection.

19. The electronic device of claim 18,
wherein the first light emitter is spaced apart from the light receiver by a first distance, and a second light emitter is disposed below the second region not covering the display panel and spaced apart from the light receiver by a second distance, and
wherein, as at least part of outputting the first light, the processor is further configured to:
output a second light by using the second light emitter when the first light reflected by the external object satisfies a designated condition, and
determine proximity based at least on light of the second light that is reflected by the external object.

* * * * *